US010319718B2

(12) United States Patent
Yamamoto

(10) Patent No.: US 10,319,718 B2
(45) Date of Patent: Jun. 11, 2019

(54) DISCRETE CAPACITOR AND MANUFACTURING METHOD THEREOF

(71) Applicant: ROHM CO., LTD., Kyoto (JP)

(72) Inventor: Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/784,985

(22) Filed: Oct. 16, 2017

(65) Prior Publication Data

US 2018/0040610 A1 Feb. 8, 2018

Related U.S. Application Data

(63) Continuation of application No. 15/256,826, filed on Sep. 6, 2016, now Pat. No. 9,825,029, which is a continuation of application No. 14/668,384, filed on Mar. 25, 2015, now Pat. No. 9,466,736.

(30) Foreign Application Priority Data

Mar. 28, 2014 (JP) .................................. 2014-70416
Mar. 28, 2014 (JP) .................................. 2014-70417
Mar. 28, 2014 (JP) .................................. 2014-70418
Mar. 28, 2014 (JP) .................................. 2014-70419
Nov. 5, 2014 (JP) ................................ 2014-225235

(51) Int. Cl.

*H01L 29/00* (2006.01)
*H01L 27/08* (2006.01)
*H01L 29/94* (2006.01)
*H01L 29/66* (2006.01)
*H01L 49/02* (2006.01)

(52) U.S. Cl.

CPC .......... *H01L 27/0805* (2013.01); *H01L 28/60* (2013.01); *H01L 29/66181* (2013.01); *H01L 29/94* (2013.01)

(58) Field of Classification Search

CPC .... H01L 28/40; H01L 29/66181; H01L 29/94
USPC .......................................................... 257/532
See application file for complete search history.

(56) References Cited

U.S. PATENT DOCUMENTS 6,649,958 B2 * 11/2003 Fujisawa ............ H01L 27/0805 257/296
6,677,196 B2 * 1/2004 Ishige .................. H01L 27/115 257/E21.683

(Continued)

FOREIGN PATENT DOCUMENTS

JP H5-326313 A 12/1993
JP H6-252345 A 9/1994

(Continued)

*Primary Examiner* — Theresa T Doan
(74) *Attorney, Agent, or Firm* — Rabin & Berdo, P.C.

(57) ABSTRACT

A discrete capacitor of the present invention includes a substrate having a front surface portion, an impurity diffusion layer formed on the front surface portion of the substrate, an oxide film formed on the substrate and having a first opening to selectively expose the impurity diffusion layer, a dielectric film formed on the impurity region having been exposed from the oxide film, and a first electrode opposed to the impurity diffusion layer with the dielectric film therebetween, wherein the impurity concentration on the front surface portion of the impurity diffusion layer is $5\times10^{19}$ $cm^{-3}$ or more.

23 Claims, 62 Drawing Sheets

(56) References Cited

U.S. PATENT DOCUMENTS

| | | | | |
|---|---|---|---|---|
| 6,825,092 | B2 * | 11/2004 | Zurcher | H01L 28/55 257/E21.009 |
| 9,466,736 | B2 * | 10/2016 | Yamamoto | H01L 29/94 |
| 2013/0299820 | A1 * | 11/2013 | Miyamoto | H01L 29/495 257/43 |
| 2015/0022938 | A1 | 1/2015 | Okada et al. | |

FOREIGN PATENT DOCUMENTS

| | | | |
|---|---|---|---|
| JP | H6-338589 | A | 12/1994 |
| JP | H7-273281 | A | 10/1995 |
| JP | H8-306863 | A | 11/1996 |
| JP | H11-145392 | A | 5/1999 |
| JP | 2003-158002 | A | 5/2003 |
| JP | 2004-214589 | A | 7/2004 |
| JP | 2005-260163 | A | 9/2005 |
| JP | 2009-152445 | A | 7/2009 |
| JP | 2013-168633 | A | 8/2013 |
| WO | WO 01/054199 | A1 | 7/2001 |

* cited by examiner

101

DISCRETE CAPACITOR AND MANUFACTURING METHOD THEREOF

CROSS-REFERENCE TO RELATED APPLICATIONS

This is a continuation of U.S. application Ser. No. 15/256,826, filed on Sep. 6, 2016, and allowed on Jul. 18, 2017, which is a continuation of U.S. application Ser. No. 14/668,384, filed on Mar. 25, 2015 (issued on Oct. 11, 2016 as U.S. Pat. No. 9,466,736), which claimed priority to Japanese Patent Application No. 2014-70416 filed in the Japan Patent Office on Mar. 28, 2014, Japanese Patent Application No. 2014-70417 filed in the Japan Patent Office on Mar. 28, 2014, Japanese Patent Application No. 2014-70418 filed in the Japan Patent Office on Mar. 28, 2014, Japanese Patent Application No. 2014-70419 filed in the Japan Patent Office on Mar. 28, 2014, and Japanese Patent Application No. 2014-225235 filed in the Japan Patent Office on Nov. 5, 2014. All the disclosures of these earlier applications are incorporated herein by citation.

FIELD OF THE INVENTION

The present invention relates to a discrete capacitor and a manufacturing method thereof.

BACKGROUND ART

Patent Document 1 (Japanese Patent Application Publication No. 2013-168633) discloses a chip capacitor including a substrate, an oxide-nitride-oxide (ONO) film formed on the substrate, an upper electrode opposed to the substrate with the ONO film therebetween, and a lower electrode formed spaced apart from the upper electrode on the substrate and directly connected to the substrate.

BRIEF SUMMARY OF THE INVENTION

An object of the present invention is to provide a discrete capacitor and a manufacturing method thereof capable of realizing excellent direct current (DC) bias characteristics.

DETAILED DESCRIPTION OF THE INVENTION

Figure 1:
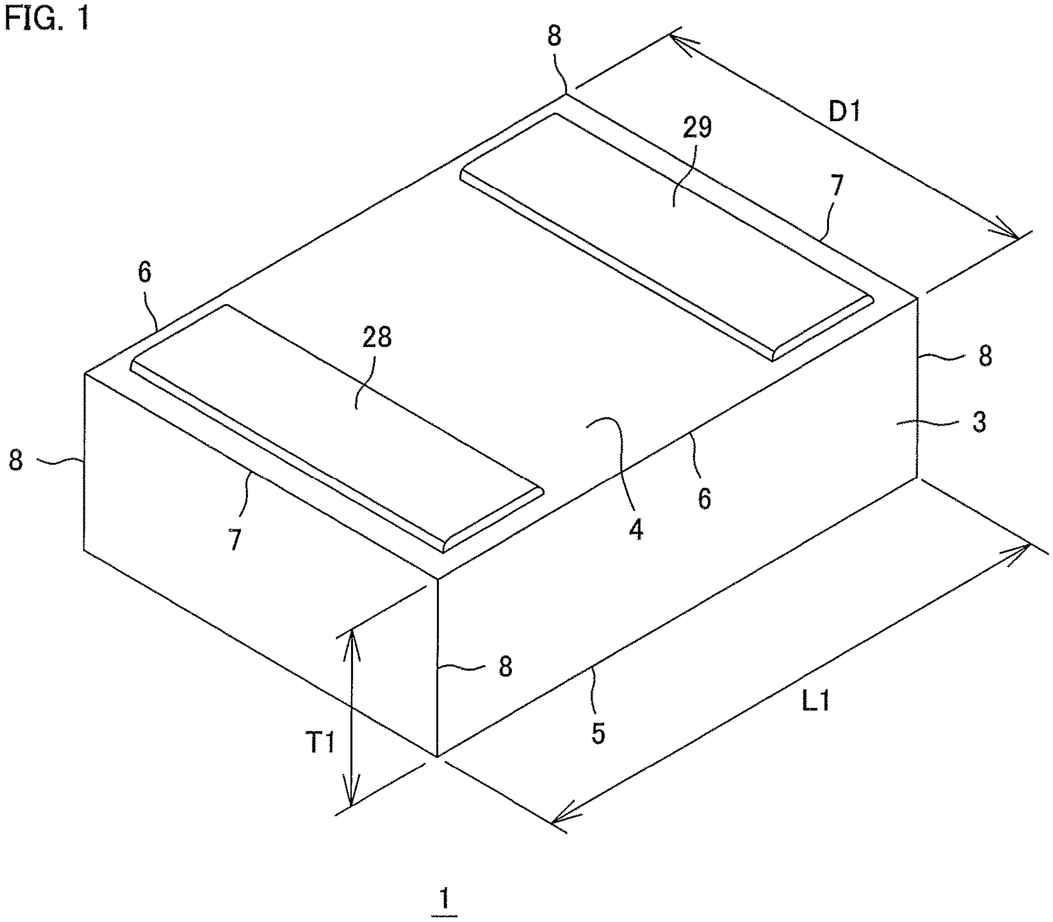
FIG. 1 is a schematic perspective view of a discrete capacitor according to the first preferred embodiment of the present invention.

A discrete capacitor according to a preferred embodiment of the present invention includes a substrate having a front surface portion, an impurity diffusion layer formed on the front surface portion of the substrate, an oxide film formed on the substrate and having a first opening to selectively expose the impurity diffusion layer, a dielectric film formed on the impurity region having been exposed from the oxide film, and a first electrode formed on the substrate and opposed to the impurity diffusion layer with the dielectric film therebetween, wherein the impurity concentration on the front surface portion of the impurity diffusion layer is not less than $5\times10^{19}$ $cm^{-3}$.

One of the electrical characteristics of the discrete capacitor is DC bias characteristics. The DC bias characteristics mean the rate of change of the capacitance value with respect to DC bias. It is preferred that the rate of change of the capacitance value with respect to DC bias is small in terms of reliability of the discrete capacitor. Therefore, the impurity concentration on the front surface portion of the impurity diffusion layer is made not less than $5\times10^{19}$ $cm^{-3}$ as in the present invention, thereby allowing the rate of change of the capacitance value with respect to DC bias to be made smaller. For example, with a preferred embodiment of the present invention, |0.1|%/V or less can be realized as the range of the absolute value of the rate of change of the capacitance value with respect to DC bias, in the DC bias range of −10V to +10V.

A discrete capacitor according to a preferred embodiment of the present invention includes a substrate having a front surface portion, an impurity diffusion layer formed on the front surface portion of the substrate, an oxide film formed on the substrate and having a first opening to selectively expose the impurity diffusion layer, a dielectric film formed on the impurity region having been exposed from the oxide film, and a first electrode formed on the substrate and opposed to the impurity diffusion layer with the dielectric film therebetween, wherein the range of the absolute value of the rate of change of the capacitance value with respect to DC bias is |0.1|%/V or less in the DC bias range of −10V to +10V.

With this configuration, a discrete capacitor capable of realizing excellent DC bias characteristics can be provided since the range of the absolute value of the rate of change of the capacitance value with respect to DC bias is |0.1|%/V or less in the DC bias range of −10V to +10V.

In the discrete capacitor, the dielectric film may be an ONO film formed by laminating in the order of a bottom oxide film, a nitride film, and a top oxide film.

In the discrete capacitor, the total thickness of the ONO film may be 390 Å to 460 Å.

In the discrete capacitor, the thickness of the bottom oxide film may be 100 Å to 130 Å, and that of the nitride film may be 100 Å to 110 Å, and that of the top oxide film may be 190 Å to 220 Å.

In the discrete capacitor, the first electrode may include a pad region formed on the first opening and connected with an external electrode.

With this configuration, a region on the first opening can be used effectively since the pad region to which the external electrode is connected is formed on the first opening.

In the discrete capacitor, the thickness of the oxide film may be 8000 Å to 12000 Å.

With this configuration, even if part of the first electrode overlaps on the oxide film and parasitic capacitance is formed between the overlapping portion and the impurity diffusion layer, the overlapping portion of the first electrode and the impurity diffusion layer can be sufficiently spaced apart. Since the capacitance value of the capacitor is inversely proportional to the distance (that is, the distance between the impurity diffusion layer and the overlapping portion of the first electrode), this can effectively reduce the capacitance component of the parasitic capacitance. As a result, a discrete capacitor having the capacitance value with little error between a design value and a measured value can be provided.

In the discrete capacitor, the oxide film may further include a second opening formed spaced apart from the first opening, and the impurity diffusion layer may extend to a region directly below the second opening, and a second electrode formed of the same conductive material as the first electrode and directly connected with the impurity diffusion layer via the second opening may be further included.

In the discrete capacitor, the substrate may be an n-type semiconductor substrate, and the impurity diffusion layer may be a region to which an n-type impurity is introduced.

In the discrete capacitor, the substrate may be a p-type semiconductor substrate, and the impurity diffusion layer may be a region to which an n-type impurity is introduced.

In the discrete capacitor, the n-type impurity is preferably phosphorus.

In the discrete capacitor, the impurity diffusion layer may be formed on the entire front surface portion of the substrate.

With this configuration, the impurity diffusion layer also serving as the lower electrode is formed on the entire front surface portion of the substrate. Therefore, the whole of the first electrode can be opposed to the impurity diffusion layer reliably even if the first electrode is formed displaced from a design position at the time of manufacturing. As a result, a discrete capacitor resistant to variations in the design such as the displacement can be provided.

A discrete capacitor manufacturing method according to a preferred embodiment of the present invention includes the steps of a first impurity introduction step of introducing an impurity to the front surface portion of the substrate and forming an impurity diffusion layer, forming an oxide film on the substrate through thermal oxidation treatment at a temperature of 950° C. to 1000° C., selectively removing the oxide film and selectively exposing a front surface of the impurity diffusion layer, forming a dielectric film on the impurity diffusion layer having been exposed, and forming a first electrode opposed to the impurity diffusion layer with the dielectric film therebetween.

From the viewpoint of a reduction in thermal oxidation treatment time, the thermal oxide film on the substrate is formed at relatively high temperature. For example, an oxide film with sufficient thickness can be formed in a time on the order of 2 hours and 50 minutes where the thermal oxidation treatment temperature is 1100° C. When the oxide film is formed at relatively high thermal oxidation treatment temperature, however, the impurity introduced to the front surface portion of the substrate may be widely diffused prior to formation of the oxide film. As a result, the impurity concentration on the front surface portion of the impurity diffusion layer after the thermal oxidation treatment is reduced, and along therewith, the rate of change of the capacitance value with respect to DC bias is increased.

Therefore, by forming the oxide film at a relatively low temperature of 950° C. to 1000° C. as in the method according to the preferred embodiment of the present invention, the diffusion of the impurity in the thermal oxidation treatment step can be suppressed. As a result, a reduction in impurity concentration on the front surface portion of the impurity diffusion layer can be suppressed, and thus, a discrete capacitor capable of realizing excellent DC bias characteristics can be provided.

A discrete capacitor manufacturing method according to a preferred embodiment of the present invention includes the steps of a first impurity introduction step of introducing an impurity to the front surface portion of the substrate and forming an impurity diffusion layer, forming an oxide film on the substrate by thermal oxidation treatment, selectively removing the oxide film and selectively exposing the front surface of the impurity diffusion layer, a second impurity introduction step of introducing an impurity of the same conductivity type as the impurity to the front surface portion of the impurity diffusion layer, forming a dielectric film on the impurity diffusion layer having been exposed, and forming a first electrode opposed to the impurity diffusion layer with the dielectric film therebetween.

With this method, compensation for the impurity is made on the front surface portion of the impurity diffusion layer by the second impurity introduction step, so that a reduction in impurity concentration on the front surface portion of the impurity diffusion layer can be suppressed even if there is a factor of reducing the impurity concentration on the front surface portion of the impurity concentration before the second impurity introduction step. Thus, a discrete capacitor capable of realizing excellent DC bias characteristics can be provided.

A discrete capacitor manufacturing method according to a preferred embodiment of the present invention includes the steps of a first impurity introduction step of introducing an impurity to the front surface portion of the substrate and forming an impurity diffusion layer, forming an oxide film on the substrate through thermal oxidation treatment at a temperature of 950° C. to 1000° C., selectively removing the oxide film and selectively exposing the front surface of the impurity diffusion layer, a second impurity introduction step of introducing an impurity of the same conductivity type as the impurity to the front surface portion of the impurity diffusion layer, forming a dielectric film on the impurity diffusion layer having been exposed, and forming a first electrode opposed to the impurity diffusion layer with the dielectric film therebetween.

With this method, in addition to that the oxide film is formed at relatively low temperature, the second impurity introduction step is performed besides the first impurity introduction step. Therefore, a reduction in impurity concentration on the front surface portion of the impurity diffusion layer can be suppressed effectively, whereby a discrete capacitor capable of realizing further excellent DC bias characteristics can be provided.

In the foregoing discrete capacitor manufacturing method, the step of forming the dielectric film preferably includes the step of sequentially laminating a bottom oxide film, a nitride film, and a top oxide film and forming an ONO film.

In the discrete capacitor manufacturing method, the step of forming the ONO film preferably includes the step of forming the bottom oxide film with a thickness of 100 Å to 130 Å, the step of forming the nitride film with a thickness of 100 Å to 110 Å, and the step of forming the top oxide film with a thickness of 190 Å to 220 Å.

In the discrete capacitor manufacturing method, the substrate may be an n-type semiconductor substrate, and the first impurity introduction step may include the step of introducing an n-type impurity to the front surface portion of the substrate.

In the discrete capacitor manufacturing method, the substrate may be a p-type semiconductor substrate, and the first impurity introduction step may include the step of introducing an n-type impurity to the front surface portion of the substrate.

In the discrete capacitor manufacturing method, the first impurity introduction step preferably includes the step of depositing phosphorus on the front surface of the substrate and the step of providing drive-in treatment with respect to the substrate and diffusing the impurity.

With this method, the impurity diffusion layer is formed in the so-called phosphorus deposition step. When the first impurity introduction step is the phosphorus deposition step, the impurity can be diffused from the front surface of the substrate, so that a reduction in impurity concentration on the front surface portion of the impurity diffusion layer can be suppressed.

In the discrete capacitor manufacturing method, the second impurity introduction step preferably includes the step of depositing phosphorus on the front surface of the substrate and the step of providing drive-in treatment with respect to the substrate and diffusing the impurity.

With this method, the second impurity introduction step is the phosphorus deposition step. That is, the impurity can be diffused from the front surface of the substrate after the formation of the oxide film as well, which enables sufficient compensation for the impurity on the front surface portion of the impurity diffusion layer. By this, a reduction in impurity concentration on the front surface portion of the impurity diffusion layer can be effectively suppressed.

In the above discrete capacitor manufacturing method, the first impurity introduction step preferably includes the step of introducing the impurity to the entire front surface portion of the substrate.

With this configuration, the impurity diffusion layer also serving as the lower electrode is formed in the entire front surface portion of the substrate. Therefore, the whole of the first electrode can be opposed to the impurity diffusion layer reliably even if the first electrode is formed displaced from a design position at the time of manufacturing. As a result, a discrete capacitor resistant to variations in the design such as the displacement can be provided.

Hereinafter, preferred embodiments and modes according to reference examples (first to fourth reference examples) of the present invention will be described in detail with reference to the drawings.

First Preferred Embodiment

Figure 2:
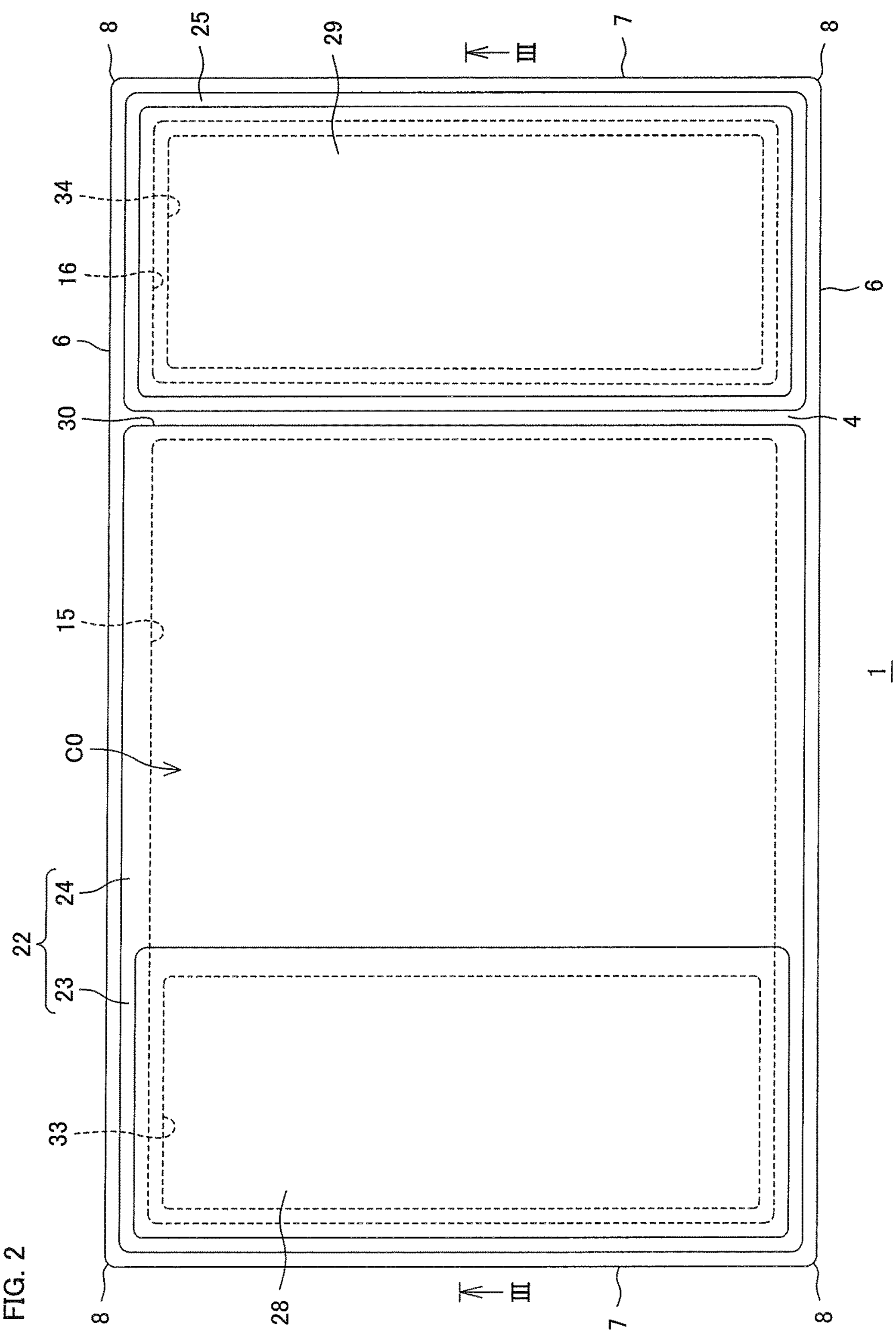
FIG. 2 is a schematic plan view of the discrete capacitor shown in FIG. 1.
Figure 3:
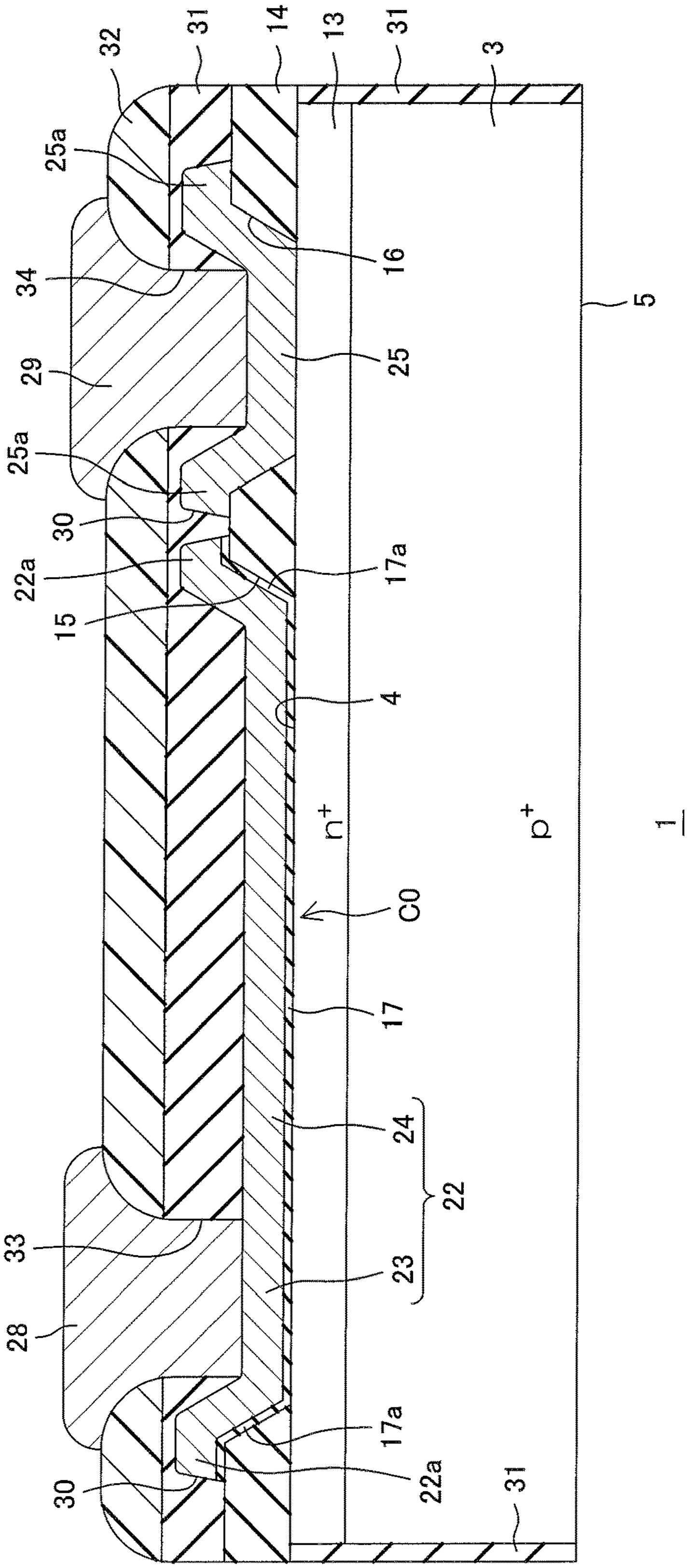
FIG. 3 is a sectional view seen from the line shown in FIG. 2.
Figure 4:
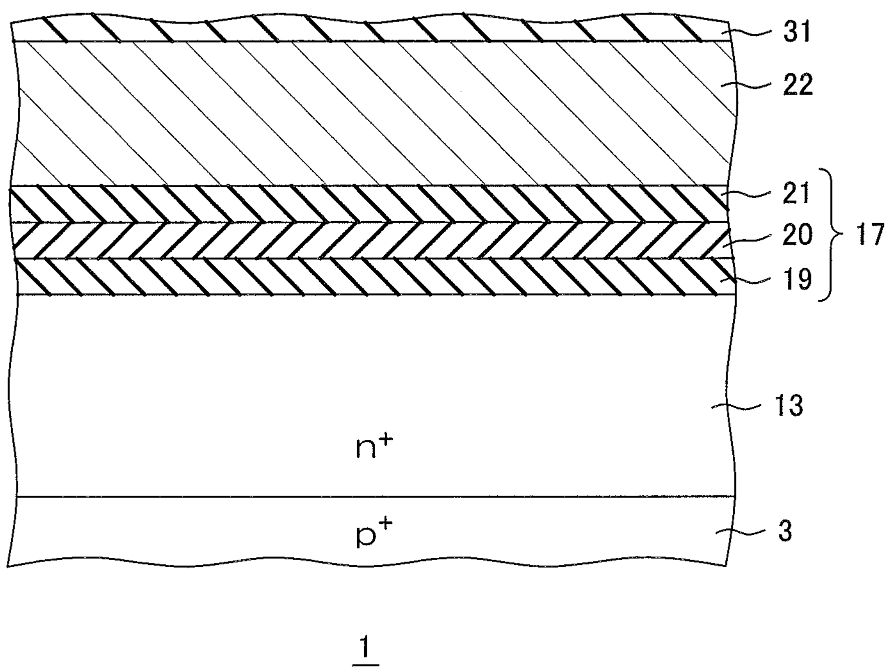
FIG. 4 is a sectional view in which a region including a dielectric film shown in FIG. 3 is enlarged.

FIG. 1 is a schematic perspective view of a discrete capacitor 1 according to the first preferred embodiment of the present invention. FIG. 2 is a schematic plan view of the discrete capacitor 1 shown in FIG. 1. FIG. 3 is a sectional view seen from the line shown in FIG. 2. FIG. 4 is a sectional view in which a region including a dielectric film 17 shown in FIG. 3 is enlarged.

The discrete capacitor 1 is a micro chip component and includes a substrate 3 constituting a main body portion. The substrate 3 is a semiconductor substrate. An $n^-$-type silicon substrate, an $n^+$-type silicon substrate, a $p^-$-type silicon substrate, or a $p^+$-type silicon substrate can be employed as the substrate 3. In the present preferred embodiment, an example of employing a $p^+$-type silicon substrate as the substrate 3 will be described. As for the resistance value, it is preferred that the resistance value of the $n^-$-type silicon substrate is 2Ω to 3Ω, and that of the $n^+$-type silicon substrate is 1.3 mΩ, and that of the $p^-$-type silicon substrate is 25Ω to 30Ω, and that of the $p^+$-type silicon substrate is 3 mΩ.

The substrate 3 is formed in a substantially rectangular parallelepiped shape having one end portion and the other end portion. The planar shape of the substrate 3 is such that the length L1 of a long side 6 along the longitudinal direction is 0.3 mm to 0.6 mm, and the length D1 of a short side 7 along the short direction is 0.15 mm to 0.3 mm. The thickness T1 of the substrate 3 is 0.1 mm, for example. That is, a so-called a 0603 chip, a 0402 chip, or a 03015 chip is applied as the substrate 3.

Each corner portion 8 of the substrate 3 may have a round shape chamfered in a plan view. With the round shape, a structure capable of suppressing chipping during the manufacturing process or at the time of mounting is obtained. A capacitor is formed at an inner portion of the front surface of the substrate 3. Hereinafter, the front surface on which the capacitor is formed is referred to as an element forming surface 4, and a surface on the opposite side is referred to as a back surface 5.

An $n^+$-type impurity diffusion layer 13 is formed on a front surface portion of the substrate 3. In the present preferred embodiment, the impurity diffusion layer 13 is formed on the entire front surface portion of the substrate 3. The impurity diffusion layer 13 is a region to which phosphorus (P) as an example of an n-type impurity is introduced, for example. In particular, the impurity concentration of the front surface portion of the impurity diffusion layer 13 is not less than $5\times10^{19}$ $cm^{-3}$ (more specifically, $5\times10^{19}$ $cm^{-3}$ to $2\times10^{20}$ $cm^{-3}$). The front surface portion of the impurity diffusion layer 13 refers to the range up to a depth on the order of 0 μm to 3 μm (more specifically, on the order of 1 μm) in the depth direction from the element forming surface 4 of the substrate 3.

Where the substrate 3 is the $n^+$-type silicon substrate, the $n^+$-type impurity diffusion layer 13 has an impurity concentration equal to that of the $n^+$-type silicon substrate. In this instance, the $n^+$-type silicon substrate has the same impurity concentration profile (for example, $1\times10^{20}$ $cm^{-3}$) from the front surface portion thereof toward the depth direction.

A silicon oxide film 14 is formed on the element forming surface 4 of the substrate 3. The thickness of the silicon oxide film 14 is, for example, 8000 Å to 12000 Å (10000 Å in the present preferred embodiment). The silicon oxide film 14 has a first opening 15 to selectively expose the impurity diffusion layer 13 and a second opening 16 formed spaced apart from the first opening 15.

The first opening 15 is formed in a rectangular shape in a plan view so as to extend from one end portion side of the substrate 3 to the other end portion side of the substrate 3 along the long side 6 and short side 7 of the substrate 3 (see a broken line portion of FIG. 2). On the other hand, the second opening 16 is formed in a rectangular shape in a plan view along the short side 7 of the substrate 3 at the other end portion side of the substrate 3 (see a broken line portion of FIG. 2).

A dielectric film 17, an upper electrode film 22 as an example of the first electrode of the present invention, and a contact electrode film 25 as an example of the second electrode of the present invention are formed on the substrate 3.

The dielectric film 17 is in contact with a front surface of the impurity diffusion layer 13 exposed from the first opening 15, and is formed in a quadrangular shape in a plan view so as to extend from the one end portion side of the substrate 3 toward the other end portion side. More specifically, the dielectric film 17 is formed along the front surface of the impurity diffusion layer 13 to a lateral portion of the silicon oxide film 14 so as to cover the impurity diffusion layer 13, and includes an overlapping portion **17*a* covering the lateral portion and part of the upper portion of the silicon oxide film 14. The dielectric film 17** in the present preferred embodiment has a laminated structure in which a plurality of insulating films are laminated.

As shown in FIG. 4, the dielectric film 17 is an ONO film formed by laminating in the order of a bottom oxide film 19, a nitride film 20, and a top oxide film 21. The bottom oxide film 19 and the top oxide film 21 are composed of a $SiO_2$ film and the nitride film 20 is composed of a SiN film. The total thickness of the dielectric film 17 may be 390 Å to 460 Å. The thickness of the bottom oxide film 19 is, for example, 100 Å to 130 Å, and that of the nitride film 20 is, for example, 100 Å to 110 Å, and that of the top oxide film 21 is, for example, 190 Å to 220 Å.

The dielectric film 17 may be an oxide film instead of the ONO film. When the dielectric film 17 is composed of the oxide film, in the strict sense, the bottom oxide film 19 and the top oxide film 21 with the nitride film 20 removed from the ONO film, each thickness of the oxide films 19, 21 is 200 Å to 260 Å.

The upper electrode film 22 is formed following the planar shape of the dielectric film 17. That is, the upper electrode film 22 is opposed to the impurity diffusion layer 13 with the dielectric film 17 therebetween, and includes an overlapping portion **22*a* covering the lateral portion and part of the upper portion of the silicon oxide film 14. More specifically, the upper electrode film 22 has a pad region 23 and a base region 24 opposed to the impurity diffusion layer 13 with the dielectric film 17** therebetween.

The pad region 23 and the base region 24 are arranged in the order of the pad region 23 and the base region 24 with respect to the contact electrode film 25. That is, the base region 24 is arranged between the pad region 23 and the contact electrode film 25 along the front surface of the substrate 3. As a result, interference of the electrodes between the pad region 23 and the contact electrode film 25 can be suppressed along the front surface direction of the substrate 3.

In the present preferred embodiment, a single capacitor element C0 is constructed of the impurity diffusion layer 13 serving as the lower electrode, the dielectric film 17, and the upper electrode film 22 in which the pad region 23 and the base region 24 are integrated.

The contact electrode film 25 is directly connected, via the second opening 16, with the impurity diffusion layer 13 extending to a region directly below the second opening 16. The contact electrode film 25 is formed along the front surface of the impurity diffusion layer 13 so as to cover the impurity diffusion layer 13, and includes an overlapping portion 25*a* covering the lateral portion and part of the upper portion of the silicon oxide film 14.

The upper electrode film 22 and the contact electrode film 25 are formed of the same conductive material. For example, the conductive material such as Al, AlCu, AlSiCu, etc., can be exemplified. The upper electrode film 22 and the contact electrode film 25 are electrically separated on the silicon oxide film 14 by slits 30 rimming each peripheral edge portion of the upper electrode film 22 and contact electrode film 25.

On the silicon oxide film 14, a passivation film 31 and a resin film 32 are formed in this order so as to cover the upper electrode film 22 and the contact electrode film 25. The passivation film 31 is also formed on lateral surfaces of the substrate 3. The passivation film 31 contains, for example, silicon nitride or USG (Undoped Silicate Glass), and the resin film 32 is composed of polyimide, for example. The passivation film 31 and the resin film 32 constitute protective films and suppress or prevent permeation of moisture into the upper electrode film 22 and the contact electrode film 25, and the element forming surface 4, and also absorb external impact and contribute to an improvement in the durability of the discrete capacitor 1.

Pad openings 33, 34 to selectively expose the pad region 23 of the upper electrode film 22 and the contact electrode film 25 are formed on the passivation film 31 and the resin film 32. First and second connection electrodes 28, 29 are formed so as to backfill the pad openings 33, 34.

The first and second connection electrodes 28, 29 are formed spaced apart from each other on the substrate 3. The first connection electrode 28 is connected with the pad region 23 of the upper electrode film 22 at one end portion side of the substrate 3. The second connection electrode 29 is connected with the contact electrode film 25 at the other end portion side of the substrate 3. The first and second connection electrodes 28, 29 are formed in a substantially rectangular shape in a plan view along the short sides 7 of the substrate 3. The first and second connection electrodes 28, 29 are protruded from the front surface of the resin film 32 and have a front surface at a position higher than the resin film 32 (a position far from the substrate 3), and have an overlapping portion stretching from an opening end of the pad opening 33, 34 to the front surface of the resin film 32. Although not shown in FIG. 3, the first and second connection electrodes 28, 29 have an Ni layer, a Pd layer, and an Au layer in this order from the element forming surface 4.

In each of the first and second connection electrodes 28, 29, the Ni layer constitutes a large part of each connection electrode, and the Pd layer and the Au layer are formed significantly thinly as compared to the Ni layer. The Ni layer has the role of relaying the conductive material of the first and second connection electrodes 28, 29 and solder when the discrete capacitor 1 is mounted on a mounting substrate. The first and second connection electrodes 28, 29 may have the front surface at a position lower than the front surface of the resin film 32 (a position nearer to the substrate 3).

As described above, with the discrete capacitor 1, the pad region 23 is also opposed to the impurity diffusion layer 13 with the dielectric film 17 therebetween in addition to the base region 24. Therefore, the region on the first opening can be used effectively, and simultaneously the capacitance value of the capacitor element C0 can be effectively increased within a limited area.

The capacitance value in the capacitor element C0 can be adjusted by changing the area of the base region 24 opposed to the impurity diffusion layer 13. Thus, for example, by reducing the area of the base region 24 opposed to the impurity diffusion layer 13 to half, the capacitance value in the base region 24 can be reduced to half as well. Furthermore, by zeroing out the area of the base region 24, the capacitance value in the capacitor element C0 can be set at a capacitance value between the pad region 23 and the impurity diffusion layer 13. Accordingly, the discrete capacitor 1 having a variety of capacitance values can be easily manufactured and provided. Further, the area of the base region 24 can be adjusted by changing the layout of a resist mask in a resist mask formation step of step S12 described later (see FIG. 5).

Further, with the discrete capacitor 1, parasitic capacitance is formed between the impurity diffusion layer 13 and respective overlapping portions 22*a*, 25*a* of the upper electrode film 22 and contact electrode film 25 on the silicon oxide film 14. As described above, the impurity diffusion layer 13 and each overlapping portion 22*a*, 25*a* can be sufficiently spaced apart where the thickness of the silicon oxide film 14 is 8000 Å to 12000 Å. Since the capacitance value of the capacitor is inversely proportional to the distance (that is, the distance between the impurity diffusion layer 13 and each overlapping portion 22*a*, 25*a*), the capacitance component of the parasitic capacitance can be reduced effectively. As a result, the discrete capacitor 1 having the capacitance value with little error between a design value and a measured value can be provided.

<First Manufacturing Method>

Figure 5:
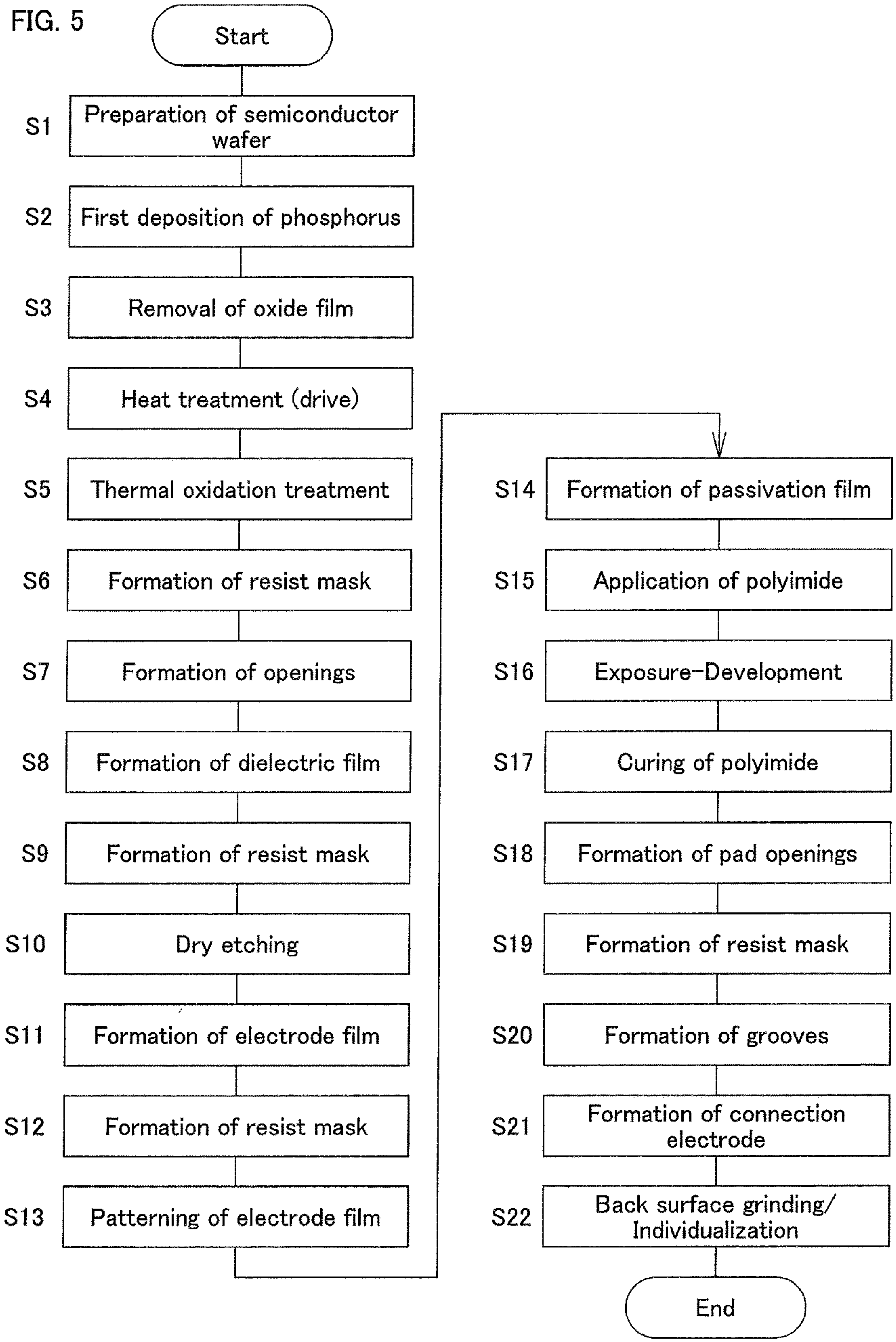
FIG. 5 is a flow chart for explaining the first manufacturing method of the discrete capacitor shown in FIG. 1.
Figure 6:
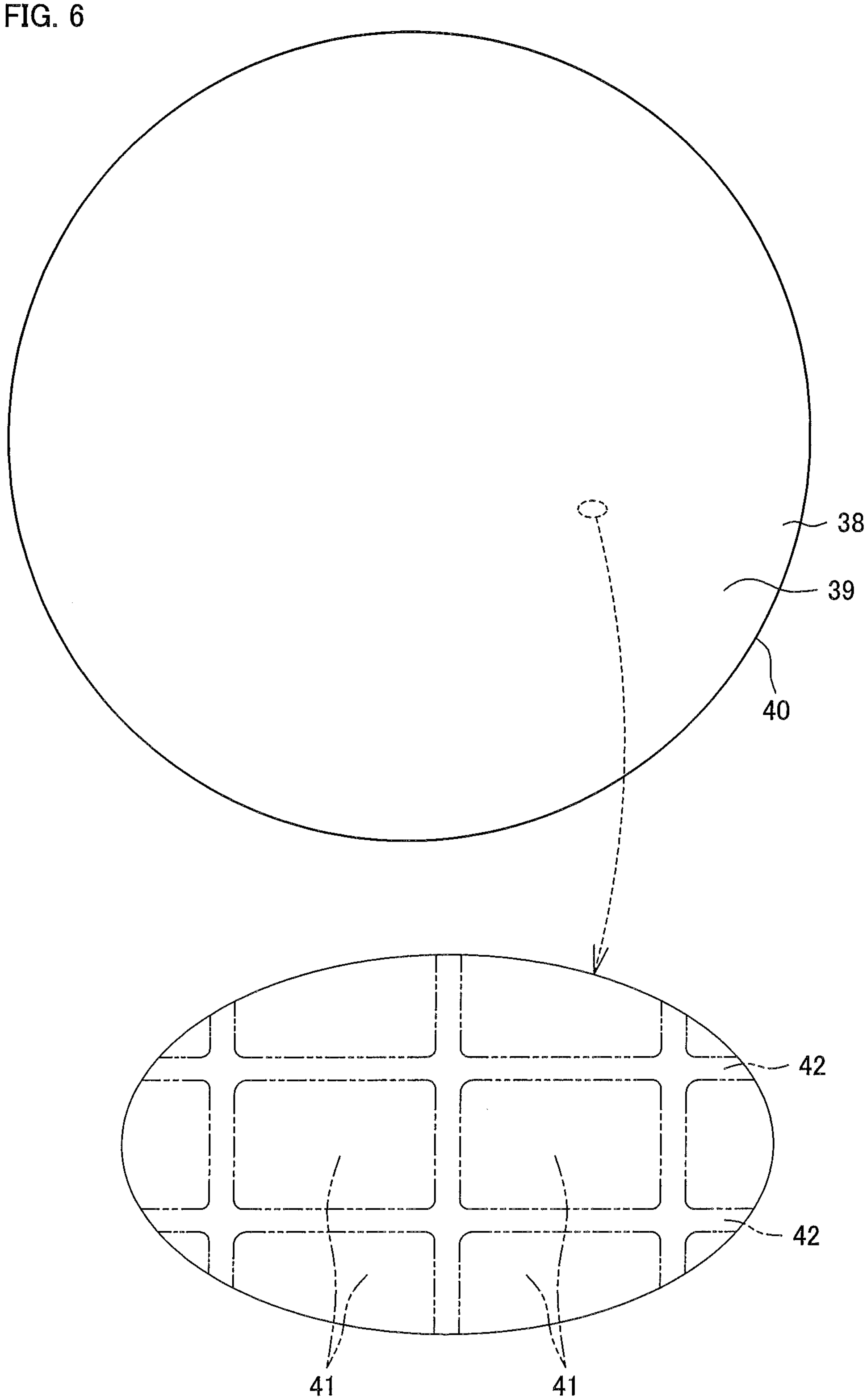
FIG. 6 is a schematic plan view of a semiconductor wafer applied to the first manufacturing method of FIG. 5.

FIG. 5 is a flow chart for explaining the first manufacturing method of the discrete capacitor 1 shown in FIG. 1. FIG. 6 is a schematic plan view of a semiconductor wafer 38 applied to the first manufacturing method of FIG. 5. FIGS. 7A to 7H are schematic sectional views for explaining one process of the first manufacturing method shown in FIG. 5.

Figure 7A:
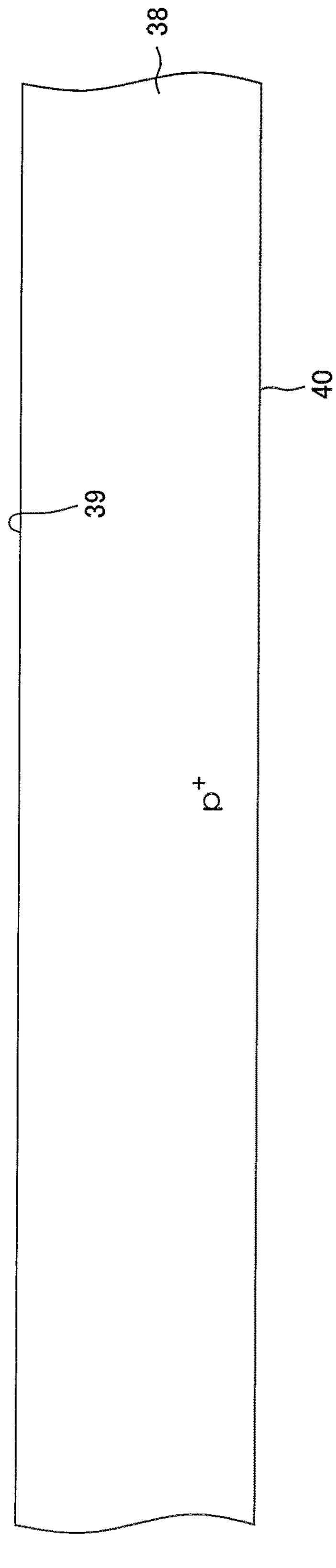
FIGS. 7A to 7H are schematic sectional views for explaining one process of the first manufacturing method of FIG. 5.

First, as shown in FIG. 6 and FIG. 7A, the semiconductor wafer 38 as an original substrate of the substrate 3 is prepared (step S1: Preparation of semiconductor wafer). The semiconductor wafer 38 may be an $n^+$-type silicon wafer, an $n^-$-type silicon wafer, a $p^+$-type silicon wafer, or $p^-$-type silicon wafer. In the present manufacturing method, an example of a $p^+$-type silicon wafer is shown.

A front surface 39 of the semiconductor wafer 38 corresponds to the element forming surface 4 of the substrate 3, and a back surface 40 of the semiconductor wafer 38 corresponds to the back surface 5 of the substrate 3. Chip regions 41 at which a plurality of the discrete capacitors 1 are formed are arrayed and configured in a matrix form on the front surface 39 of the semiconductor wafer 38. Boundary regions 42 are provided between mutually adjacent chip regions 41. The boundary regions 42 are a strip region having a substantially constant width, and extend in two orthogonal directions and are formed in a lattice form.

Figure 7B:
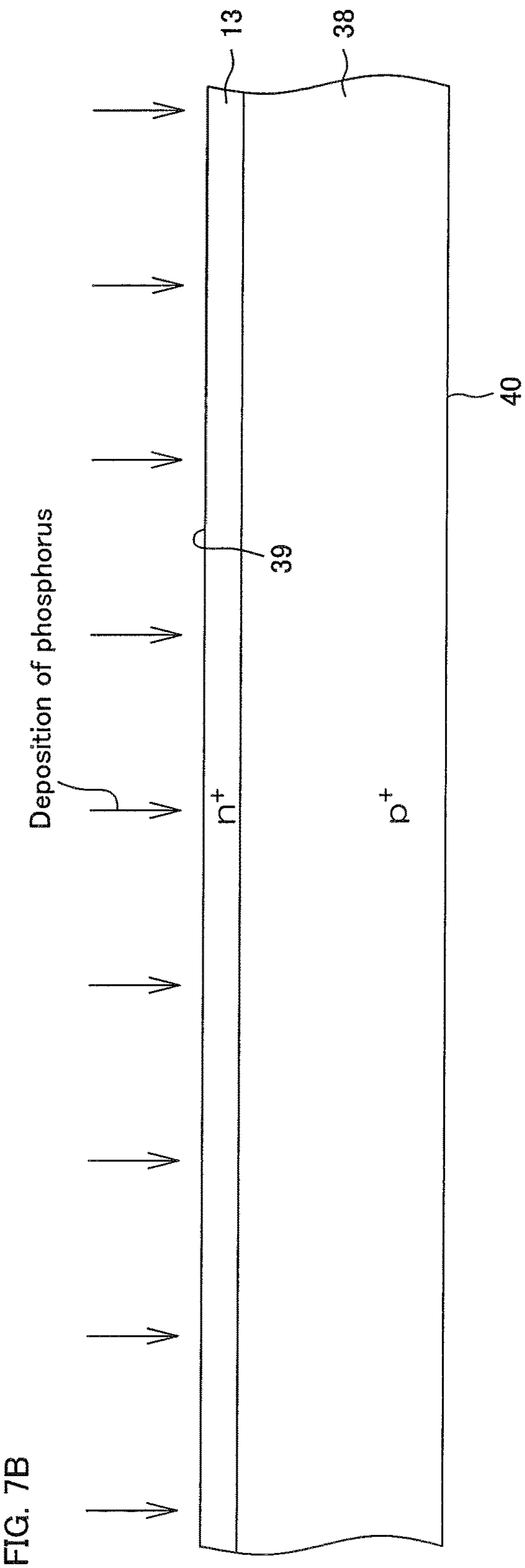

Subsequently, as shown in FIG. 7B, an n-type impurity is introduced to a front surface portion of the semiconductor wafer 38. The introduction of the n-type impurity is performed by a so-called phosphorus deposition step of depositing phosphorus (P) as the n-type impurity on the front surface 39 of the semiconductor wafer 38 (step S2: First deposition of phosphorus). The phosphorus deposition step is a process of carrying the semiconductor wafer 38 into a diffusion furnace and depositing phosphorus on the front surface 39 of the semiconductor wafer 38 through heat treatment that is performed flowing $POCl_3$ gas within the diffusion furnace. In the present preferred embodiment, such phosphorus deposition step is carried out under a temperature of 920° C. for 30 minutes.

Subsequently, the oxide film (not shown) having been formed on the front surface 39 of the semiconductor wafer 38 through the phosphorus deposition step is removed by wet etching (step S3: Removal of oxide film). The etchant is hydrofluoric acid, for example.

Subsequently, heat treatment (drive-in treatment) for activating the n-type impurity having been introduced to the semiconductor wafer 38 is performed (step S4: Heat treatment (drive)). The drive-in treatment is such that dry treatment is carried out under a temperature of 900° C. for 10 minutes and wet treatment is carried out under a temperature of 1000° C. for 40 minutes and heat treatment is carried out in an atmosphere of a nitrogen gas under a temperature of 1050° C. for 2 hours. As a result, the impurity diffusion layer 13 having a predetermined depth is formed on the front surface portion of the semiconductor wafer 38.

Figure 7C:
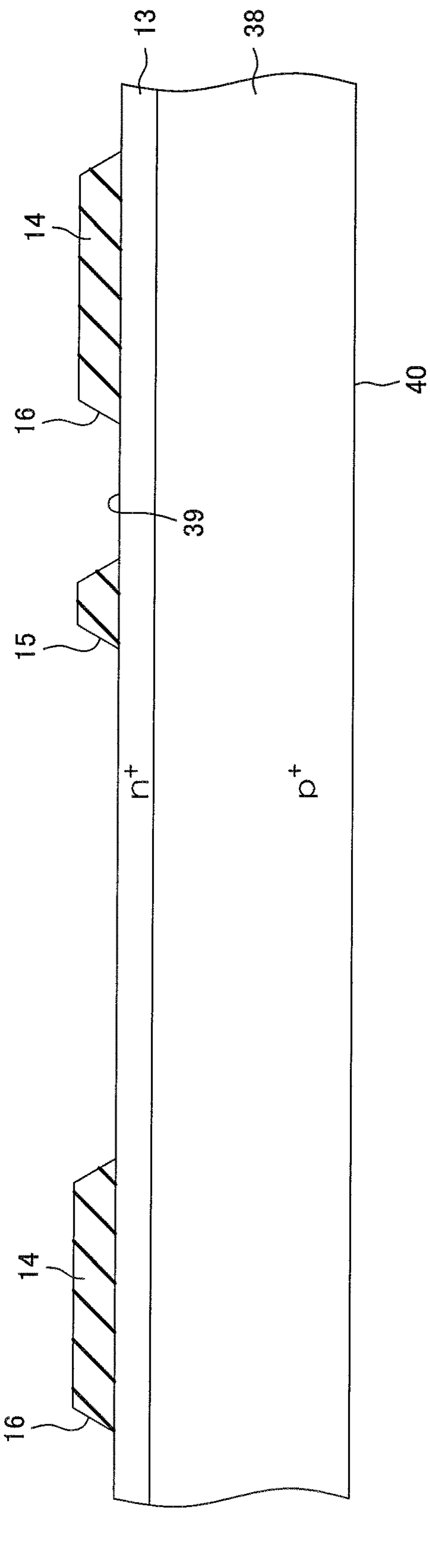

Subsequently, as shown in FIG. 7C, thermal oxidation treatment is applied to the front surface 39 of the semiconductor wafer 38 (step S5: Thermal oxidation treatment). The thermal oxidation treatment is carried out under a temperature of 950° C. to 1000° C. for 4 to 10 hours (at 1000° C. for 4 hours in the present manufacturing process). As a result, the silicon oxide film 14 having a predetermined thickness (for example, a thickness of 10000 Å) is formed on the front surface 39 of the semiconductor wafer 38. Subsequently, a resist mask (not shown) is formed on the silicon oxide film 14 (step S6: Formation of resist mask). The first and second openings 15, 16 are formed in the silicon oxide film 14 by etching using the resist mask (step S7: Formation of openings).

Figure 7D:
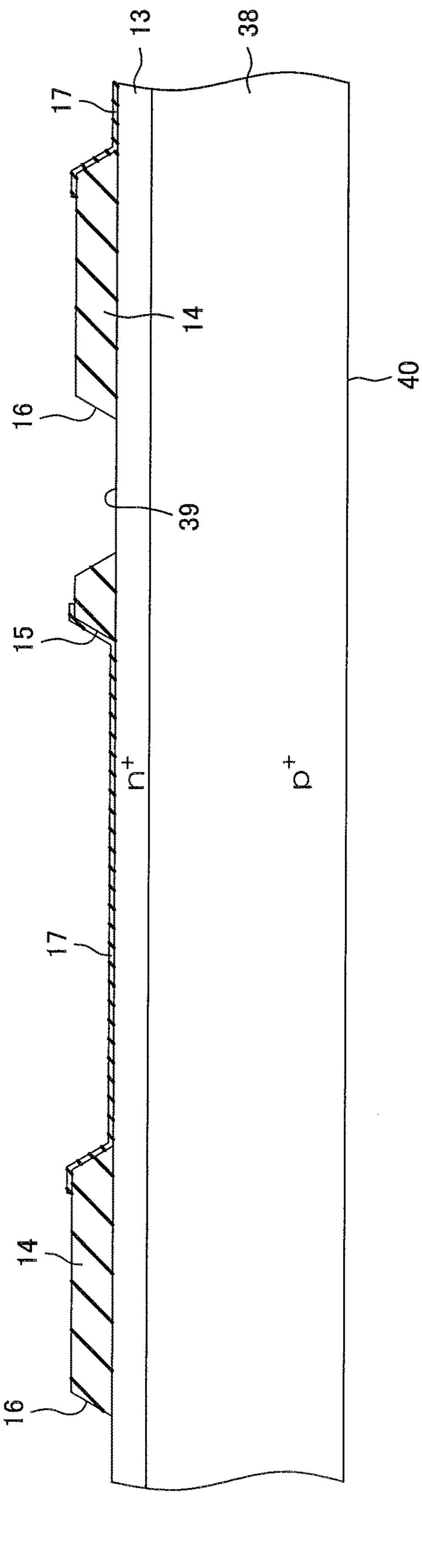

Subsequently, as shown in FIG. 7D, the bottom oxide film 19, the nitride film 20, and the top oxide film 21 (see FIG. 4 together) are deposited in this order and the dielectric film 17 (ONO film) is formed on the entire front surface 39 of the semiconductor wafer 38 (step S8: Formation of dielectric film). The bottom oxide film 19 and the top oxide film 21 are formed by thermal oxidation treatment, and the nitride film 20 is formed by a CVD method. At this moment, the dielectric film 17 is formed such that the thickness of the bottom oxide film 19 is 100 Å to 130 Å, and that of the nitride film 20 is 100 Å to 110 Å, and that of the top oxide film 21 is 190 Å to 220 Å.

Subsequently, a resist mask (not shown) selectively having an opening to expose the second opening 16 is formed on the dielectric film 17 (step S9: Formation of resist mask). An unnecessary part of the dielectric film 17 is selectively removed by etching (for example, reactive ion etching) through the resist mask (step S10: Dry etching). The front surface 39 of the semiconductor wafer 38 is washed according to need after the dielectric film 17 is removed.

Figure 7E:
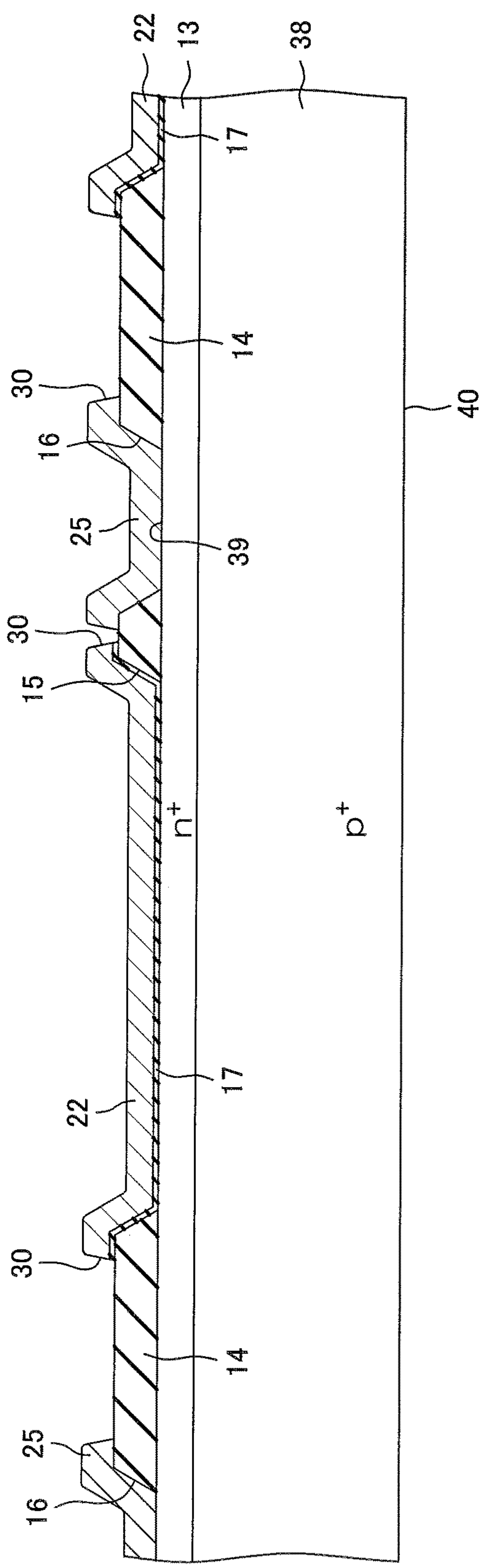

Subsequently, as shown in FIG. 7E, an electrode film constituting the upper electrode film 22 and the contact electrode film 25 is formed on the semiconductor wafer 38 by sputtering (step S11: Formation of electrode film). In the present preferred embodiment, an electrode film composed of AlSiCu (for example, a thickness of 10000 Å) is formed. A resist mask (not shown) having an opening pattern corresponding to the slits 30 is then formed on the electrode film (step S12: Formation of resist mask). The slits 30 are formed in the electrode film by etching (for example, reactive ion etching) through the resist mask (step S13: Patterning of electrode film). As a result, the electrode film is separated into the upper electrode film 22 and the contact electrode film 25.

Figure 7F:
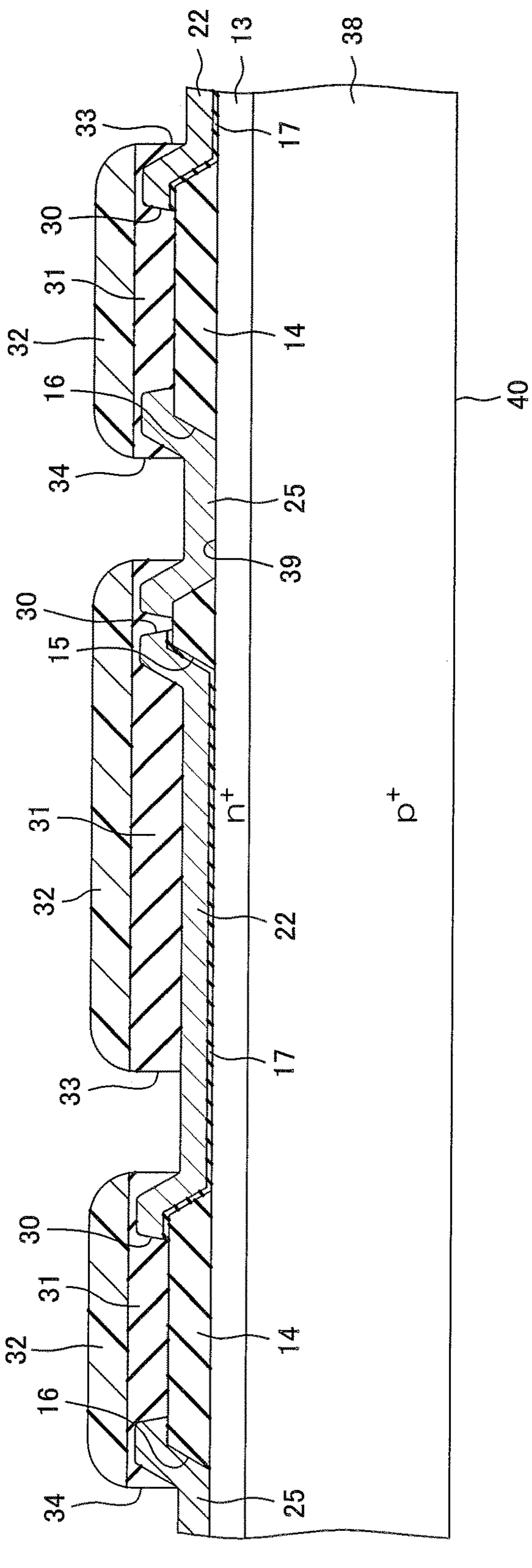

Subsequently, as shown in FIG. 7F, a passivation film 31 being a nitride film is formed by a CVD method, for example, after the resist mask is peeled off (step S14: Formation of passivation film). Subsequently, photosensitive polyimide is applied to form the resin film 32 (step S15: Application of polyimide).

Subsequently, the resin film 32 is exposed with a pattern corresponding to the pad openings 33, 34. Thereafter, the resin film 32 is developed (step S16: Exposure-Development). Subsequently, heat treatment for curing the resin film 32 is performed according to need (step S17: Curing of polyimide). The passivation film 31 is then removed by dry etching (for example, reactive ion etching) with the resin film 32 as the mask (step S18: Formation of pad openings). As a result, the pad openings 33, 34 are formed.

Figure 7G:
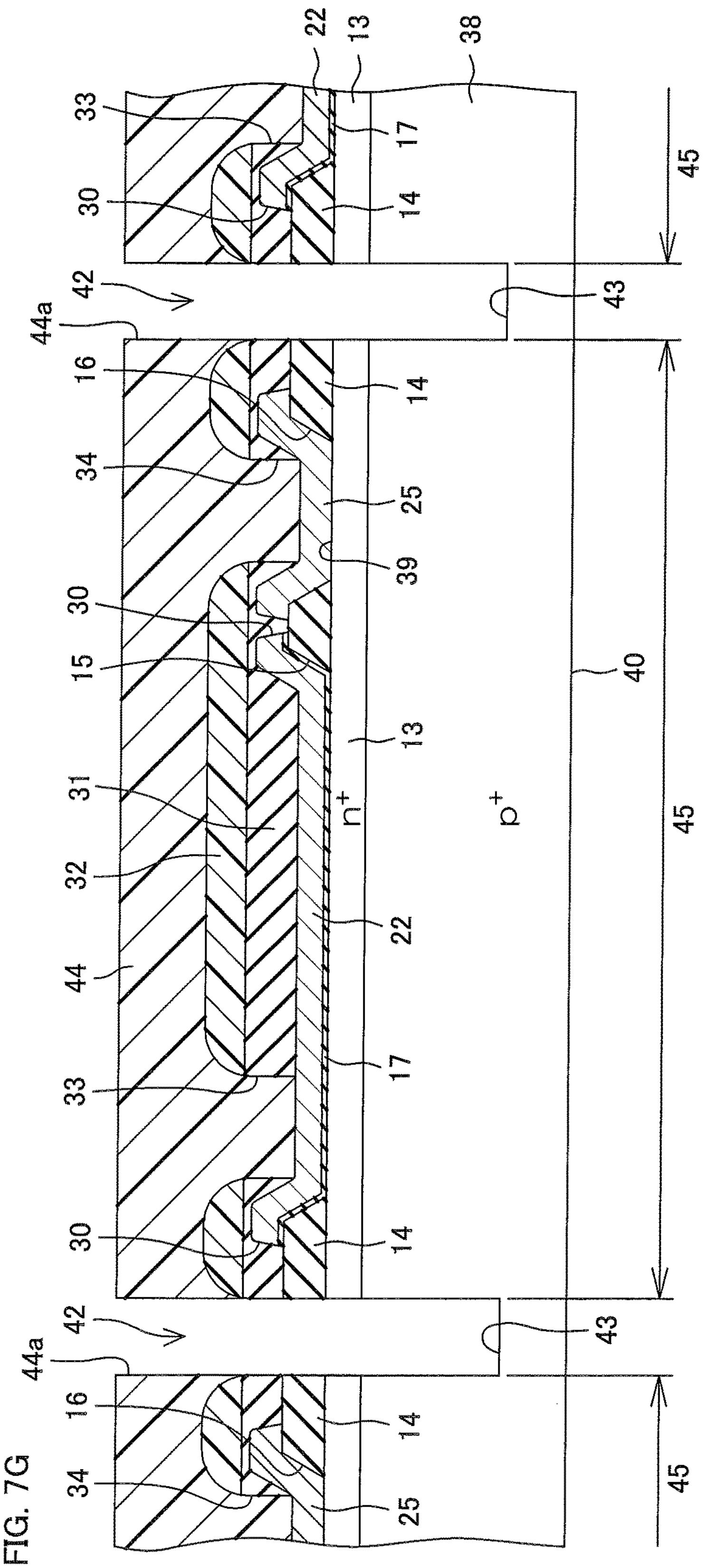

Subsequently, as shown in FIG. 7G, a resist pattern 44 for forming cutting grooves 43 in boundary regions 42 (see FIG. 6 together) is formed (step S19: Formation of resist mask). The resist pattern 44 has lattice openings 44*a* aligned with the boundary regions 42. Plasma etching is performed through the resist pattern 44 (step S20: Formation of grooves). As a result, the semiconductor wafer 38 is etched to a predetermined depth from the front surface 39, and the cutting grooves 43 along the boundary regions 42 are formed.

Semi-finished products 45 are positioned one by one in the chip regions 41 surrounded by the cutting grooves 43. These semi-finished products 45 are aligned and arranged in a matrix form. Forming the cutting grooves 43 as above allows the semiconductor wafer 38 to be separated into a plurality of the chip regions 41. The resist pattern 44 is peeled off after the cutting grooves 43 are formed.

Figure 7H:
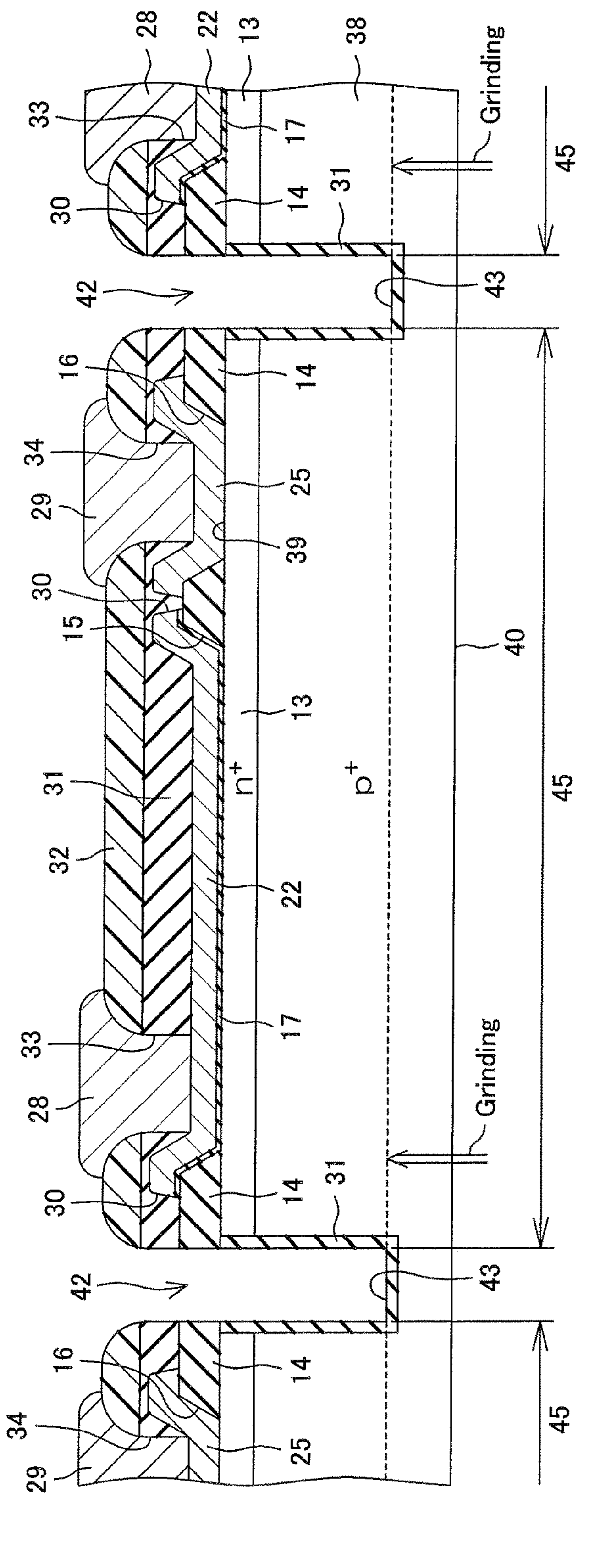

Subsequently, as shown in FIG. 7H, the passivation film 31 composed of USG is formed on inner peripheral surfaces (a bottom surface and lateral surfaces) of the cutting groove 43 by the CVD method. Subsequently, an Ni layer, a Pd layer, and an Au layer are film-formed by plating in this order so as to backfill the pad openings 33, 34 (step S21: Formation of connection electrode). As a result, the first and second connection electrodes 28, 29 are formed. Subsequently, the semiconductor wafer 38 is ground from the back surface 40 side until reaching the bottom surfaces of the cutting grooves 43 (step S22: Back surface grinding/Individualization). As a result, the plurality of chip regions 41 are individualized and the discrete capacitors 1 can be obtained.

As described above, if the semiconductor wafer 38 is ground from the back surface 5 side after the cutting grooves 43 are formed, the plurality of chip regions 41 formed on the semiconductor wafer 38 can be individualized all at once. Thus, an improvement in the productivity of the discrete capacitor 1 can be achieved by the reduction in manufacturing time. Further, the back surface 5 of the finished substrate 3 may be mirror-finished by polishing or etching to make the back surface 5 in excellent appearance.

Further, the impurity diffusion layer 13 also serving as the lower electrode is formed on the entire front surface portion of the substrate 3. Thus, the whole of the upper electrode film 22 can be opposed to the impurity diffusion layer 13 reliably even if the upper electrode film 22 is formed displaced from a design position at the time of manufacturing. As a result, the discrete capacitor 1 resistant to variations in the design such as displacement can be provided.

<Characteristics of First Manufacturing Method>

Subsequently, characteristics of discrete capacitors according to one reference example and another reference example will be described with reference to FIG. 8 and FIG. 9, and thereafter characteristics of the discrete capacitor 1 manufactured through the first manufacturing method will be described with reference to FIG. 10.

Figure 8:
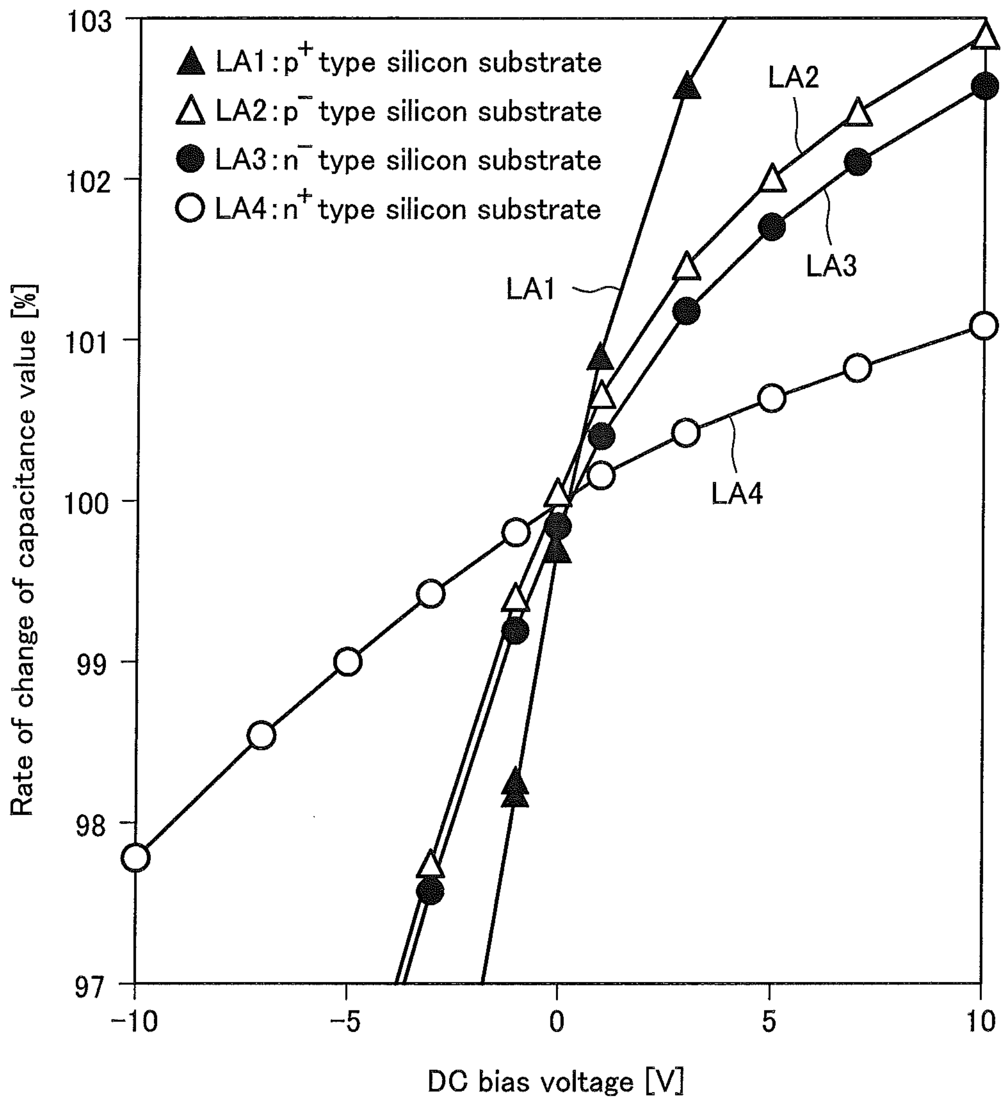
FIG. 8 is a graph showing DC bias vs. rate of change of the capacitance value of a discrete capacitor according to one reference example.

FIG. 8 is a graph showing DC bias vs. rate of change of the capacitance value of a discrete capacitor according to the one reference example. In FIG. 8, the horizontal axis shows the DC bias (V) and the vertical axis shows the rate of change of the capacitance value which is defined as 100% when the DC bias is 0V.

The discrete capacitor according to the one reference example is manufactured by changing part of the first manufacturing method (see FIG. 5). More specifically, the discrete capacitor according to the one reference example is manufactured making the heat treatment condition in an atmosphere of the nitrogen gas at the heat treatment (drive) step of step S4 under a temperature of 1150° C. for 14 hours and making the condition of the thermal oxidation treatment at step S5 under a temperature of 1100° C. for 2 hours and 50 minutes. The other steps are the same as the first manufacturing method.

Curve LA1 in the graph of FIG. 8 shows characteristics when a $p^+$-type silicon substrate is used, and the capacitance value when the DC bias is 0V is 68.5 pF. Curve LA2 shows characteristics when a $p^-$-type silicon substrate is used, and the capacitance value when the DC bias is 0V is 68.4 pF. Curve LA3 shows characteristics when an $n^-$-type silicon substrate is used, and the capacitance value when the DC bias is 0V is 67.8 pF. Curve LA4 shows characteristics when an $n^+$-type silicon substrate is used, and the capacitance value when the DC bias is 0V is 63.2 pF.

With reference to the curves LA1 to LA4, the rate of change of the capacitance value when the DC bias is −10V exceeds −2% in all cases, and the rate of change of the capacitance value when the DC bias is +10V exceeds +1% in all cases.

Figure 9:
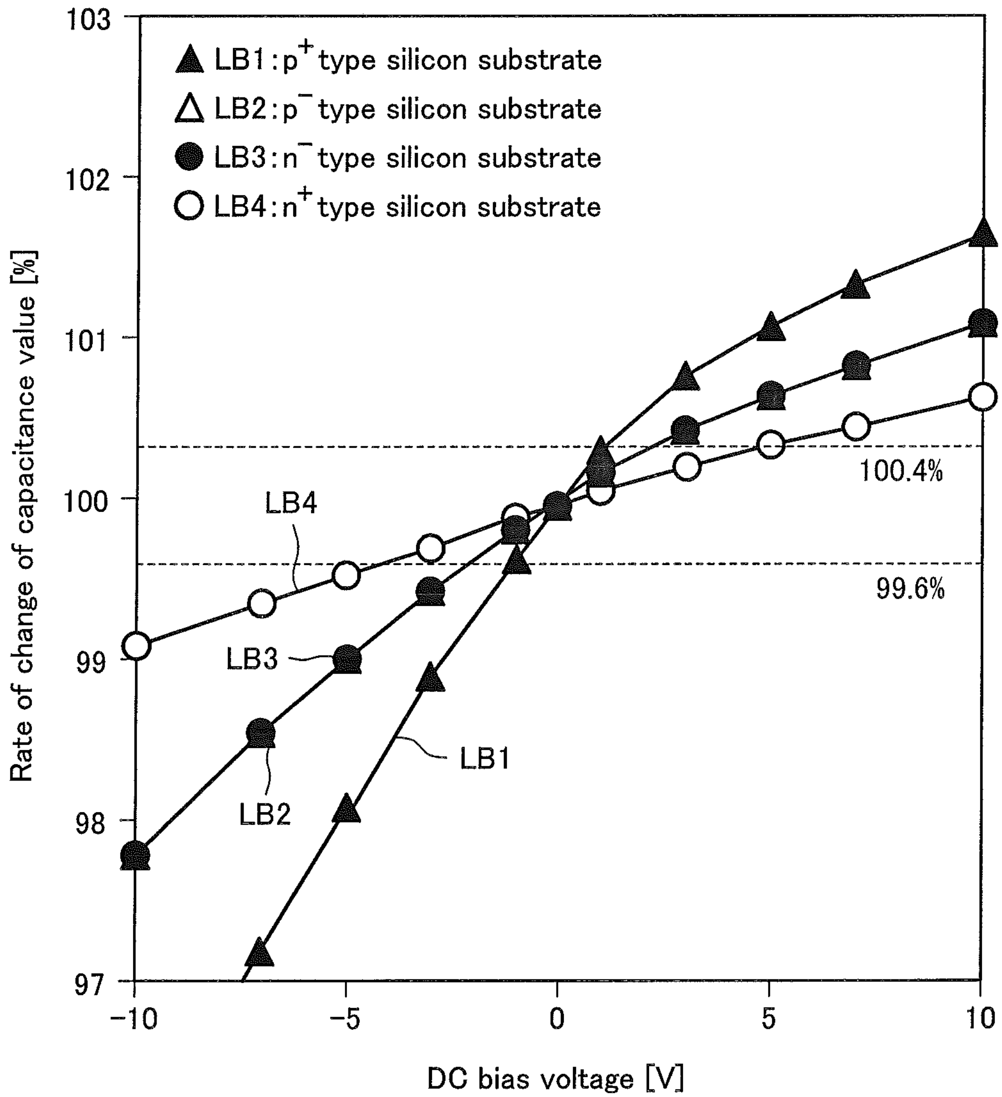
FIG. 9 is a graph showing DC bias vs. rate of change of the capacitance value of a discrete capacitor according to another reference example.

FIG. 9 is a graph showing DC bias vs. rate of change of the capacitance value of a discrete capacitor according to another reference example. In FIG. 9, the horizontal axis shows the DC bias (V) and the vertical axis shows the rate of change of the capacitance value which is defined as 100% when the DC bias is 0V.

The discrete capacitor according to the another reference example is manufactured making the condition of the thermal oxidation treatment at step S5 under a temperature of 1100° C. for 2 hours and 50 minutes. The other steps are the same as the first manufacturing method.

Curve LB1 in the graph of FIG. 9 shows characteristics when a $p^+$-type silicon substrate is used, and the capacitance value when the DC bias is 0V is 64.4 pF. Curve LB2 shows characteristics when a $p^-$-type silicon substrate is used, and the capacitance value when the DC bias is 0V is 63.0 pF. Curve LB3 shows characteristics when an $n^-$-type silicon substrate is used, and the capacitance value when the DC bias is 0V is 63.7 pF. Curve LB4 shows characteristics when an $n^+$-type silicon substrate is used, and the capacitance value when the DC bias is 0V is 56.1 pF.

With reference to the curves LB1 to LB4, the rate of change of the capacitance value when the DC bias is −10V exceeds −0.8% in all cases, and the rate of change of the capacitance value when the DC bias is +10V exceeds +0.6% in all cases.

From this, it is seen that the rate of change of the capacitance value is improved as compared to the foregoing discrete capacitor according to the one reference example in FIG. 8 by relaxing the condition of the heat treatment in an atmosphere of the nitrogen gas at the heat treatment (drive) step of step S4 as in the discrete capacitor according to the another reference example.

That is, the relatively high heat treatment (drive-in) temperature and thermal oxidation treatment temperature are applied at step S4 and step S5 in the discrete capacitor according to the one reference example. Therefore, the impurity deposited on the front surface 39 of the semiconductor wafer 38 at the first phosphorus deposition step of step S2 is widely diffused. As a result, the impurity concentration on the front surface portion of the impurity diffusion layer 13 is reduced (the resistance value on this front surface portion is increased), and the rate of change of the capacitance value with respect to the DC bias is increased as shown in FIG. 8.

In the discrete capacitor 1 according to the one preferred embodiment of the present invention, the condition of the thermal oxidation treatment at step S5 is further relaxed relative to the discrete capacitor according to the another reference example. Thus, the DC bias characteristics are thought to be further improved. Hereinafter, the DC bias characteristics according to the discrete capacitor 1 will be described in detail referring to FIG. 10.

Figure 10:
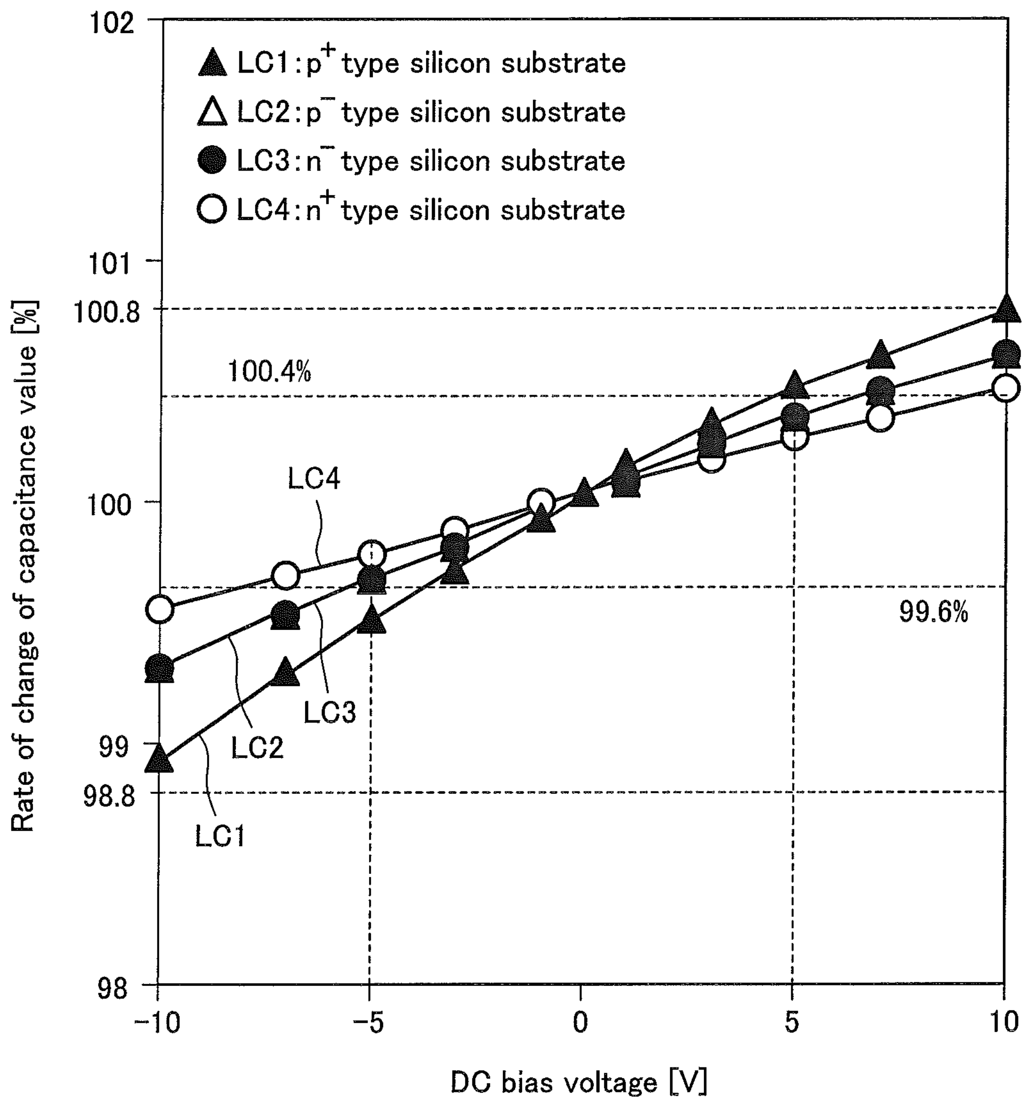
FIG. 10 is a graph showing DC bias vs. rate of change of the capacitance value of a discrete capacitor manufactured through the first manufacturing method shown in FIG. 5.

FIG. 10 is a graph showing DC bias vs. rate of change of the capacitance value of the discrete capacitor 1 manufactured through the first manufacturing method shown in FIG. 5. In FIG. 10, the horizontal axis shows the DC bias (V) and the vertical axis shows the rate of change of the capacitance value which is defined as 100% when the DC bias is 0V.

Curve LC1 in the graph of FIG. 10 shows characteristics when a $p^+$-type silicon substrate is used, and the capacitance value when the DC bias is 0V is 58.2 pF. Curve LC2 shows characteristics when a $p^-$-type silicon substrate is used, and the capacitance value when the DC bias is 0V is 55.3 pF. Curve LC3 shows characteristics when an $n^-$-type silicon substrate is used, and the capacitance value when the DC bias is 0V is 55.4 pF. Curve LC4 shows characteristics when an $n^+$-type silicon substrate is used, and the capacitance value when the DC bias is 0V is 49.6 pF.

With reference to the curves LC1 to LC4, it is seen that the rate of change of the capacitance value in the DC bias range of −10V to +10V achieves between −1.2% and +0.8% inclusive. It is also seen that the rate of change of the capacitance value in the DC bias range of −5V to +5V achieves between −0.6% and +0.4% inclusive.

More specifically, looking at the curve LC1 ($p^+$-type silicon substrate), the range of the absolute value of the rate of change of the capacitance value with respect to the DC bias achieves |(100.8-98.8)/20|=|0.1|%/V or less in the DC bias range of −10V to +10V, and achieves |(100.4-99.4)/|0.1|=|0.1|%/V or less in the DC bias range of −5V to +5V.

Looking at the curve LC2 ($p^-$-type silicon substrate) and the curve LC3 ($n^-$-type silicon substrate), the range of the absolute value of the rate of change of the capacitance value with respect to the DC bias achieves |(100.6-99.2)/20|=|0.07|%/V or less in the DC bias range of −10V to +10V, and achieves |(100.4-99.6)/10|=|0.08|%/V or less in the DC bias range of −5V to +5V.

Looking at the curve LC4 ($n^+$-type silicon substrate), the range of the absolute value of the rate of change of the capacitance value with respect to the DC bias achieves |(100.4−99.4)/20|=|0.05|%/V or less in the DC bias range of −10V to +10V, and achieves |(100.2−99.6)/10|=|0.0|%/V or less in the DC bias range of −5V to +5V.

As above, with the first manufacturing method, it can be confirmed that the range of the absolute value of the rate of change of the capacitance value with respect to the DC bias is able to achieve |(100.8−98.8)/20|=|0.1|%/V or less in the DC bias range of −10V to +10V. It can also be confirmed that the range of the absolute value is able to achieve |(100.4−99.4)/10|=|0.1|%/V or less in the DC bias range of −5V to +5V. In particular, it can be confirmed that the $n^+$-type silicon substrate is able to achieve the best characteristics, as shown in the curve LC4.

Further, with the first manufacturing method, the thermal oxidation treatment is applied to the semiconductor wafer 38 under a temperature of 950° C. to 1000° C. over 4 to 10 hours in the thermal oxidation treatment step at step S5, as shown in FIG. 5. With this step, the oxide film is formed at relatively low temperature, so that the diffusion of the impurity during the thermal oxidation treatment step can be suppressed. As a result, a reduction in impurity concentration on the front surface portion of the impurity diffusion layer 13 can be suppressed, and thus, as shown in FIG. 10, the discrete capacitor 1 having excellent DC bias characteristics can be provided.

Instead of the first manufacturing method, the second manufacturing method as will be described below may be employed.

<Second Manufacturing Method>

Figure 11:
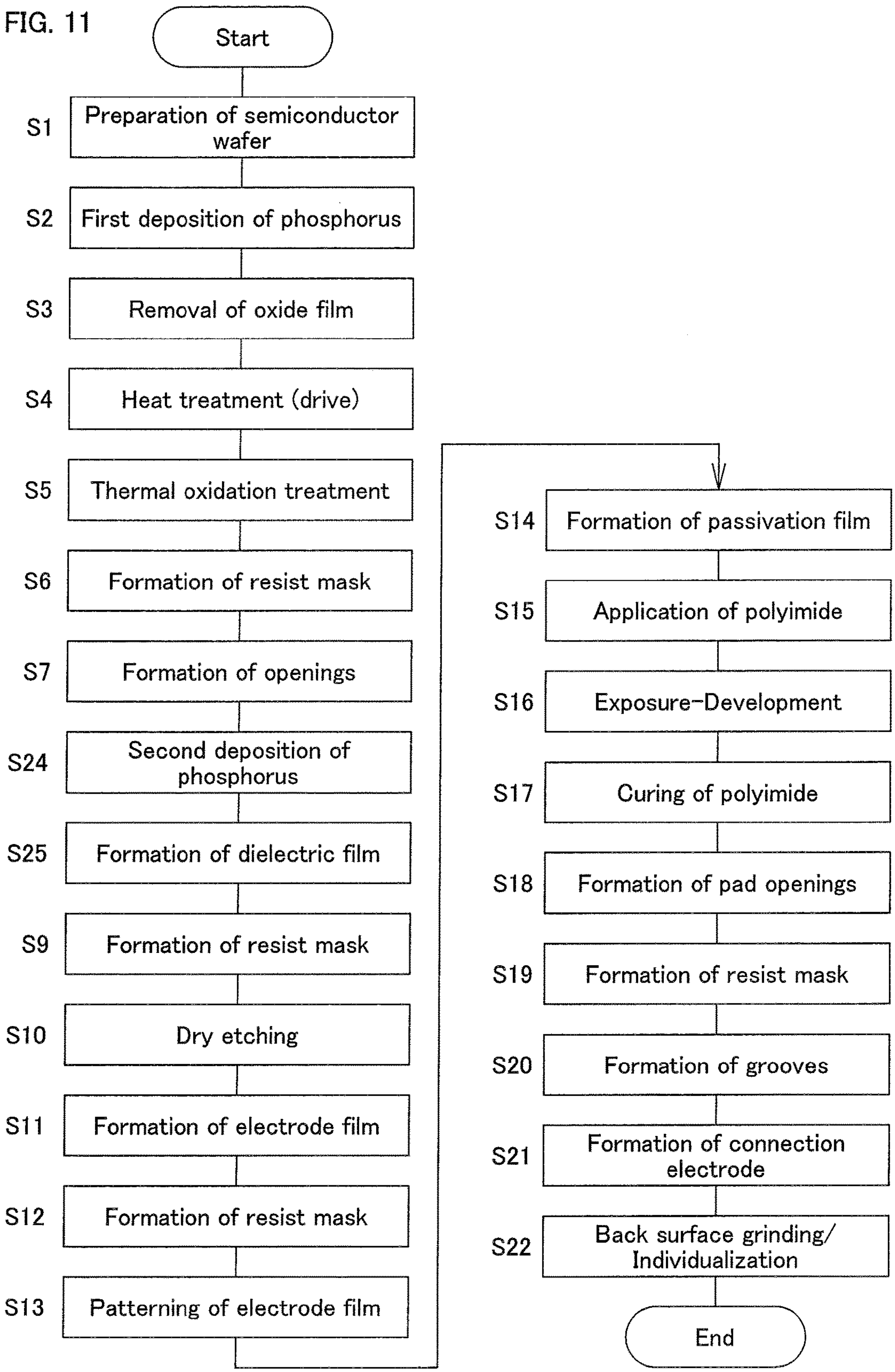
FIG. 11 is a flow chart for explaining the second manufacturing method of the discrete capacitor shown in FIG. 1.
Figure 12A:
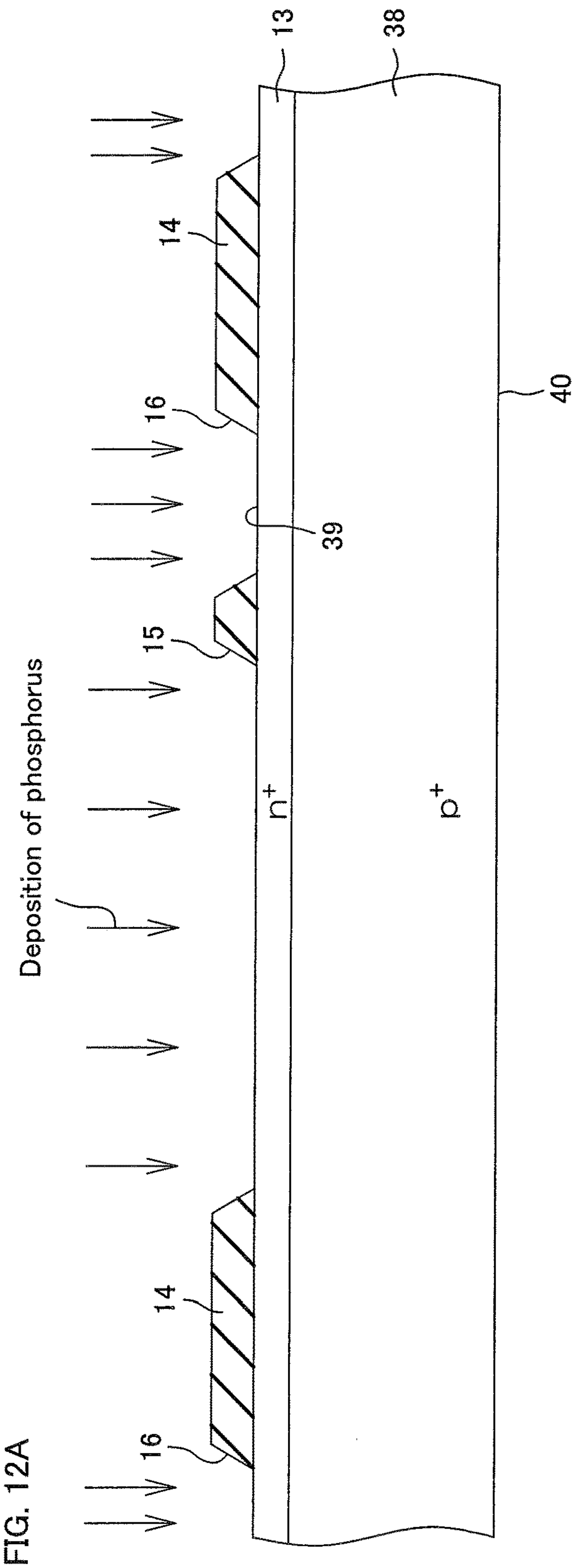
FIG. 12A and FIG. 12B are schematic sectional views for explaining one process of the second manufacturing method of FIG. 11.
Figure 12B:
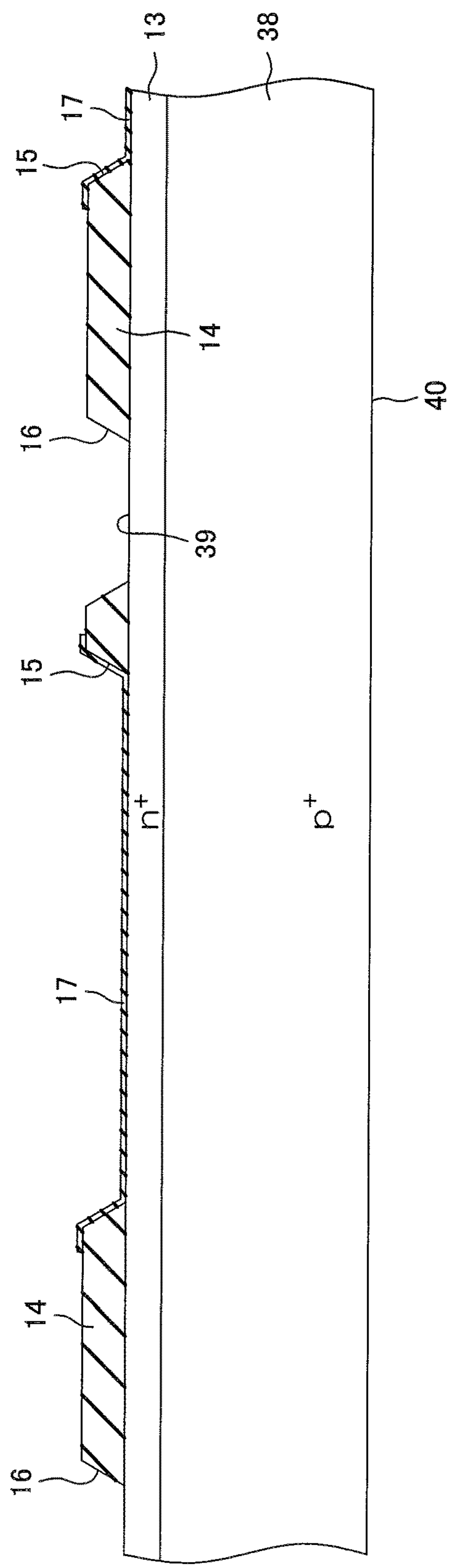

FIG. 11 is a flow chart for explaining the second manufacturing method of the discrete capacitor 1 shown in FIG. 1. FIG. 12A and FIG. 12B are schematic sectional views for explaining one process of the second manufacturing method of FIG. 11.

How the second manufacturing method differs from the foregoing first manufacturing method is that a dielectric film formation step of step S25 is performed in place of the dielectric film formation step of step S8 and that the second phosphorus deposition step of step S24 is added prior to the dielectric film formation step of step S25. The other steps are the same as the foregoing first manufacturing method.

In the second manufacturing method, as shown in FIG. 12A, the silicon oxide film 14 having the first and second openings 15, 16 is formed on the semiconductor wafer 38 through steps S1 to S7, and thereafter, the n-type impurity is further introduced to the front surface portion of the impurity diffusion layer 13 (step S24: Second phosphorus deposition). The introduction of the n-type impurity is performed by the so-called phosphorus deposition step of depositing phosphorus as the n-type impurity on the front surface 39 of the semiconductor wafer 38.

A condition (temperature, time) for the drive-in treatment in the second phosphorus deposition step is such that dry treatment is carried out under a temperature of 900° C. for 10 minutes and wet treatment is carried out under a temperature of 1000° C. for 40 minutes and heat treatment is carried out in an atmosphere of a nitrogen gas under a temperature of 1050° C. for 2 hours. As a result, the impurity diffusion layer 13 is formed on the front surface portion of the semiconductor wafer 38. Subsequently, the oxide film (not shown) having been formed on the front surface 39 of the semiconductor wafer 38 through the second phosphorus deposition step of step S24 is removed by wet etching. The etchant is hydrofluoric acid, for example.

Subsequently, as shown in FIG. 12B, the bottom oxide film 19 and the top oxide film 21 are laminated sequentially and the dielectric film 17 is formed on the entire front surface 39 of the semiconductor wafer 38 (step S25: Formation of dielectric film). The thickness of each oxide film is 240 Å to 260 Å. The thickness of the bottom oxide film 19 (=240 Å to 260 Å) is different from that in the foregoing first manufacturing method (=100 Å to 130 Å). This is because the growth rate of the oxide film on the front surface 39 of the semiconductor wafer 38 is accelerated by the addition of the second phosphorus deposition step even with the thermal oxidation treatment in the same condition.

Then the steps of steps S9 to S22 are performed sequentially, and the discrete capacitor 1 is manufactured.

<Characteristics of Second Manufacturing Method>

Figure 13:
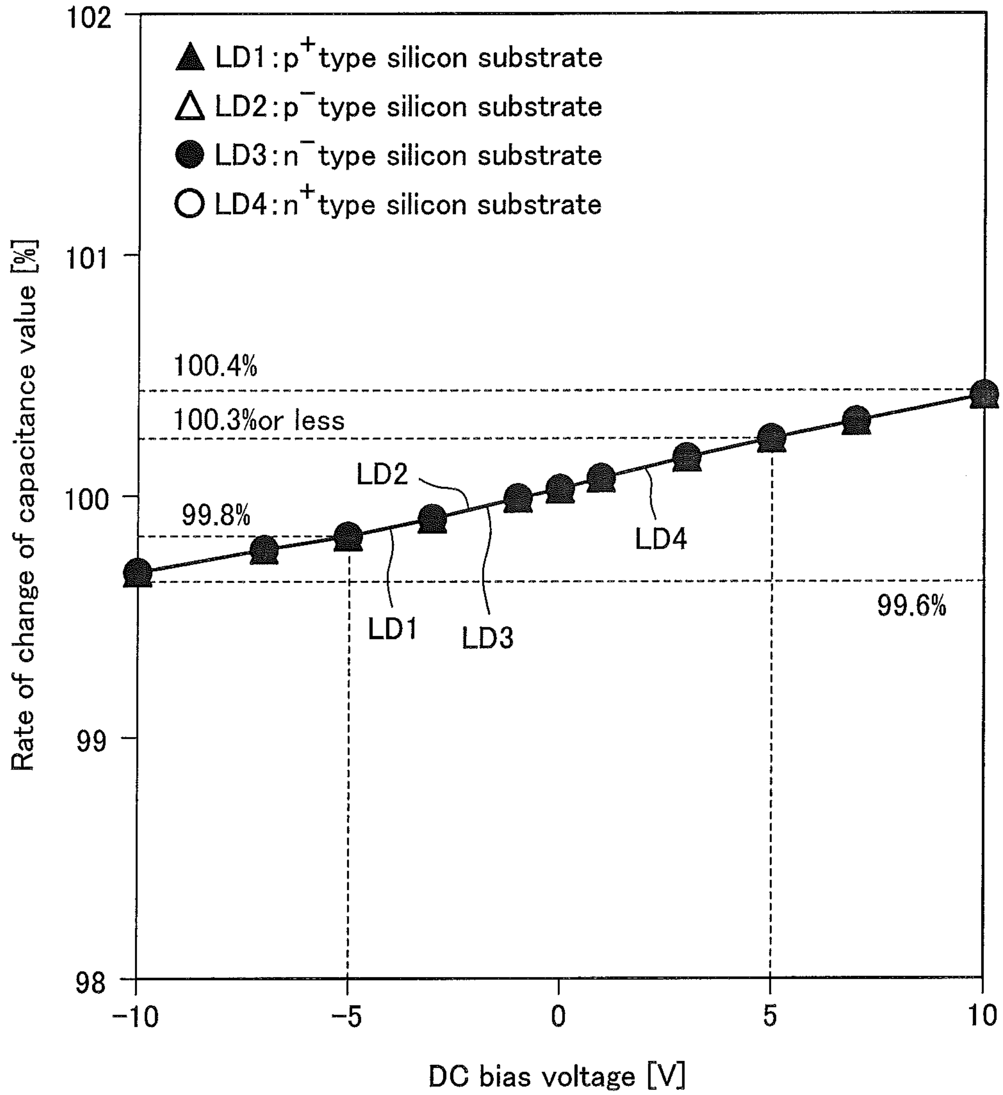
FIG. 13 is a graph showing DC bias vs. rate of change of the capacitance value of a discrete capacitor manufactured through the second manufacturing method shown in FIG. 11.

Subsequently, characteristics of the discrete capacitor 1 manufactured through the second manufacturing method will be described in detail with reference to FIG. 13. FIG. 13 is a graph showing DC bias vs. rate of change of the capacitance value of the discrete capacitor 1 manufactured through the second manufacturing method shown in FIG. 8. In FIG. 13, the horizontal axis shows the DC bias (V) and the vertical axis shows the rate of change of the capacitance value which is defined as 100% when the DC bias is 0V.

Curve LD1 in the graph of FIG. 13 shows characteristics when a $p^+$-type silicon substrate is used, and the capacitance value when the DC bias is 0V is 42.1 pF. Curve LD2 shows characteristics when a $p^-$-type silicon substrate is used, and the capacitance value when the DC bias is 0V is 43.5 pF. Curve LD3 shows characteristics when an $n^-$-type silicon substrate is used, and the capacitance value when the DC bias is 0V is 43.4 pF. Curve LD4 shows characteristics when an $n^+$-type silicon substrate is used, and the capacitance value when the DC bias is 0V is 42.4 pF.

As shown in the graph of FIG. 13, the curves LD1 to LD4 describe approximately the same curve, and the rate of change of the capacitance value in the DC bias range of −10V to +10V achieves between −0.4% and +0.4% inclusive. Further, the rate of change of the capacitance value in the DC bias range of −5V to +5V achieves between −0.2% and +0.3% inclusive.

More specifically, the curves LD1 to LD4 have the range of the absolute value of the rate of change of the capacitance value with respect to the DC bias achieving $|(100.4-99.6)/20|=|0.04|$%/V or less in the DC bias range of −10V to +10V and achieving $|(100.3-99.8)/10|=|0.05|$%/V or less in the DC bias range of −5V to +5V. More specifically, the range of the absolute value is $|(100.2-99.8)/10|=|0.04|$%/V or more, and therefore, the rate of change of the capacitance value is larger than $|0.04|$%/V and less than $|0.05|$%/V.

As above, with the second manufacturing method, the silicon oxide film 14 is formed at relatively low temperature (950° C. to 1000° C.) during the thermal oxidation treatment of step S5. As a result, a reduction in impurity concentration on the front surface portion of the impurity diffusion layer 13 can be suppressed.

Furthermore, with the second manufacturing method, the second phosphorus deposition step of step S24 is performed prior to the dielectric film formation step of step S25, in addition to the first phosphorus deposition step of step S2. Therefore, compensation for the impurity is made on the front surface portion of the impurity diffusion layer 13 by the second phosphorus deposition step of step S24, so that a reduction in impurity concentration on the front surface portion of the impurity diffusion layer 13 can be suppressed even if there is a factor of reducing the impurity concentration on the front surface portion of the impurity diffusion layer 13 before this second phosphorus deposition step. As a result, the discrete capacitor 1 capable of realizing further excellent DC bias characteristics can be provided as shown in FIG. 13.

As a matter of course, even when the silicon oxide film 14 is formed at relatively high temperature (for example, 1000° C. or more) during the thermal oxidation treatment of step S5, a reduction in impurity concentration on the front surface portion of the impurity diffusion layer 13 can be suppressed if compensation for the impurity is made on the front surface portion of the impurity diffusion layer 13 by performing the second phosphorus deposition step of step S24. As a result, the discrete capacitor 1 having excellent DC bias characteristics can be provided.

<Concentration in Impurity Diffusion Region>

Subsequently, the concentration of the impurity diffusion layer 13 manufactured in the first and second manufacturing methods will be described with reference to FIG. 14 and FIG. 15.

Figure 14:
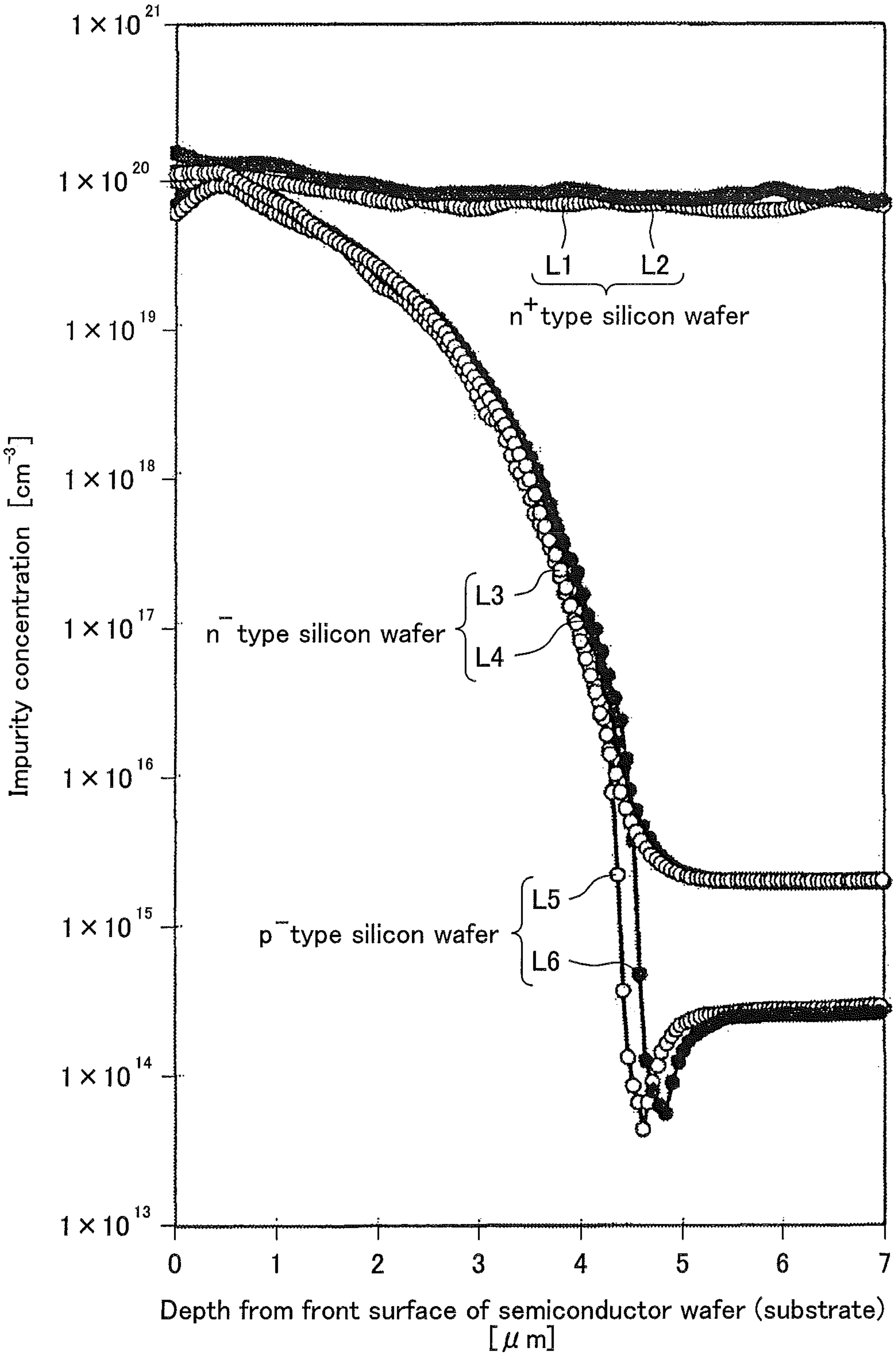
FIG. 14 is a graph for explaining a concentration profile of a semiconductor wafer (substrate).

FIG. 14 is a graph for explaining a concentration profile of the semiconductor wafer 38 (substrate 3). FIG. 14 is the one that the impurity concentration according to the depth in the semiconductor wafer 38 (substrate 3) is measured by a spreading resistance analysis (SRA) after the heat treatment (drive) step of step S4 and then graphed. Regarding the concentration profile of the $p^+$-type silicon wafer (substrate), an illustration and description thereof are omitted.

Curves L1 and L2 show concentration profiles of $n^+$-type silicon wafers (substrates). The curve L1 denotes a semiconductor wafer 38 according to the first manufacturing method shown in FIG. 5, and the curve L2 denotes a semiconductor wafer 38 (substrate 3) according to the second manufacturing method shown in FIG. 11.

As shown in the curves L1 and L2, when the semiconductor wafers 38 (substrates 3) are $n^+$-type silicon wafers (substrates), these semiconductor wafers 38 (substrates 3) have substantially the same concentration profile from the front surface toward the thickness direction.

Curves L3 and L4 show concentration profiles of $n^-$-type silicon wafers (substrates). The curve L3 denotes a semiconductor wafer 38 according to the first manufacturing method shown in FIG. 5, and the curve L4 denotes a semiconductor wafer 38 (substrate 3) according to the second manufacturing method shown in FIG. 11.

As shown in the curves L3 and L4, it is seen that when the semiconductor wafers 38 (substrates 3) are $n^-$-type silicon wafers (substrates), these semiconductor wafers 38 (substrate 3) have an impurity concentration gradient formed from the front surface to a position on the order of 4 μm to 5 μm in the thickness direction. That is, the impurity diffusion layer 13 spreads to this depth in the case of the $n^-$-type silicon substrates.

Curves L5 and L6 show concentration profiles of $p^-$-type silicon wafers (substrates). The curve L5 denotes a semiconductor wafer 38 (substrate 3) according to the first manufacturing method shown in FIG. 5, and the curve L6 denotes a semiconductor wafer 38 (substrate 3) according to the second manufacturing method shown in FIG. 11.

As shown in the curves L5 and L6, it is seen that when the semiconductor wafers 38 (substrates 3) are $p^-$-type silicon wafers (substrates), these semiconductor wafers 38 (substrates 3) have an impurity concentration gradient formed from the front surface to a position on the order of 4 μm to 5 μm in the thickness direction. In the case of the $p^-$-type silicon wafers (substrates), the larger impurity concentration gradient is formed by the spread of the impurity diffusion layer 13 as compared to the $n^-$-type silicon wafers (substrates). Further, an impurity concentration gradient much larger than that of the $p^-$-type silicon wafer (substrate) is formed in the case of a $p^+$-type silicon wafer (substrate).

Figure 15:
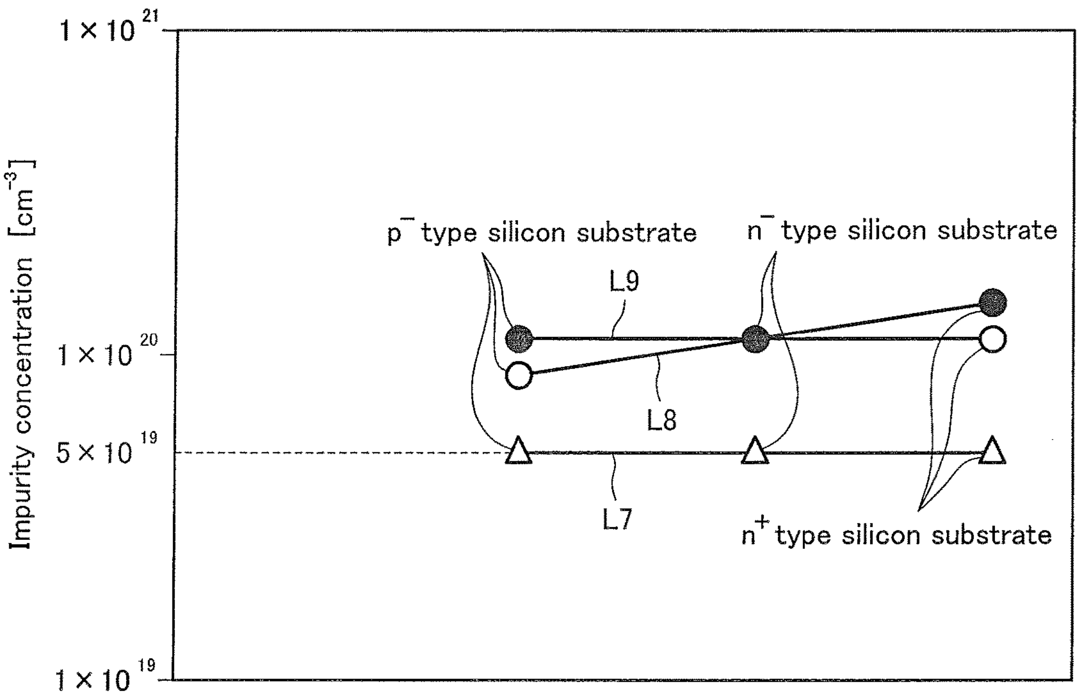
FIG. 15 is a graph for explaining an impurity concentration on a front surface portion of an impurity diffusion layer shown in FIG. 14.

FIG. 15 is a graph for explaining the impurity concentration on the front surface portion of the impurity diffusion layer 13 shown in FIG. 14.

Straight line L7 in FIG. 15 shows the impurity concentration on the front surface portion of the impurity diffusion layer 13 of the discrete capacitors according to the one reference example and the another reference example described in FIG. 8 and FIG. 9. On the other hand, broken line L8 shows the impurity concentration on the front surface portion of the impurity diffusion layer 13 of the discrete capacitor 1 having undergone the first manufacturing method shown in FIG. 5. Broken line L9 shows the impurity concentration on the front surface portion of the impurity diffusion layer 13 of the discrete capacitor 1 having undergone the second manufacturing method shown in FIG. 10. In FIG. 15, impurity concentrations of the $p^-$-type silicon wafer (substrate), the $n^-$-type silicon wafer (substrate), and the $n^+$-type silicon wafer (substrate) are shown in order from the left side of the sheet.

As shown in the straight line L7, the impurity concentration on the front surface portion of the impurity diffusion layer 13 of the discrete capacitors according to the one reference example and another reference example is $5\times10^{19}$ $cm^{-3}$. On the other hand, the impurity concentrations on the front surface portions of the impurity diffusion layers 13 of the discrete capacitors 1 having undergone the first and second manufacturing methods both achieve $5\times10^{19}$ $cm^{-3}$ to $2\times10^{20}$ $cm^{-3}$ as shown in the broken lines L8 and L9. In particular, as shown in the broken line L9, it is seen that the second manufacturing method added with the second phosphorus deposition step would be able to achieve an impurity concentration of $1\times10^{20}$ $cm^{-3}$ to $2\times10^{20}$ $cm^{-3}$.

Second Preferred Embodiment

Figure 16:
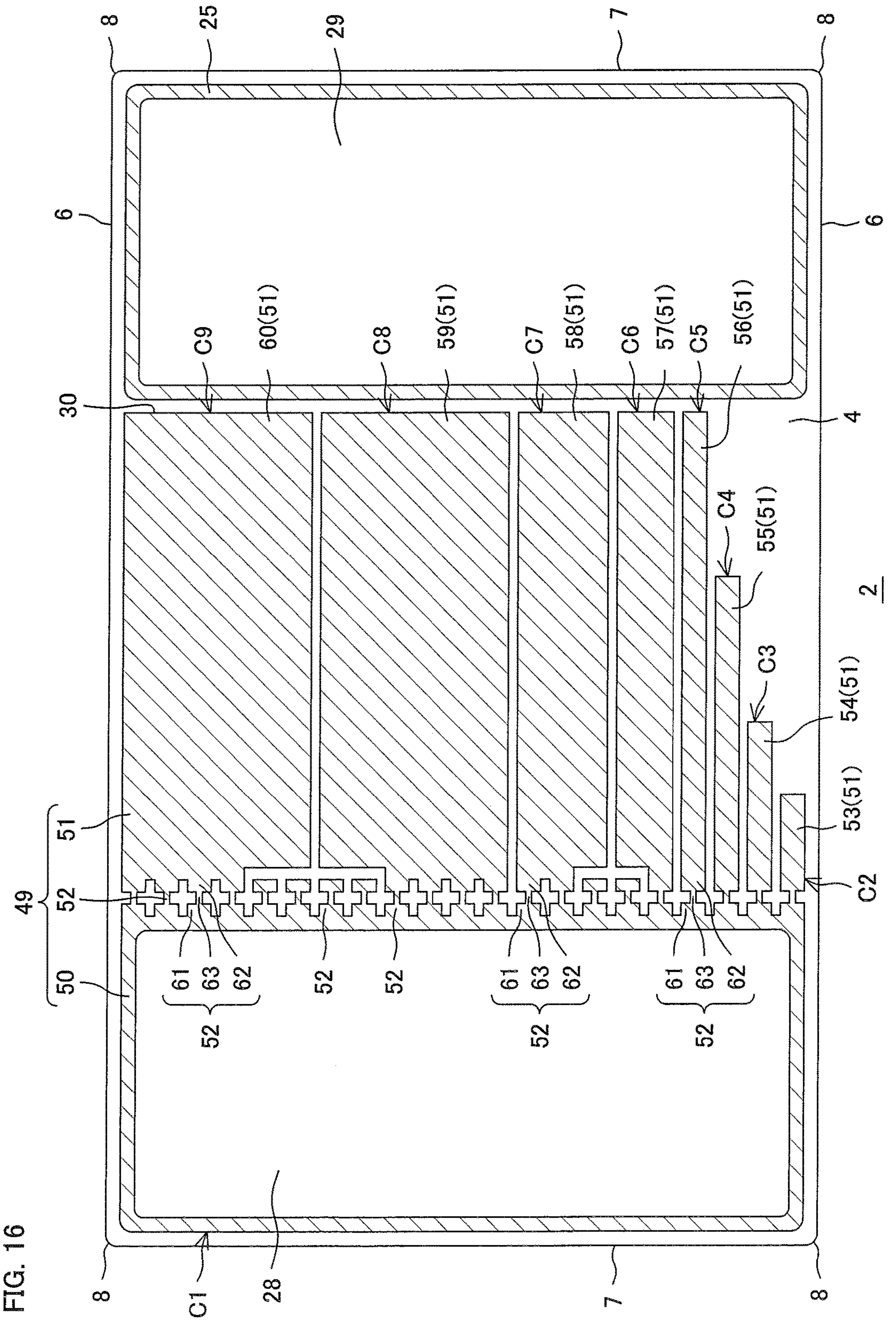
FIG. 16 is a schematic plan view of a discrete capacitor according to the second preferred embodiment of the present invention.

FIG. 16 is a schematic plan view of a discrete capacitor 2 according to the second preferred embodiment of the present invention.

How the discrete capacitor 2 differs from the discrete capacitor 1 according to the foregoing first preferred embodiment is that an upper electrode film 49 is formed instead of the upper electrode film 22. The other configurations are the same as those of the foregoing discrete capacitor 1. Parts respectively corresponding to the portions shown in FIG. 2 are given the same reference symbols in FIG. 16, and their descriptions are omitted.

As shown in FIG. 16, the upper electrode film 49 has a pad region 50, a base region 51 electrically connected to the pad region 50, and a plurality of fuses 52 formed along one long side (the long side at the inner region side of the element forming surface 4) of the pad region 50 so as to connect the pad region 50 and the base region 51.

The pad region 50 is formed in a rectangular shape along the short side 7 of the substrate 3 at one end portion side of the substrate 3, and is opposed to the impurity diffusion layer 13 with the foregoing dielectric film 17 (ONO film) therebetween. A first connection electrode 28 is connected to the pad region 50.

The base region 51 is divided (separated) into a plurality of electrode film parts 53 to 60. The electrode film parts 53 to 60 are each formed in a rectangular shape and extend in a strip shape from the fuses 52 toward the contact electrode film 25. The electrode film parts 56 to 60 are formed extending over the range from an edge of the pad region 50 to an edge of the contact electrode film 25 via the fuses 52, and the electrode film parts 53 to 55 are formed shorter than them. In other words, the plurality of electrode film parts 53 to 60 are opposed to the impurity diffusion layer 13 with the dielectric film 17 therebetween, with different kinds of facing areas.

More specifically, the facing areas of the electrode film parts 53 to 60 with respect to the impurity diffusion layer 13 may be determined to be 1:2:4:8:16:32:64:64. That is, the plurality of electrode film parts 53 to 60 have the facing areas set so as to form a geometric progression with a common ratio of 2. More specifically, the electrode film parts 53 to 56 are formed in the strip shape where the width in the short direction along the short side 7 of the substrate 3 is equal and the ratio in length is set to be 1:2:4:8. The electrode film parts 56 to 60 are formed in the strip shape where the length in the longitudinal direction along the long side 6 of the substrate 3 is equal and the ratio in width is set to be 1:2:4:8:8. It is a matter of course that such geometric progression may have a common ratio other than 2. Further, the base region 51 may be divided into electrode film parts more than the electrode film parts 53 to 60 in number.

In this manner, a plurality of capacitor elements C1 to C9 having mutually different capacitance values are formed by respective electrode film parts 53 to 60 and the impurity diffusion layer 13 opposed thereto with the dielectric film 17 therebetween. The capacitor element C1 is formed by the pad region 50 opposing the impurity diffusion layer 13 with the dielectric film 17 therebetween. On the other hand, the capacitor elements C2 to C9 are formed by the electrode film parts 53 to 60 opposing the impurity diffusion layer 13 with the dielectric film 17 therebetween.

The plurality of electrode film parts 53 to 60 are integrally formed with one or more fuses 52 and electrically connected to the first connection electrode 28 via the fuses 52 and the pad region 50. The electrode film parts 53 to 56 with relatively small areas are connected to the pad region 50 by a single fuse 52, and the electrode film parts 57 to 60 with relatively large areas are connected to the pad region 50 via a plurality of fuses 52. All of the fuses 52 need not be used, and a part of the fuses 52 is not in use in this preferred embodiment.

The fuse 52 includes a first wide portion 61 for connection with the pad region 50, a second wide portion 62 for connection with the electrode film part 53 to 60, and a narrow portion 63 connecting between the first and second wide portions 61, 62. The narrow portion 63 is arranged to be cut off (melt-cut) by laser light. As a result, an unnecessary electrode film part 53 to 60 of the electrode film parts 53 to 60 can be electrically separated from the first and second connection electrodes 28, 29 by the cutting of the fuse 52.

Figure 17:
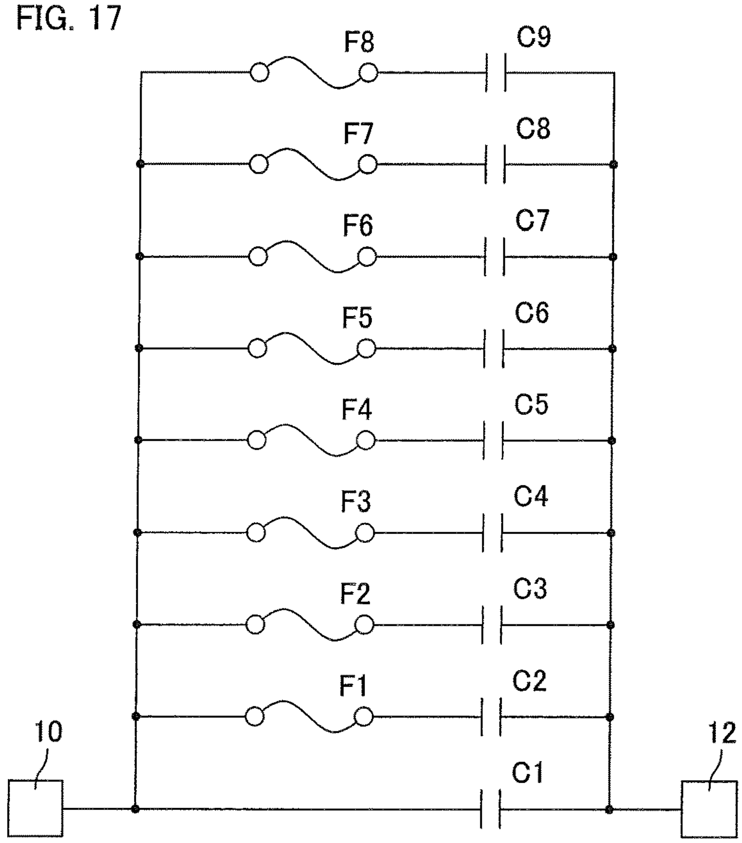
FIG. 17 is an electric circuit diagram of the discrete capacitor shown in FIG. 16.

FIG. 17 is an electric circuit diagram of the discrete capacitor 2 shown in FIG. 16.

As shown in FIG. 17, a plurality of capacitor elements C1 to C9 are connected in parallel between the first and second connection electrodes 28, 29. Fuses F1 to F8 each composed of one or more fuses 52 are interposed in series between each of the capacitor elements C2 to C9 and the first connection electrode 28. On the other hand, no fuse is interposed between the capacitor element C1 and the first connection electrode 28, and the capacitor element C1 is directly connected to the first connection electrode 28.

The capacitance value of the discrete capacitor 2 is equal to the sum total of the capacitance values of the capacitor elements C1 to C9 when the fuses F1 to F8 are all connected. When one or more than two fuses 52 selected from among the plurality of fuses F1 to F8 are cut, the capacitor element(s) corresponding to the cut fuse(s) 52 are disconnected and the capacitance value of the discrete capacitor 2 is reduced by the capacitance value(s) of the disconnected capacitor element(s). When all of the fuses F1 to F8 are cut, the capacitance value of the discrete capacitor 2 becomes the capacitance value of the capacitor element C1.

Accordingly, the capacitance value between the impurity diffusion layer 13 and the pad region 50 (the total capacitance value of the capacitance elements C1 to C9) is measured, and thereafter, one or a plurality of fuses 52 properly selected from among the fuses F1 to F8 according to a desired capacitance value are melt-cut by laser light. By doing this, an adjustment to the desired capacitance value (laser trimming) can be carried out. In particular, when the capacitance values of the capacitor elements C2 to C9 are set to form a geometric progression with a common ratio of 2, a fine adjustment of adjusting to the target capacitance value with a precision corresponding to the capacitance value of the capacitor element C2, which is the smallest capacitance value (the value of the first term of the geometric progression), is possible. Further, properly selecting the fuse(s) 52 to be cut from among the fuses F1 to F8 allows the discrete capacitor 2 with a given capacitance value to be provided.

<Manufacturing Method of Discrete Capacitor 2>

Figure 18:
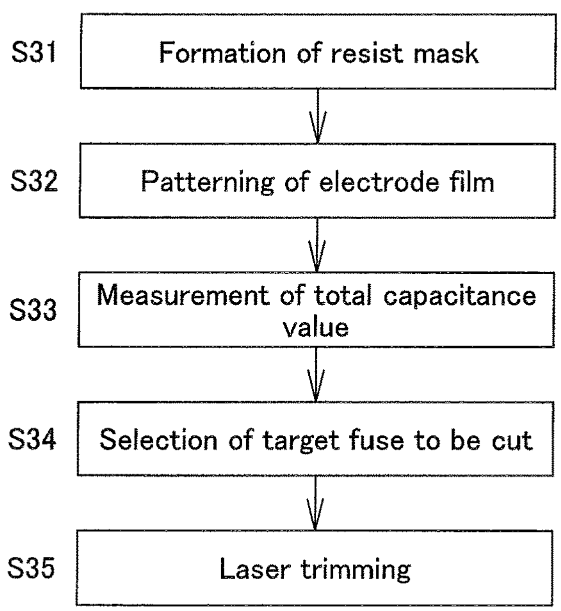
FIG. 18 is a flow chart for explaining a manufacturing method of the discrete capacitor shown in FIG. 16.

FIG. 18 is a flow chart for explaining the manufacturing method of the discrete capacitor 2 shown in FIG. 16.

To manufacture the discrete capacitor 2, steps of steps S31 to S35 shown in FIG. 18 only need to be performed instead of the resist mask formation step of step S12 and the electrode film patterning step of step S13 shown in FIG. 5 and FIG. 11.

That is, after the electrode film is formed at step S11, a resist mask corresponding to the final shape of the upper electrode film 49 is formed on the front surface of the electrode film (step S31: Formation of resist mask). The electrode film is shaped to the upper electrode film 49 and the contact electrode film 25 by etching through the resist mask (step S32: Patterning of electrode film). The etching for patterning the electrode film may be performed by wet etching using an etchant such as phosphoric acid or may be performed by reactive ion etching.

Subsequently, an inspection probe is pressed against the upper electrode film 49 and the contact electrode film 25 to measure the total capacitance value of the plurality of capacitor elements C1 to C9 (step S33: Measurement of total capacitance value). Based on the measured total capacitance value, a capacitance element to be disconnected, that is, a fuse 52 to be cut is selected according to the intended capacitance value of the discrete capacitor 2 (step S34: Selection of target fuse to be cut).

Subsequently, a cover film composed of a nitride film, for example, is formed on the entire surface of the semiconductor wafer 38. The formation of the cover film may be performed by a plasma CVD method. The cover film covers the patterned upper electrode film 49 and covers the dielectric film 17 in a region where the upper electrode film 49 is not formed. The cover film covers the fuses 52 in the fuse 52 region.

Laser trimming for melt-cutting the fuse 52 is performed from this state (step S35: Laser trimming). That is, laser light is applied to the fuse 52 selected according to the measurement result of the total capacitance value of the capacitor, and the narrow portion 63 of that fuse 52 is melt-cut. As a result, the corresponding capacitor element is disconnected from the pad region 50. When the laser light is applied to the fuse 52, energy of the laser light is accumulated in the vicinity of the fuse 52 by the action of the cover film, whereby the fuse 52 is melt-cut.

With the discrete capacitor 2, as described above, the capacitor element C1 directly connected to the first connection electrode 28 is provided directly below the first connection electrode 28 as shown in FIG. 16 and FIG. 17. Further, the plurality of capacitor elements C2 to C9 disconnectable by the fuses F1 to F8 are provided between the first and second connection electrodes 28, 29. The capacitor elements C2 to C9 include a plurality of capacitor elements having different capacitance values, more specifically, a plurality of capacitor elements having capacitance values set to form a geometric progression. As a result, the discrete capacitor 2 can be provided that is capable of accommodating different types of capacitance values without changing the design and capable of accurately adjusting to the desired capacitance value by selecting one or a plurality of fuses 52 from among the fuses F1 to F8 and melt-cutting the same by laser light.

Modification

In the foregoing first and second preferred embodiments, the example of the dielectric film 17 composed of the relatively thin ONO film (390 Å to 460 Å, the oxide film in the second manufacturing method) is described. However, the dielectric film 17 may only be composed of a single oxide film ($SiO_2$ film) with a thickness of 800 Å to 3000 Å. With the dielectric film 17 having such thickness, the characteristics shown in FIG. 19 can be obtained.

Figure 19:
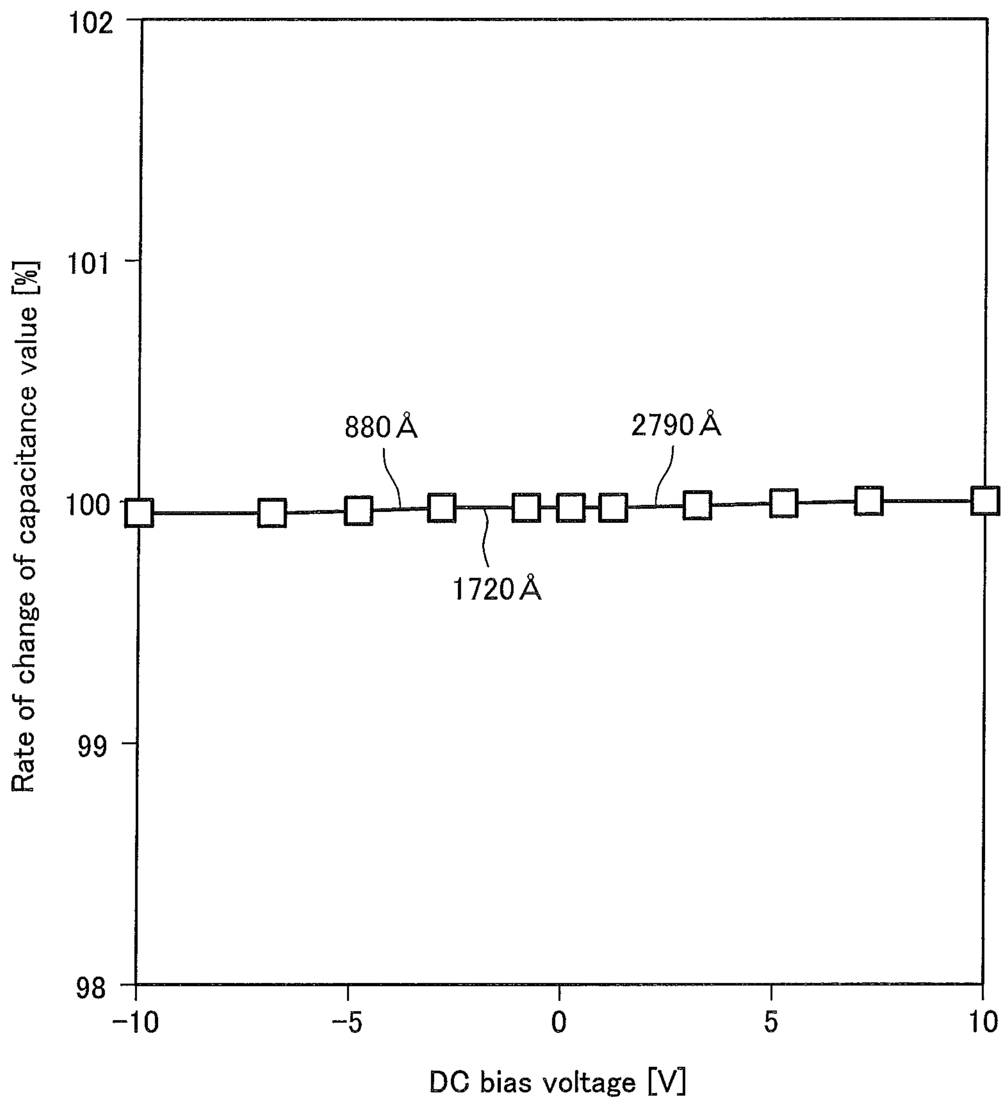
FIG. 19 is a graph showing DC bias vs. rate of change of the capacitance value of a discrete capacitor according to a modification.

FIG. 19 is a graph showing DC bias vs. rate of change of the capacitance value of the discrete capacitor according to a modification. Three characteristics of 880 Å, 1720 Å, and 2790 Å in thickness of the dielectric film 17 are shown in FIG. 19. The semiconductor wafer 38 (substrate 3) is an $n^+$-type silicon wafer (substrate) in all cases.

As understood from the graph of FIG. 19, the rate of change of the capacitance value with respect to DC bias can be approximated to 0% by composing the dielectric film 17 only with the single oxide film having a thickness of 800 Å to 3000 Å. In this instance, the capacitance value of the discrete capacitor is 4.4 pF when the thickness of the dielectric film 17 is 2790 Å, and 6.62 pF when the thickness of the dielectric film 17 is 1720 Å, and 11.9 pF when the thickness of the dielectric film 17 is 880 Å. From the above, the small discrete capacitor excellent in the characteristics of the rate of change of the capacitance value with respect to DC bias can be provided.

First Reference Example

Figure 20:
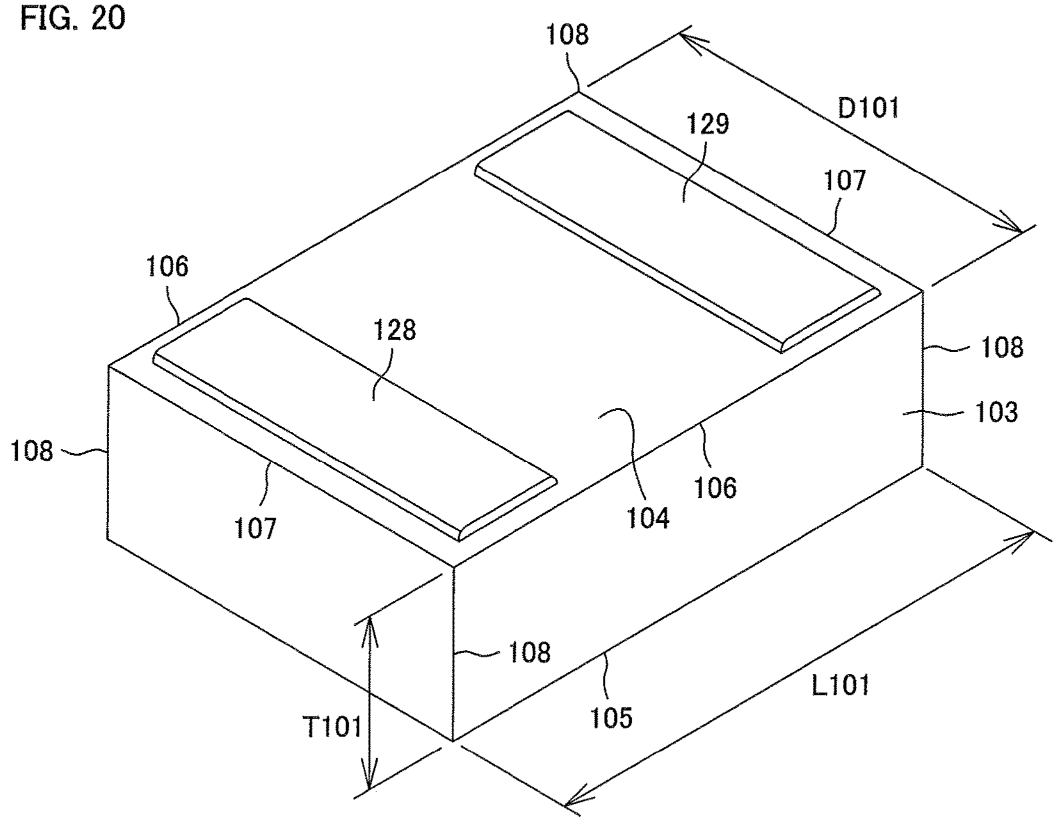
FIG. 20 is a schematic perspective view of a discrete capacitor according to the first reference example.
Figure 21:
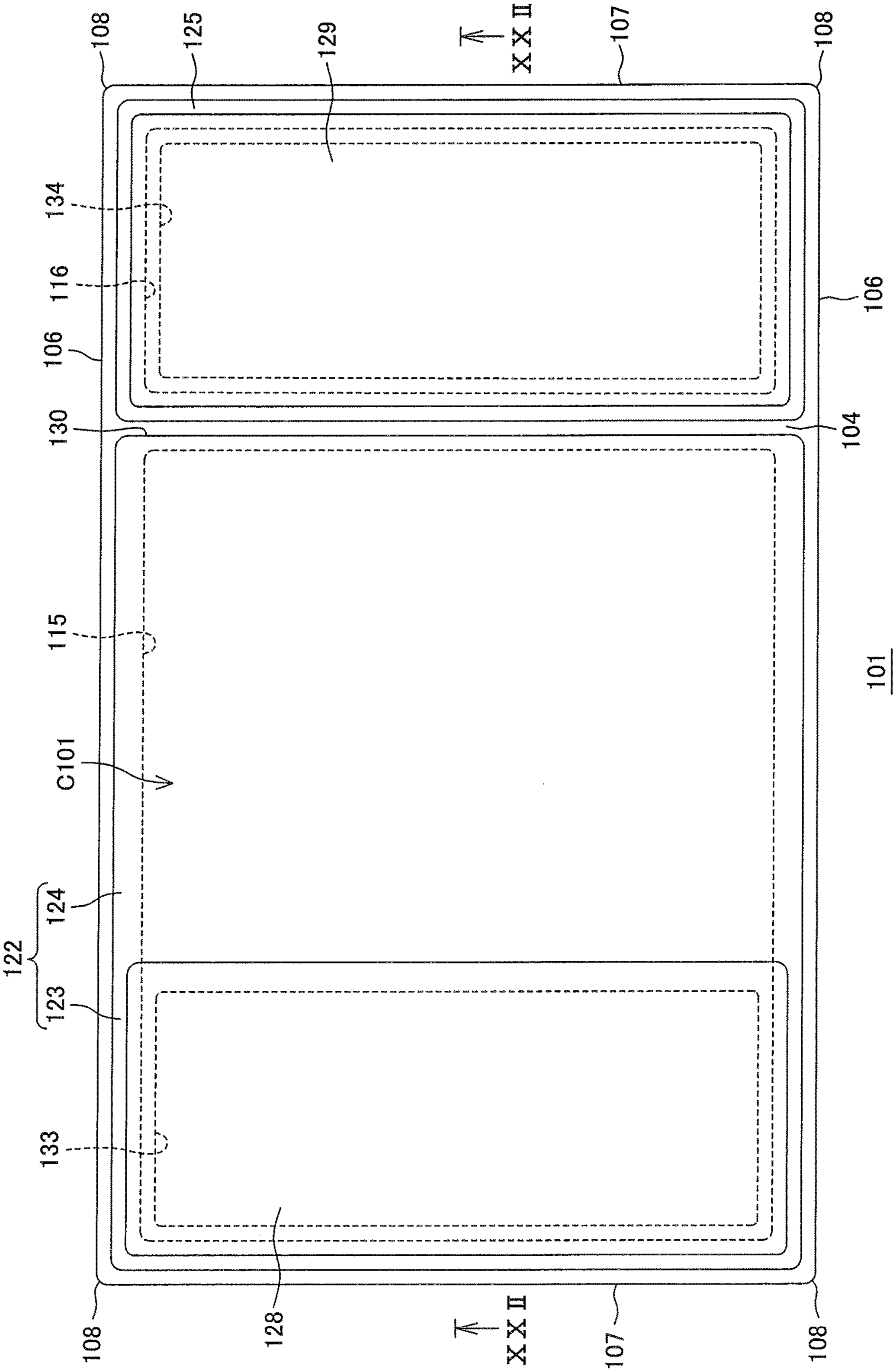
FIG. 21 is a schematic plan view of the discrete capacitor shown in FIG. 20.
Figure 22:
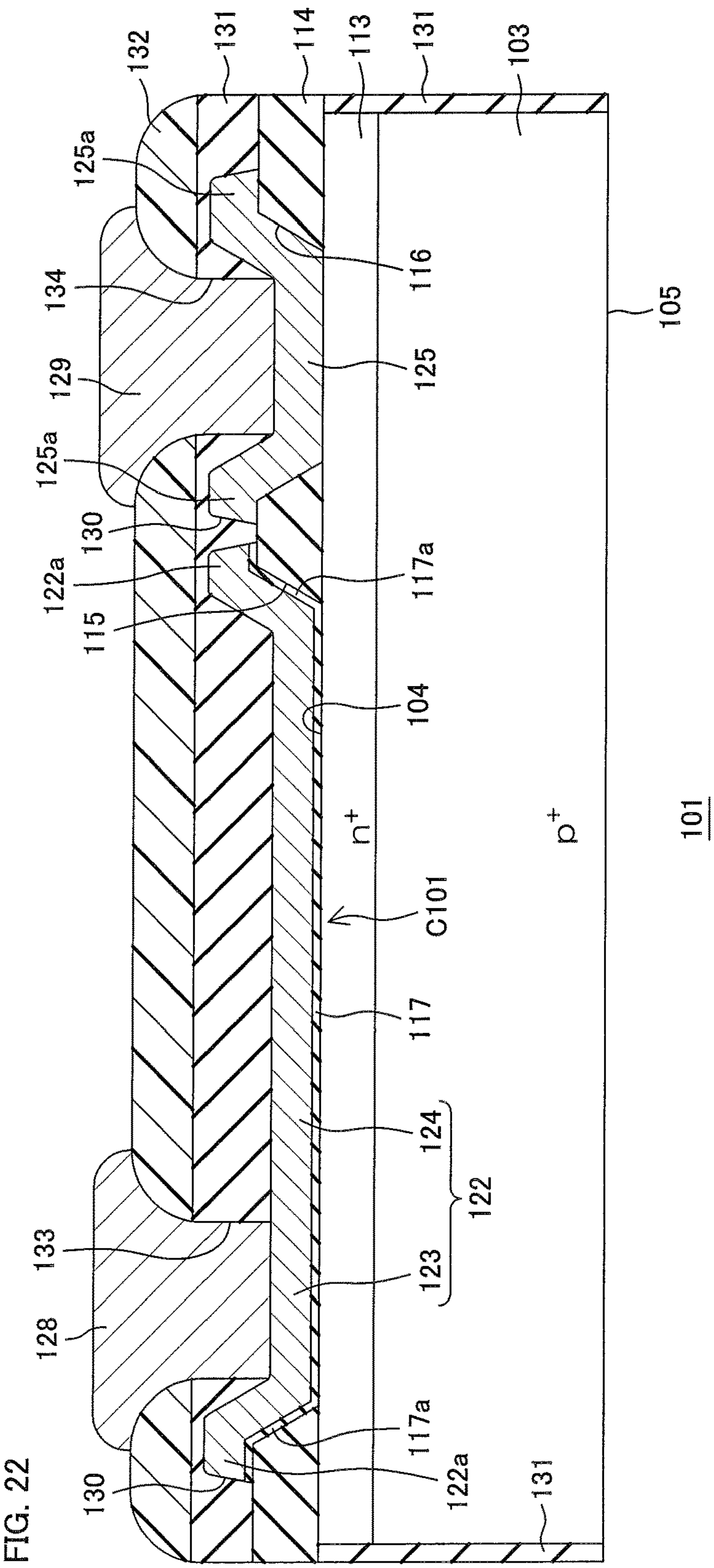
FIG. 22 is a sectional view seen from the line XXII-XXII shown in FIG. 21.

FIG. 20 is a schematic perspective view of a discrete capacitor 101 according to the first reference example. FIG. 21 is a schematic plan view of the discrete capacitor 101 shown in FIG. 20. FIG. 22 is a sectional view seen from the line XXII-XXII shown in FIG. 21.

The discrete capacitor 101 is a micro chip component and includes a substrate 103 constituting a main body portion. The substrate 103 is a semiconductor substrate. An $n^-$-type silicon substrate, an $n^+$-type silicon substrate, a $p^-$-type silicon substrate, or a $p^+$-type silicon substrate can be employed as the substrate 103. In the present reference example, an example of employing a $p^+$-type silicon substrate as the substrate 103 will be described. As for the resistance value, it is preferred that the resistance value of the $n^-$-type silicon substrate is 2Ω to 3Ω, and that of the $n^+$-type silicon substrate is 1.3 mΩ, and that of the $p^-$-type silicon substrate is 25Ω to 30Ω, and that of the $p^+$-type silicon substrate is 3 mΩ.

The substrate 103 is formed in a substantially rectangular parallelepiped shape having one end portion and the other end portion. The planar shape of the substrate 103 is such that the length L101 of a long side 106 along the longitudinal direction is 0.3 mm to 0.6 mm, and the length D101 of a short side 107 along the short direction is 0.15 mm to 0.3 mm. The thickness T101 of the substrate 103 is 0.1 mm, for example. That is, a so-called a 0603 chip, a 0402 chip, or a 03015 chip is applied as the substrate 103.

Each corner portion 108 of the substrate 103 may have a round shape chamfered in a plan view. With the round shape, a structure capable of suppressing chipping during the manufacturing process or at the time of mounting is obtained. A capacitor is formed at an inner portion of the front surface of the substrate 103. Hereinafter, the front surface on which the capacitor is formed is referred to as an element forming surface 104, and a surface on the opposite side is referred to as a back surface 105.

An $n^+$-type impurity diffusion layer 113 is formed on a front surface portion of the substrate 103. In the present reference example, the impurity diffusion layer 113 is formed on the entire front surface portion of the substrate 103. The impurity diffusion layer 113 is a region to which phosphorus (P) as an example of an n-type impurity is introduced, for example. In particular, the impurity concentration on the front surface portion of the impurity diffusion layer 113 is not less than $5\times10^{19}$ $cm^{-3}$ (more specifically, $5\times10^{19}$ $cm^{-3}$ to $2\times10^{20}$ $cm^{-3}$). The front surface portion of the impurity diffusion layer 113 refers to the range up to a depth on the order of 0 μm to 3 μm (more specifically, on the order of 1 μm) in the depth direction from the element forming surface 104 of the substrate 103.

Where the substrate 103 is an $n^+$-type silicon substrate, the $n^+$-type impurity diffusion layer 113 preferably has an impurity concentration equal to that of the $n^+$-type silicon substrate. That is, in this instance, the $n^+$-type silicon substrate and the $n^+$-type impurity diffusion layer 113 apparently constitute a single n-type semiconductor substrate. At this time, the n-type semiconductor substrate (the $n^+$-type silicon substrate) preferably has the same impurity concentration profile (for example, $1\times10^{20}$ $cm^{-3}$) from the front surface portion thereof toward the depth direction.

A silicon oxide film 114 as an example of a front surface insulating film is formed on the element forming surface 104 of the substrate 103. The thickness of the silicon oxide film 114 is, for example, 8000 Å to 12000 Å (10000 Å in the present reference example). The silicon oxide film 114 has a first opening 115 to selectively expose the impurity diffusion layer 113 and a second opening 116 formed spaced apart from the first opening 115.

The first opening 115 is formed in a rectangular shape in a plan view so as to extend from one end portion side of the substrate 103 to the other end portion side of the substrate 103 along the long side 106 and the short side 107 of the substrate 103 (see a broken line portion of FIG. 21). On the other hand, the second opening 116 is formed in a rectangular shape in a plan view along the short side 107 of the substrate 103 on the other end portion side of the substrate 103 (see a broken line portion of FIG. 21).

A dielectric film 117, an upper electrode film 122 as an example of the first electrode, and a contact electrode film 125 as an example of the second electrode are formed on the substrate 103.

The dielectric film 117 is in contact with a front surface of the impurity diffusion layer 113 exposed from the first opening 115, and is formed in a quadrangular shape in a plan view so as to extend from one end portion side of the substrate 103 toward the other end portion side. More specifically, the dielectric film 117 is formed along the front surface of the impurity diffusion layer 113 to a lateral portion of the silicon oxide film 114 so as to cover the impurity diffusion layer 113, and includes an overlapping portion 117*a* covering the lateral portion and part of the upper portion of the silicon oxide film 114. The dielectric film 117 in the present reference example has a laminated structure in which a plurality of insulating films are laminated.

Figure 23:
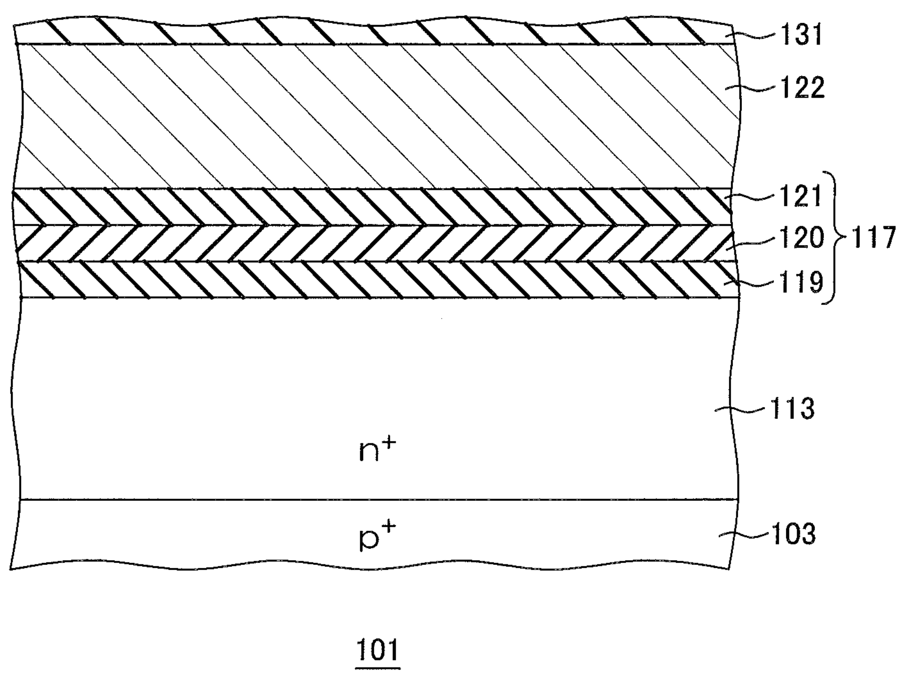
FIG. 23 is a sectional view in which a region including a dielectric film shown in FIG. 22 is enlarged.

FIG. 23 is a sectional view in which a region including the dielectric film 117 shown in FIG. 22 is enlarged. As shown in FIG. 23, the dielectric film 117 is an ONO film formed by laminating in the order of a bottom oxide film 119, a nitride film 120, and a top oxide film 121. The bottom oxide film 119 and the top oxide film 121 are composed of a $SiO_2$ film and the nitride film 120 is composed of a SiN film.

The upper electrode film 122 is formed following the planar shape of the dielectric film 117. That is, the upper electrode film 122 is opposed to the impurity diffusion layer 113 with the dielectric film 117 therebetween, and includes an overlapping portion 122*a* covering the lateral portion and part of the upper portion of the silicon oxide film 114. More specifically, the upper electrode film 122 has a pad region 123 and a base region 124 opposed to the impurity diffusion layer 113 with the dielectric film 117 therebetween.

The pad region 123 and the base region 124 are arranged in order of the pad region 123 and the base region 124 with respect to the contact electrode film 125. That is, the base region 124 is arranged between the pad region 123 and the contact electrode film 125 along the front surface of the substrate 103. As a result, interference of the electrodes between the pad region 123 and the contact electrode film 125 can be suppressed along the front surface direction of the substrate 103.

In the present reference example, a single capacitor element C101 is constructed of the impurity diffusion layer 113 serving as the lower electrode, the dielectric film 117, and the upper electrode film 122 in which the pad region 123 and the base region 124 are integrated.

The contact electrode film 125 is directly connected, via the second opening 116, with the impurity diffusion layer 113 extending to a region directly below the second opening 116. The contact electrode film 125 is formed along the front surface of the impurity diffusion layer 113 so as to cover the impurity diffusion layer 113, and includes an overlapping portion 125*a* covering the lateral portion and part of the upper portion of the silicon oxide film 114.

The upper electrode film 122 and the contact electrode film 125 are formed of the same conductive material. For example, the conductive material such as Al, AlCu, AlSiCu, etc., can be exemplified. The upper electrode film 122 and the contact electrode film 125 are electrically separated on the silicon oxide film 114 by slits 130 rimming each peripheral edge portion of the upper electrode film 122 and contact electrode film 125.

On the silicon oxide film 114, a passivation film 131 and a resin film 132 are formed in this order so as to cover the upper electrode film 122 and the contact electrode film 125. The passivation film 131 is also formed on lateral surfaces of the substrate 103. The passivation film 131 contains, for example, silicon nitride or USG (Undoped Silicate Glass), and the resin film 132 is composed of polyimide, for example. The passivation film 131 and the resin film 132 constitute protective films and suppress or prevent permeation of moisture into the upper electrode film 122 and the contact electrode film 125, and the element forming surface 104, and also absorb external impact and contribute to an improvement in the durability of the discrete capacitor 101.

Pad openings 133, 134 to selectively expose the pad region 123 of the upper electrode film 122 and the contact electrode film 125 are formed on the passivation film 131 and the resin film 132. First and second connection electrodes 128, 129 are formed so as to backfill the pad openings 133, 134.

The first and second connection electrodes 128, 129 are formed spaced apart from each other on the substrate 103. The first connection electrode 128 is connected with the pad region 123 of the upper electrode film 122 at the one end portion side of the substrate 103. The second connection electrode 129 is connected with the contact electrode film 125 at the other end portion side of the substrate 103. The first and second connection electrodes 128, 129 are formed in a substantially rectangular shape in a plan view along the long sides 107 of the substrate 103. The first and second connection electrodes 128, 129 are protruded from the front surface of the resin film 132, have a front surface at a position higher than the resin film 132 (a position far from the substrate 103), and have an overlapping portion stretching from an opening end of the pad opening 133, 134 to the front surface of the resin film 132. Although illustrations are omitted in FIG. 22, the first and second connection electrodes 128, 129 have an Ni layer, a Pd layer, and an Au layer in this order from the element forming surface 104 side.

In each of the first and second connection electrodes 128, 129, the Ni layer constitutes a large part of each connection electrode, and the Pd layer and the Au layer are formed significantly thinly as compared to the Ni layer. The Ni layer has the role of relaying the conductive material of the first and second connection electrodes 128, 129 and solder when the discrete capacitor 101 is mounted on a mounting substrate. The first and second connection electrodes 128, 129 may have the front surface at a position lower than the front surface of the resin film 132 (a position nearer to the substrate 103).

As described above, with the discrete capacitor 101, the pad region 123 is also opposed to the impurity diffusion layer 113 with the dielectric film 117 therebetween in addition to the base region 124. Therefore, the region on the first opening 115 can be used effectively, and simultaneously the capacitance value of the capacitor element C101 can be effectively increased within a limited area.

The capacitance value in the capacitor element C101 can be adjusted by changing the area of the base region 124 opposed to the impurity diffusion layer 113. Thus, for example, by reducing the area of the base region 124 opposed to the impurity diffusion layer 113 to half, the capacitance value in the base region 124 can be reduced to half as well. Furthermore, by zeroing out the area of the base region 124, the capacitance value in the capacitor element C101 can be set at a capacitance value between the pad region 123 and the impurity diffusion layer 113. Accordingly, the discrete capacitor 101 having a variety of capacitance values can be easily manufactured and provided. The area of the base region 124 can be adjusted by changing the layout of a resist mask in a resist mask formation step of step S112 described later (see FIG. 27).

Further, with the discrete capacitor 101, parasitic capacitance is formed between the impurity diffusion layer 113 and respective overlapping portions 122*a*, 125*a* of the upper electrode film 122 and contact electrode film 125 on the silicon oxide film 114. As described above, the impurity diffusion layer 113 and each overlapping portion 122*a*, 125*a* can be sufficiently spaced apart where the thickness of the silicon oxide film 114 is 8000 Å to 12000 Å. Since the capacitance value of the capacitor is inversely proportional to the distance (that is, the distance between the impurity diffusion layer 113 and each overlapping portion 122*a*, 125*a*), the capacitance component of the parasitic capacitance can be reduced effectively. As a result, the discrete capacitor 101 having the capacitance value with little error between a design value and a measured value can be provided.

<ESD Resistance>

One of the electrical characteristics of the discrete capacitor 101 is the ESD (Electrostatic Discharge) resistance in the HBM (Human Body Model) test (hereinafter, simply referred to as an "ESD resistance"). The HBM test is a model for testing the state of electrostatic discharge of static electricity having been accumulated in human body due to electrostatic charge, to a device. From the viewpoint of reliability, the discrete capacitor 101 preferably has high ESD resistance. Hereinafter, the ESD resistance of the discrete capacitor 101 will be described with reference to FIG. 24.

Figure 24:
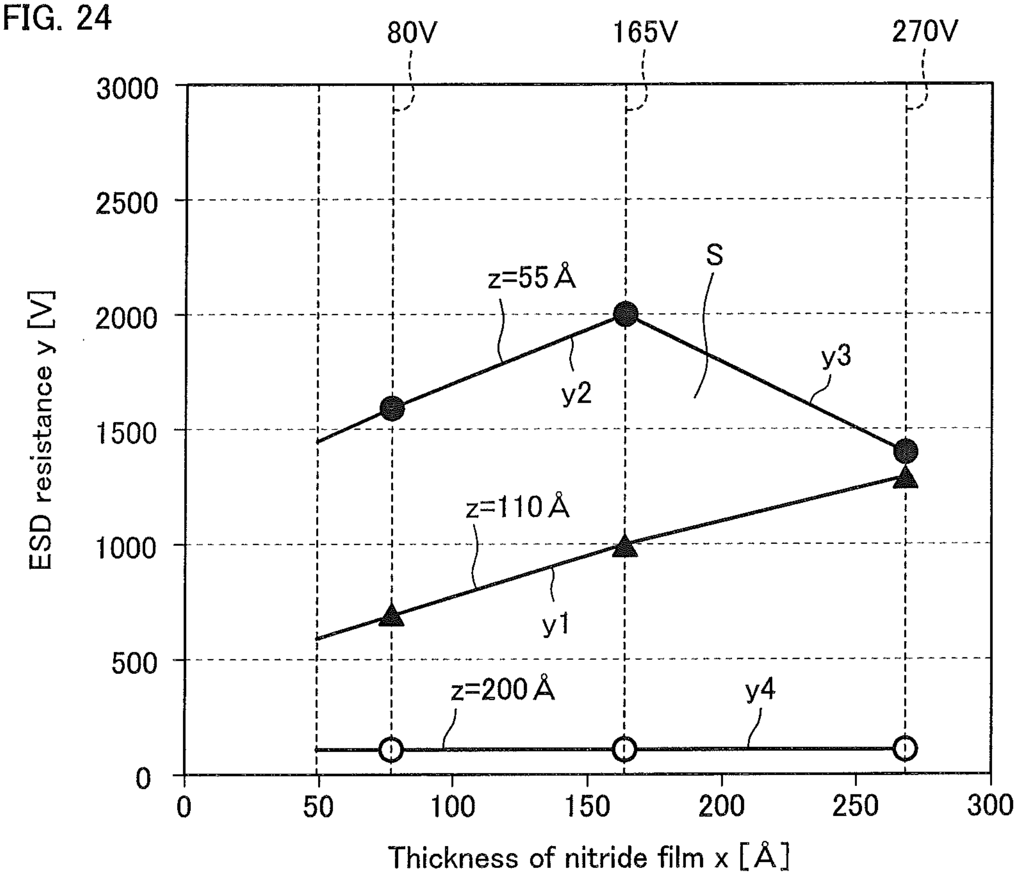
FIG. 24 is a graph showing thickness of nitride film in the dielectric film shown in FIG. 20 vs. ESD resistance in the HBM test.

FIG. 24 is a graph showing thickness [Å] of the nitride film 120 in the dielectric film 117 shown in FIG. 20 vs. ESD resistance [V] in the HBM test. Hereinafter, the description will be given letting the value of the thickness of the nitride film 120 be x, the value of the ESD resistance be y (y1 to y4), and the value of the thickness of the bottom oxide film 119 be z. The thickness of the top oxide film 121 is constant of 50 Å.

y1 shown in the graph of FIG. 24 denotes the ESD resistance where z=110 Å and 50 Å≤x≤270 Å. y2 denotes the ESD resistance where z=55 Å and 50 Å≤x≤165 Å. y3 denotes the ESD resistance where z=55 Å and 165 Å≤x≤270 Å. y4 denotes the ESD resistance where z=200 Å and 50 Å≤x≤270 Å. The y1 to y4 are expressed by the following relational expressions (1) to (4).

$$y1=3.16x+447.2 \quad (1)$$

$$y2=4.71x+1223.5 \quad (2)$$

$$y3=-5.714x+2943 \quad (3)$$

$$y4=80 \quad (4)$$

As shown in the graph of FIG. 24, it is seen that the value y of the ESD resistance is improved as the value z of the thickness of the bottom oxide film 119 becomes smaller in the order of 200 Å, 110 Å, and 55 Å. From this, it is seen from the relational expression (1) that y≥700V can be achieved in the range of 50 Å≤x≤270 Å where z≤110 1Å. It is also seen from the relational expressions (1) and (2) that 700V≤y≤2000V can be achieved in the range of 50 Å≤x≤165 Å where 55 Å≤z≤110 Å. Further, it is seen from the relational expressions (1) and (3) that 1000V≤y≤2000V can be achieved in the range of 165 Å≤x≤270 Å where 55 Å≤z≤110 Å.

From the above, the following relational expressions (5) to (9) can be derived.

$$50\ \text{Å}(\leq 55\ \text{Å})\leq z\leq 110\ \text{Å} \quad (5)$$

$$50\ \text{Å}\leq x\leq 270\ \text{Å} \quad (6)$$

$$y1\geq 3.16x+447.2 \quad (7)$$

$$y2\leq 4.71x+1223.5 \quad (8)$$

$$y3\leq 5.714x+2943 \quad (9)$$

When the above relational expressions (5) to (9) are all satisfied, the value y of the ESD resistance is located within a region S surrounded by the straight line of x=50 Å, the straight line of x=270 Å, y1, y2, and y3. From this, it is determined that excellent ESD resistance can be realized.

Here, as for the thickness z of the bottom oxide film 119, reference is made to the graph when z=55 Å. It is seen that the value y of the ESD resistance decreases with x=165 Å as a boundary. That is, it is seen that regarding the value x of thickness of the nitride film 120, an increase in thickness of the nitride film 120 contributes to an increase in ESD resistance where x≤165 Å, but does not contribute to an increase in ESD resistance where x>165 Å (that is, contributes to a decrease in ESD resistance).

Accordingly, it is seen that regarding the value x of thickness of the nitride film 120, 50 Å≤x≤165 Å which contributes to an increase in ESD resistance is satisfied instead of the above relational expression (6), thereby allowing 700V≤y≤2000V to be achieved efficiently while suppressing thickening of the nitride film 120. Moreover, since the thickening of the nitride film 120 can be suppressed, thickening of the entire dielectric film 117 can also be suppressed. As a result, the distance between the upper electrode film 122 and the impurity diffusion layer is increased and the capacitance value in the capacitor element C101 (see FIG. 21 and FIG. 22) can also be suppressed from decreasing.

Further, it is seen from the above relational expression (4) that the ESD resistance is reduced when the thickness of the bottom oxide film 119 is made to be 200 Å or more. It is also seen that where the thickness of the bottom oxide film 119 is 200 Å or more, the value y of the ESD resistance is constant (y4=80V) even if the thickness x of the nitride film 120 is changed, and thus the thickness x of the nitride film 120 does not contribute to increase or decrease of the ESD resistance. Accordingly, it is determined that excellent ESD resistance cannot be obtained if the dielectric film 117 is formed only with the oxide film having 200 Å or more in thickness (that is, the thickness x of the nitride film 120=0 Å).

<Temperature Characteristics>

One of the electrical characteristics of the discrete capacitor 101 is temperature characteristics. The temperature characteristics indicate the rate of change of the capacitance value with respect to changes in temperature. With increase in temperature, the capacitance value changes in an increasing direction in the discrete capacitor 101. Thus, in order to provide the discrete capacitor 101 having excellent reliability, the rate of change of the capacitance value is preferably low with respect to changes in temperature. Hereinafter, the temperature characteristics of the discrete capacitor 101 will be described with reference to FIG. 25.

Figure 25:
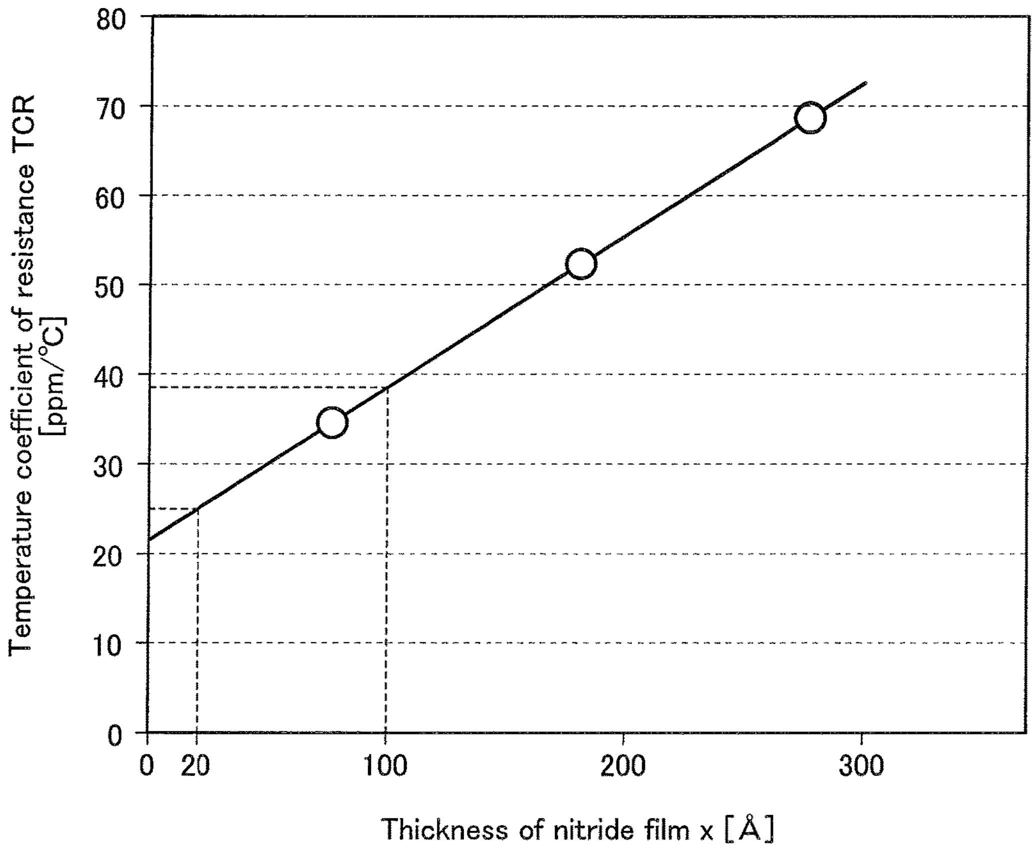
FIG. 25 is a graph showing thickness of nitride film in the dielectric film shown in FIG. 20 vs. temperature coefficient of resistance of the dielectric film.
Figure 26:
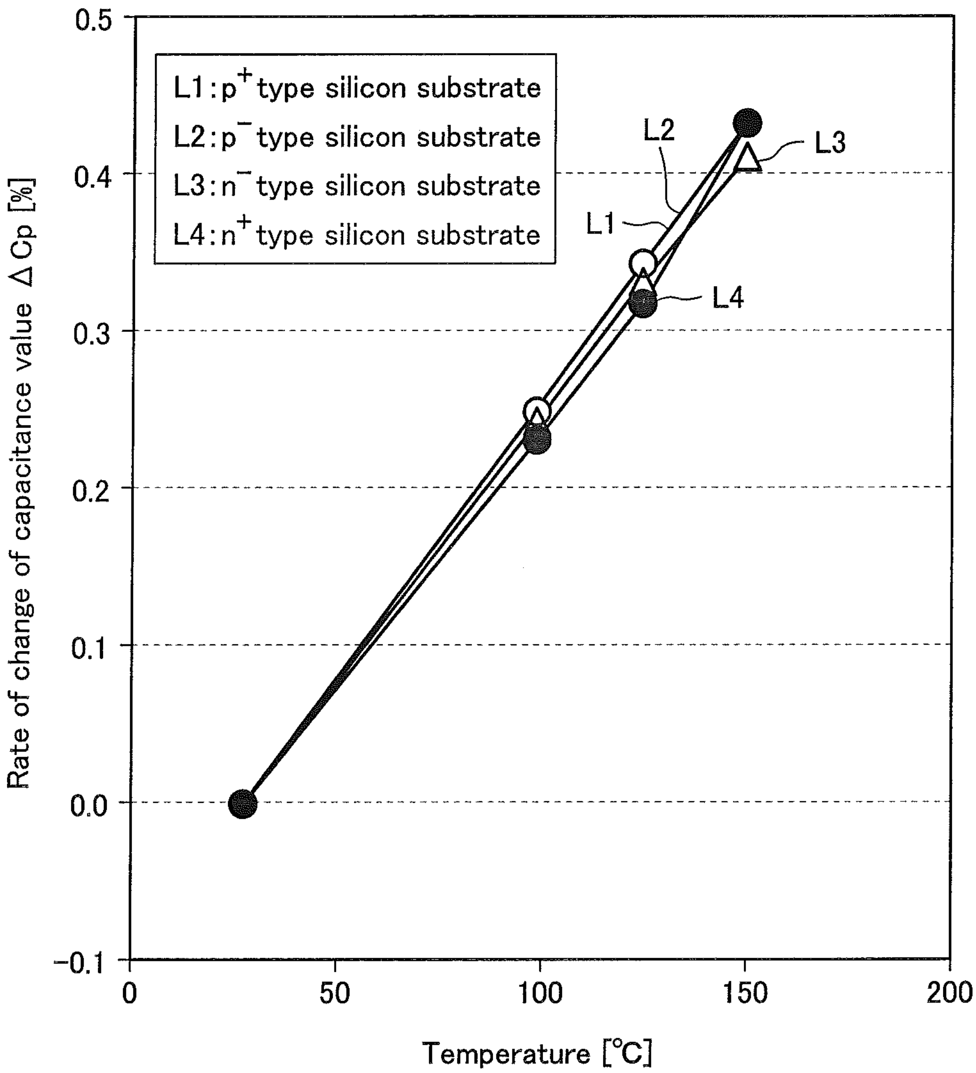
FIG. 26 is a graph in which the graph shown in FIG. 25 is converted into temperature vs. rate of change of the capacitance value.

FIG. 25 is a graph showing thickness [Å] of the nitride film 120 in the dielectric film 117 shown in FIG. 20 vs. temperature coefficient of resistance (TCR) [ppm/° C.] of the dielectric film 117. FIG. 26 is a graph in which the graph shown in FIG. 25 is converted into temperature vs. rate of change of the capacitance value ΔCp. Hereinafter, following the above FIG. 24, the description will be given letting the value of the thickness of the nitride film 120 be x, the value of the ESD resistance be y, and the value of the thickness of the bottom oxide film 119 be z. The thickness of the top oxide film 121 is constant of 50 Å. The temperature coefficient of resistance TCR is specified in parts per million of variation in capacitance value per ° C.

Referring to the graph of FIG. 25, it can be confirmed that the temperature coefficient of resistance TCR of the dielectric film 117 increases linearly according to increase in thickness x of the nitride film 120. It is seen from this graph that regarding the thickness x of the nitride film 120, satisfying 20 Å≤x≤100 Å allows 25 ppm/° C.≤temperature coefficient of resistance TCR≤40 ppm/° C. to be achieved.

In FIG. 26, a graph of temperature [° C.] vs. rate of change of the capacitance value ΔCp [%] at the time of 36 ppm/° C. as an example of the above temperature coefficient of resistance TCR is shown, and the rate of change of the capacitance value ΔCp of the discrete capacitor 101 at normal temperatures is defined as 0%.

Straight line L1 in the graph of FIG. 26 shows the characteristics when a $p^+$-type silicon substrate is used, and the capacitance value at normal temperatures is 58.2 pF. Straight line L2 shows the characteristics when a $p^-$-type silicon substrate is used, and the capacitance value at normal temperatures is 55.3 pF. Straight line L3 shows the characteristics when an $n^-$-type silicon substrate is used, and the capacitance value at normal temperatures is 55.4 pF. Straight line L4 shows the characteristics when an $n^+$-type silicon substrate is used, and the capacitance value at normal temperatures is 49.6 pF.

As understood from the straight lines L1 to L4, the rate of change of the capacitance value ΔCp linearly increases according to rise in temperature. It is seen that when the temperature is 150° C., the capacitance value increases 0.4% to 0.5% more than at normal temperatures.

As described above, regarding the thickness x of the nitride film 120 in the ONO film, satisfying 20 Å≤x≤100 Å allows 25 ppm/° C.≤temperature coefficient of resistance TCR≤40 ppm/° C. to be achieved. If within the range of these numerical values, the rate of change of the capacitance value ΔCp at the normal temperature to a temperature of 150° C. can be kept at 0.5% or less.

Furthermore, from the above graph of FIG. 24, referring to 50 Å≤x≤270 Å of the relational expression (6), setting the range of the thickness x of the nitride film 120 to be 50 Å≤x≤100 Å allows, regarding the value y of the ESD resistance, 700V≤y≤1400V to be realized. As a result, the discrete capacitor 101 resistant to changes in temperature and having excellent reliability can be provided.

<Manufacturing Method of Discrete Capacitor 101>

Figure 27:
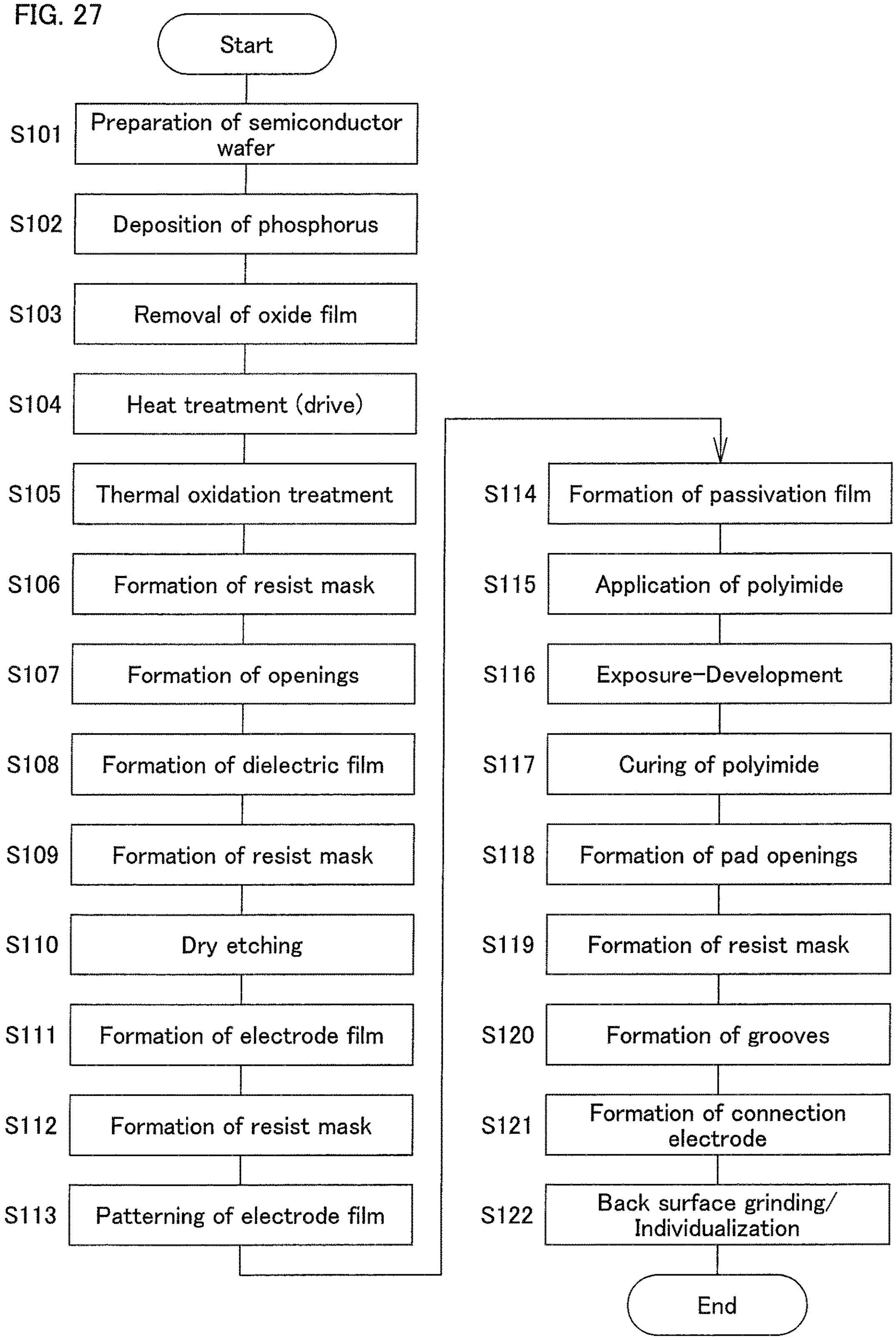
FIG. 27 is a flow chart for explaining a manufacturing method of the discrete capacitor shown in FIG. 20.
Figure 28:
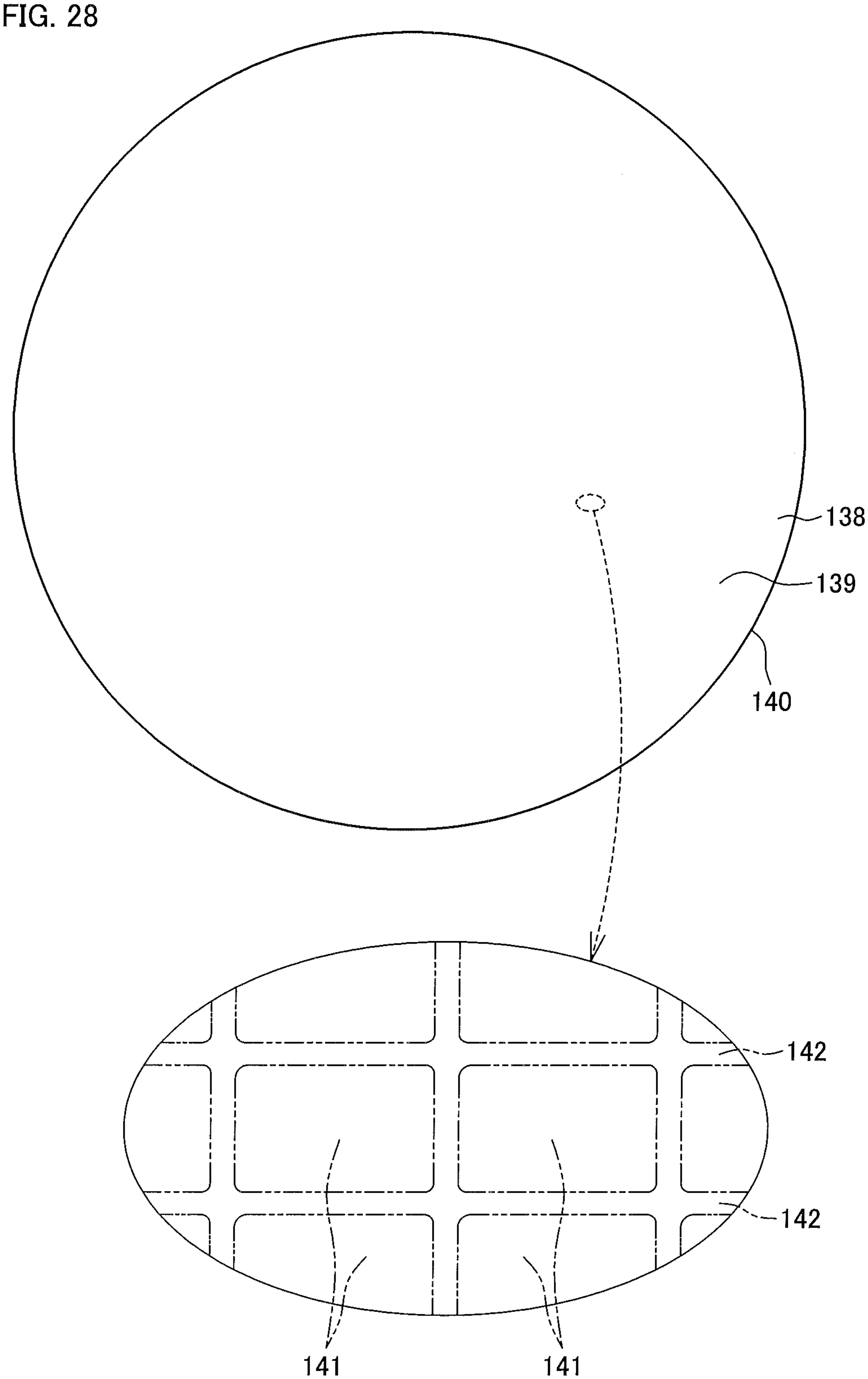
FIG. 28 is a schematic plan view of a semiconductor wafer applied to the manufacturing method shown in FIG. 27.

FIG. 27 is a flow chart for explaining the first manufacturing method of the discrete capacitor 101 shown in FIG. 20. FIG. 28 is a schematic plan view of a semiconductor wafer 138 applied to the manufacturing method of FIG. 27. FIGS. 29A to 29H are schematic sectional views for explaining one process of the manufacturing method shown in FIG. 27.

Figure 29A:
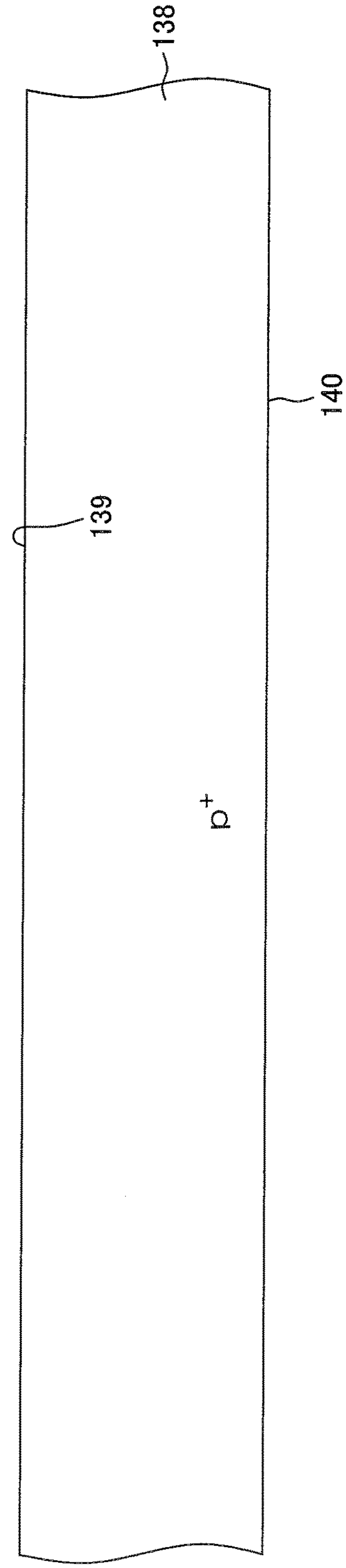
FIGS. 29A to 29H are schematic sectional views for explaining one process of the manufacturing method shown in FIG. 27.

First, a semiconductor wafer 138 as an original substrate of the substrate 103 is prepared (step S101: Preparation of semiconductor wafer) as shown in FIG. 28 and FIG. 29A. The semiconductor wafer 138 may be an $n^+$-type silicon wafer, an $n^-$-type silicon wafer, a $p^+$-type silicon wafer, or $p^-$-type silicon wafer. In the present manufacturing method, an example of a $p^+$-type silicon wafer is shown.

A front surface 139 of the semiconductor wafer 138 corresponds to the element forming surface 104 of the substrate 103, and a back surface 140 of the semiconductor wafer 138 corresponds to the back surface 105 of the substrate 103. Chip regions 141 at which a plurality of the discrete capacitors 101 are formed are arrayed and configured in a matrix form on the front surface 139 of the semiconductor wafer 138. Boundary regions 142 are provided between mutually adjacent chip regions 141. The boundary regions 142 are a strip region having a substantially constant width, and extend in two orthogonal directions and are formed in a lattice form.

Figure 29B:
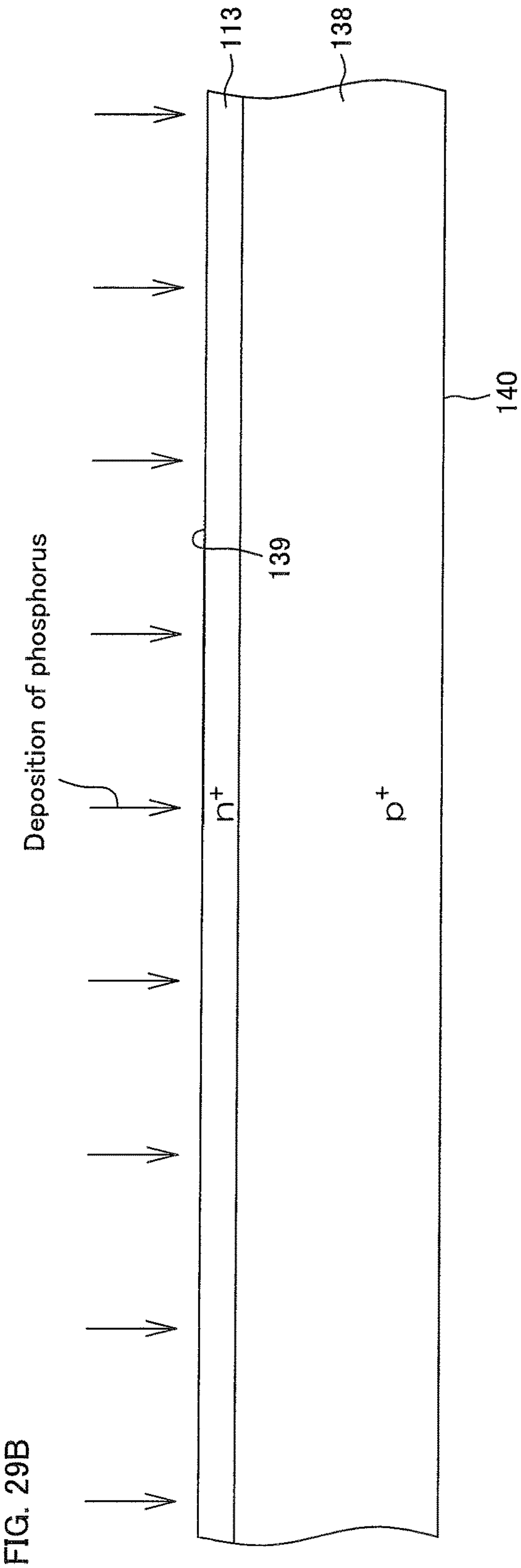

Subsequently, as shown in FIG. 29B, an n-type impurity is introduced to a front surface portion of the semiconductor wafer 138. The introduction of the n-type impurity is performed by a so-called phosphorus deposition step of depositing phosphorus (P) as the n-type impurity on the front surface 139 of the semiconductor wafer 138 (step S102: Deposition of phosphorus). The phosphorus deposition step is a process of carrying the semiconductor wafer 138 into a diffusion furnace and depositing phosphorus on the front surface 139 of the semiconductor wafer 138 through heat treatment that is performed flowing $POCl_3$ gas within the diffusion furnace. In the present reference example, such phosphorus deposition step is carried out under a temperature of 920° C. for 30 minutes. Subsequently, the oxide film (not shown) having been formed on the front surface 139 of the semiconductor wafer 138 through the phosphorus deposition step is removed by wet etching (step S103: Removal of oxide film). The etchant is hydrofluoric acid, for example.

Subsequently, heat treatment (drive-in treatment) for activating the n-type impurity having been introduced to the semiconductor wafer 138 is performed (step S104: Heat treatment (drive)). The drive-in treatment is such that dry treatment is carried out under a temperature of 900° C. for 10 minutes and wet treatment is carried out under a temperature of 1000° C. for 40 minutes and heat treatment is carried out in an atmosphere of a nitrogen gas under a temperature of 1050° C. for 2 hours. As a result, the impurity diffusion layer 113 having a predetermined depth is formed on the front surface portion of the semiconductor wafer 138.

Figure 29C:
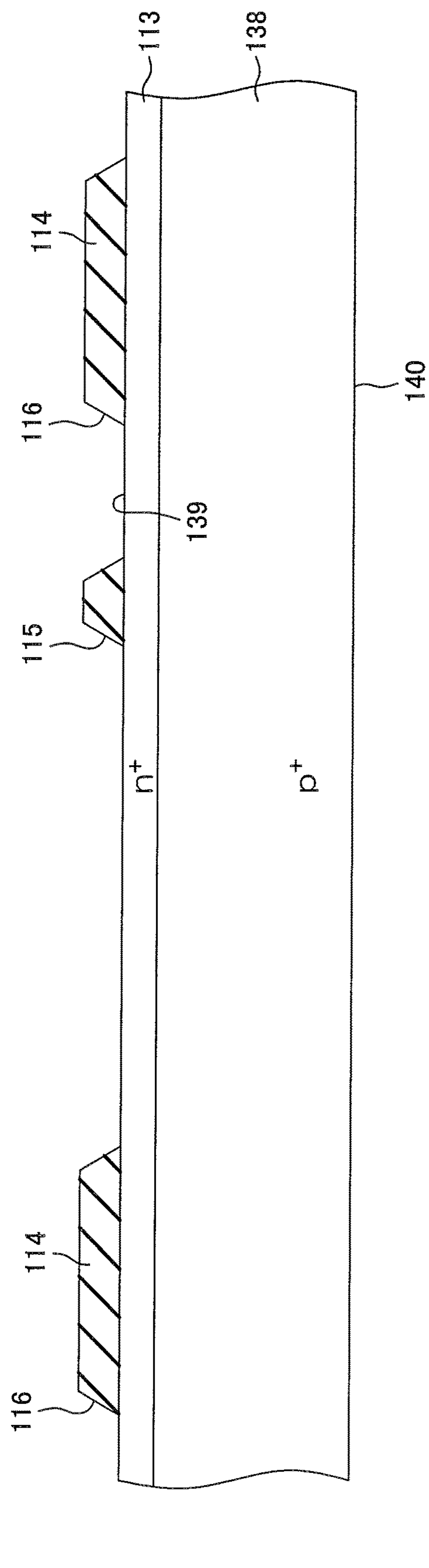

Subsequently, as shown in FIG. 29C, thermal oxidation treatment is applied to the front surface 139 of the semiconductor wafer 138 (step S105: Thermal oxidation treatment). The thermal oxidation treatment is carried out under a temperature of 950° C. to 1000° C. for 4 to 10 hours (at 1000° C. for 4 hours in the present reference example). As a result, the silicon oxide film 114 having a predetermined thickness (for example, a thickness of 10000 Å) is formed on the front surface 139 of the semiconductor wafer 138. Subsequently, a resist mask (not shown) is formed on the silicon oxide film 114 (step S106: Formation of resist mask). The first and second openings 115, 116 are formed in the silicon oxide film 114 by etching using the resist mask (step S107: Formation of openings).

Figure 29D:
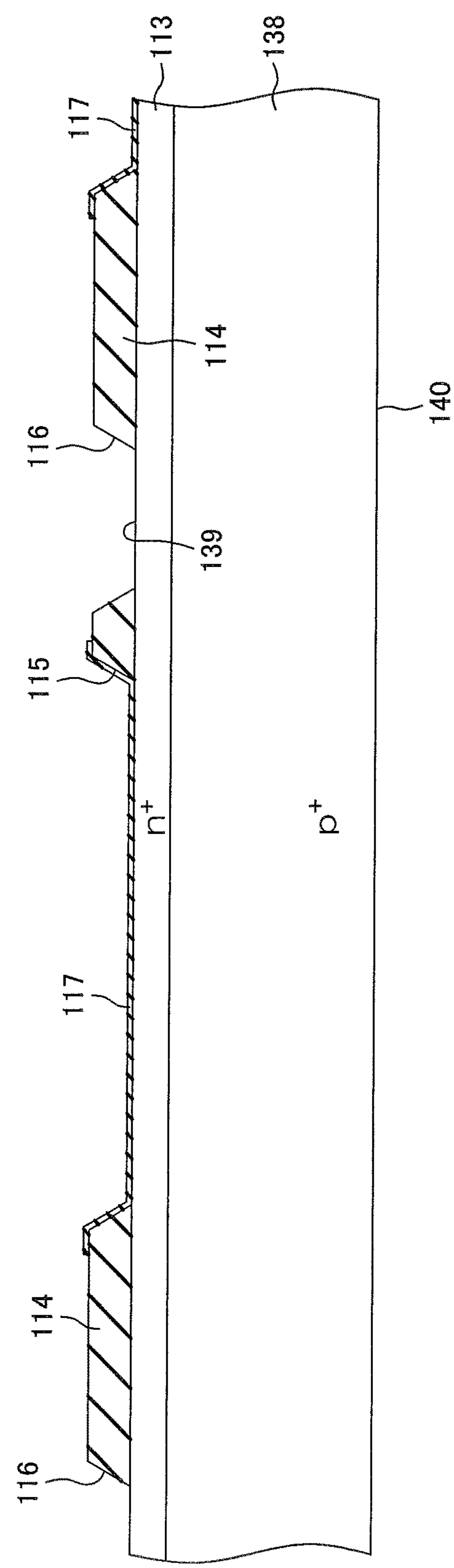

Subsequently, as shown in FIG. 29D, the bottom oxide film 119, the nitride film 120, and the top oxide film 121 (see FIG. 23 together) are deposited in this order and the dielectric film 117 (ONO film) is formed on the entire front surface 139 of the semiconductor wafer 138 (step S108: Formation of dielectric film). The bottom oxide film 119 and the top oxide film 121 are formed by thermal oxidation treatment, and the nitride film 120 is formed by a CVD method. At this moment, for example, the dielectric film 117 is formed such that the thickness of the bottom oxide film 119 is 50 Å to 110 Å, and that of the nitride film 120 is 20 Å to 100 Å, and that of the top oxide film 121 is 50 Å.

Subsequently, a resist mask (not shown) selectively having an opening to expose the second opening 116 is formed on the dielectric film 117 (step S109: Formation of resist mask). The dielectric film 117 formed on the second opening 116 and the silicon oxide film 114 is selectively removed by etching (for example, reactive ion etching) through the resist mask (step S110: Dry etching). The front surface 139 of the semiconductor wafer 138 is washed according to need after the dielectric film 117 is removed.

Figure 29E:
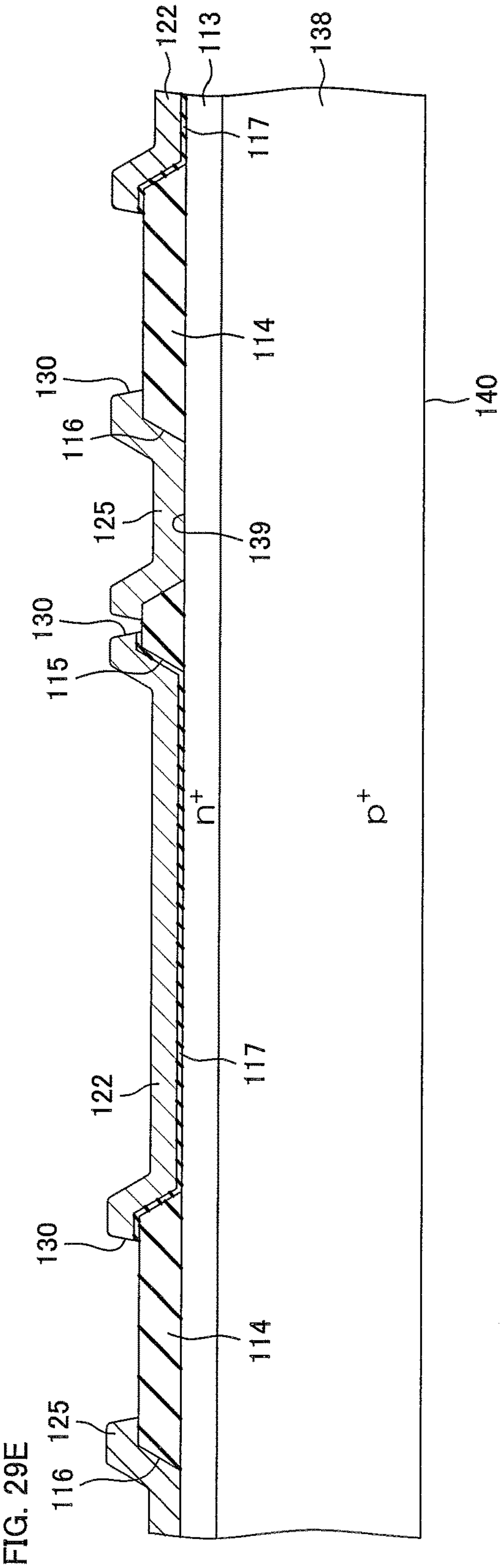

Subsequently, as shown in FIG. 29E, an electrode film constituting the upper electrode film 122 and the contact electrode film 125 is formed on the semiconductor wafer 138 by sputtering (step S111: Formation of electrode film). In the present reference example, an electrode film composed of AlSiCu (for example, a thickness of 10000 Å) is formed. A resist mask (not shown) having an opening pattern corresponding to the slits 130 is then formed on the electrode film (step S112: Formation of resist mask). The slits 130 are formed in the electrode film by etching (for example, reactive ion etching) through the resist mask (step S113:

Patterning of electrode film). As a result, the electrode film is separated into the upper electrode film 122 and the contact electrode film 125.

Figure 29F:
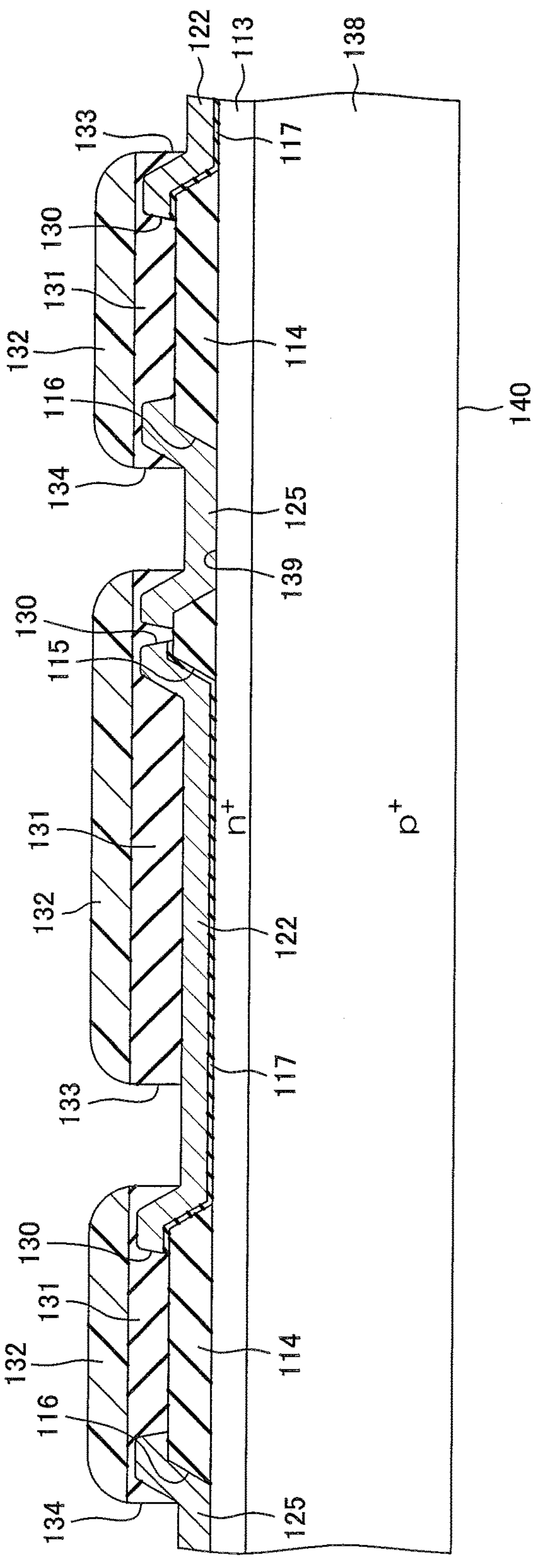

Subsequently, as shown in FIG. 29F, a passivation film 131 being a nitride film is formed by a CVD method, for example, after the resist mask is peeled off (step S114: Formation of passivation film). Subsequently, photosensitive polyimide is applied to form the resin film 132 (step S115: Application of polyimide). Subsequently, the resin film 132 is exposed with a pattern corresponding to the pad openings 133, 134. Thereafter, the resin film 132 is developed (step S116: Exposure-Development). Subsequently, heat treatment for curing the resin film 132 is performed according to need (step S117: Curing of polyimide). The passivation film 131 is then removed by dry etching (for example, reactive ion etching) with the resin film 132 as the mask (step S118: Formation of pad openings). As a result, the pad openings 133, 134 are formed.

Figure 29G:
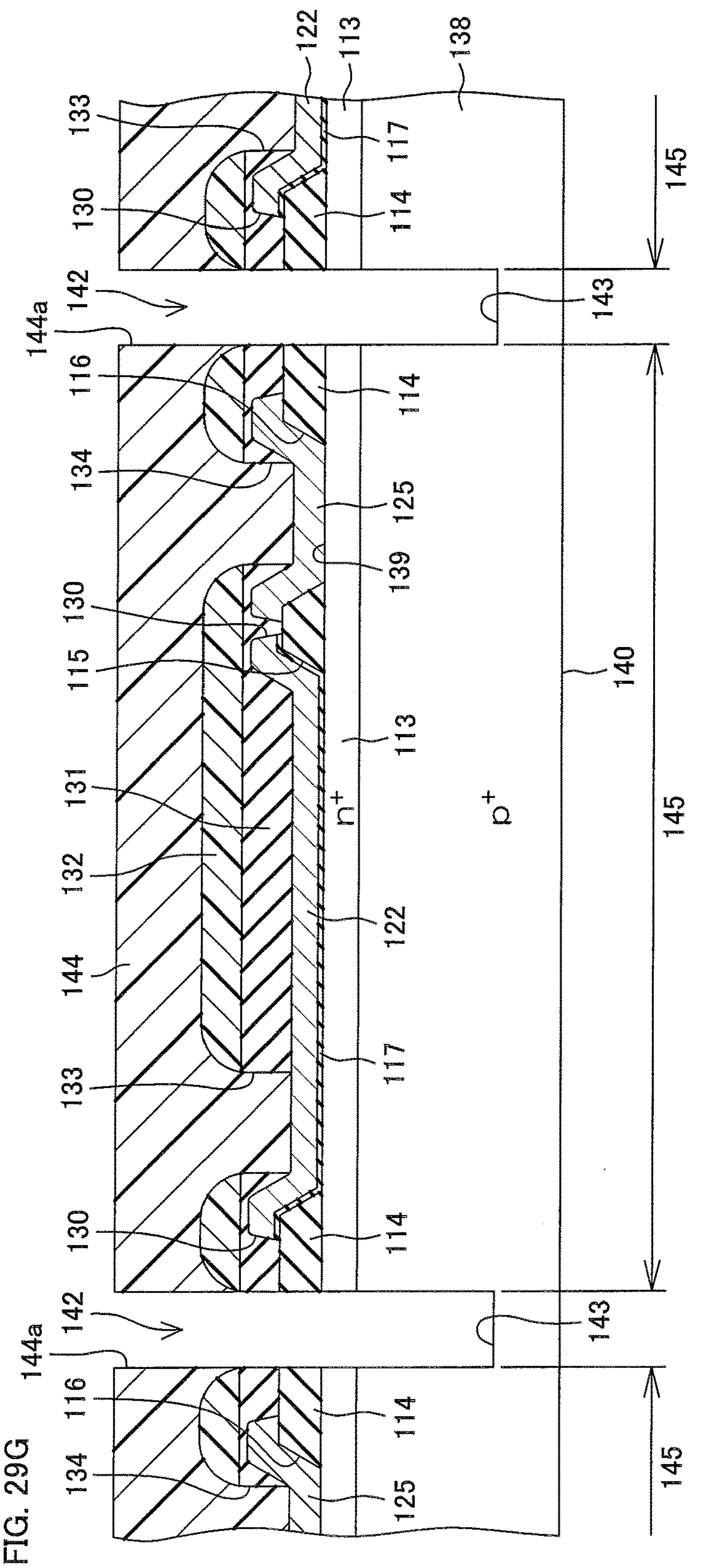

Subsequently, as shown in FIG. 29G, a resist pattern 144 for forming cutting grooves 143 in boundary regions 142 (see FIG. 27 together) is formed (step S119: Formation of resist mask). The resist pattern 144 has lattice openings 144*a* aligned with the boundary regions 142. Plasma etching is performed through the resist pattern 144 (step S120: Formation of grooves). As a result, the semiconductor wafer 138 is etched to a predetermined depth from the front surface 139 and the cutting grooves 143 along the boundary regions 142 are formed.

Semi-finished products 145 are positioned one by one in the chip regions 141 surrounded by the cutting grooves 143. These semi-finished products 145 are aligned and arranged in a matrix form. Forming the cutting grooves 43 as above allows the semiconductor wafer 138 to be separated into a plurality of the chip regions 141. The resist pattern 144 is peeled off after the cutting grooves 143 are formed.

Figure 29H:
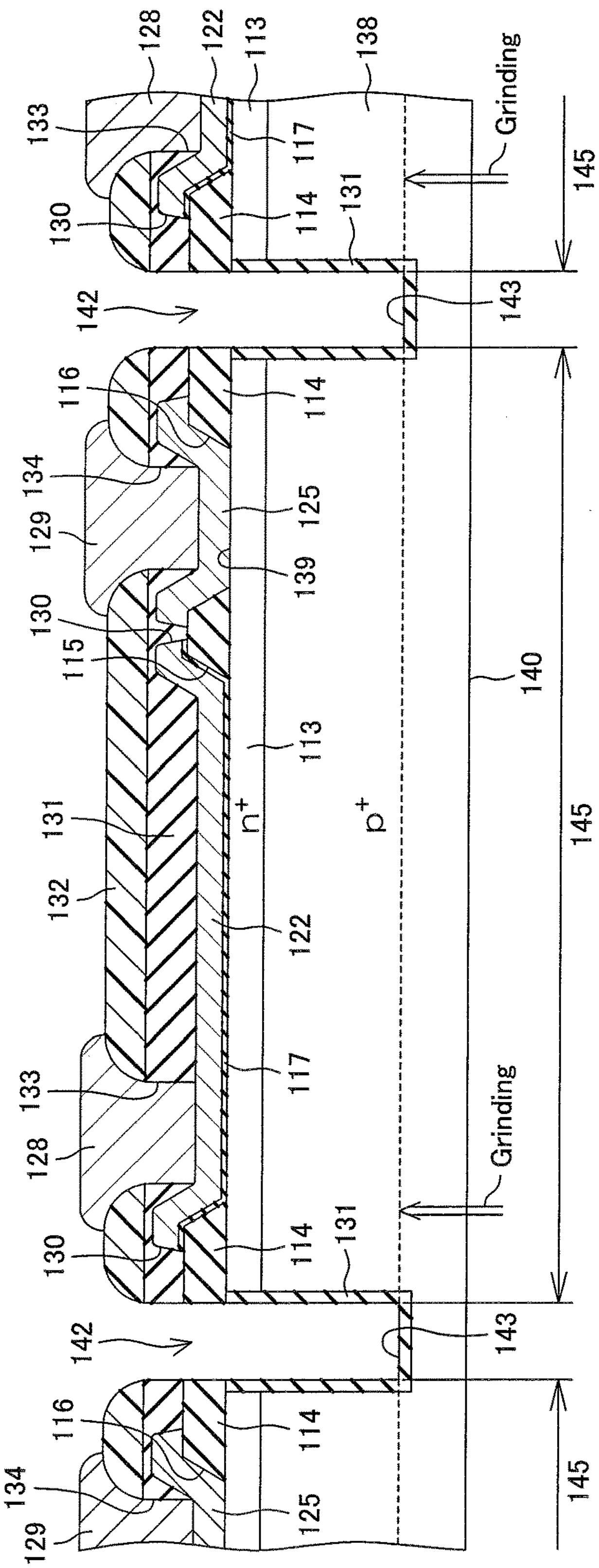

Subsequently, as shown in FIG. 29H, the passivation film 131 formed of USG is formed on inner peripheral surfaces (a bottom surface and lateral surfaces) of the cutting groove 143 by the CVD method. Subsequently, an Ni layer, a Pd layer, and an Au layer are film-formed by plating in this order so as to backfill the pad openings 133, 134 (step S121: Formation of connection electrode). As a result, the first and second connection electrodes 128, 129 are formed. Subsequently, the semiconductor wafer 138 is ground from the back surface 140 side until reaching the bottom surfaces of the cutting grooves 143 (step S122: Back surface grinding/Individualization). As a result, the plurality of chip regions 141 are individualized and the discrete capacitors 101 can be obtained.

As described above, if the semiconductor wafer 138 is ground from the back surface 105 side after the cutting grooves 143 are formed, the plurality of chip regions 141 formed on the semiconductor wafer 138 can be individualized all at once. Thus, an improvement in the productivity of the discrete capacitor 101 can be achieved by the reduction in manufacturing time. Further, the back surface 105 of the finished substrate 103 may be mirror-finished by polishing or etching to make the back surface 105 excellent in appearance.

Further, the impurity diffusion layer 113 also serving as the lower electrode is formed on the entire front surface portion of the substrate 103. Thus, the whole of the upper electrode film 122 can be opposed to the impurity diffusion layer 113 reliably even if the upper electrode film 122 is formed displaced from the design position at the time of manufacturing. As a result, the discrete capacitor 101 resistant to variations in the design such as displacement can be provided.

Second Reference Example

Figure 30:
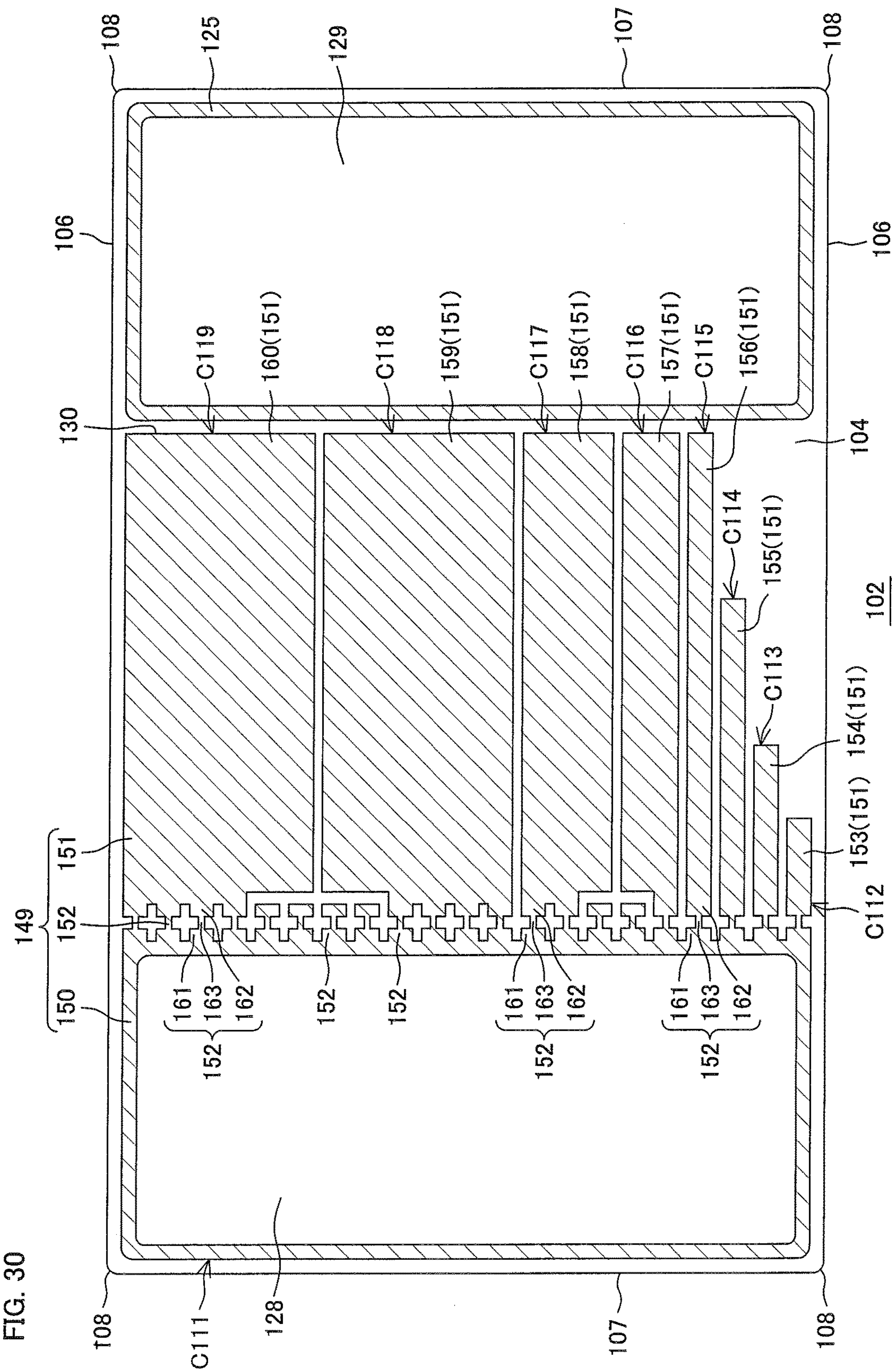
FIG. 30 is a schematic perspective view of a discrete capacitor according to the second reference example.

FIG. 30 is a schematic plan view of a discrete capacitor 102 according to the second reference example.

How the discrete capacitor 102 differs from the discrete capacitor 101 according to the foregoing first reference example is that an upper electrode film 149 is formed instead of the upper electrode film 122. The other configurations are the same as those of the foregoing discrete capacitor 101. In FIG. 30, parts respectively corresponding to the portions shown in FIG. 21 are given the same reference symbols and their descriptions are omitted.

The upper electrode film 149 has a pad region 150, a base region 151 electrically connected to the pad region 150, and a plurality of fuses 152 formed along one long side (the long side at the inner region side of the element forming surface 104) of the pad region 150 so as to connect the pad region 150 and the base region 151.

The pad region 150 is formed in a rectangular shape along the short side 107 of the substrate 103 at one end portion side of the substrate 103, and is opposed to the impurity diffusion layer 113 with the foregoing dielectric film 117 (ONO film) therebetween. A first connection electrode 128 is connected to the pad region 150.

The base region 151 is divided (separated) into a plurality of electrode film parts 153 to 160. The electrode film parts 153 to 160 are each formed in a rectangular shape and extend in a strip shape from the fuses 152 toward the contact electrode film 125. The electrode film parts 156 to 160 are formed extending over the range from an edge of the pad region 150 to an edge of the contact electrode film 125 via the fuses 152, and the electrode film parts 153 to 155 are formed shorter than them. In other words, the plurality of electrode film parts 153 to 160 are opposed to the impurity diffusion layer 113 with the dielectric film 117 therebetween, with different kinds of facing areas.

More specifically, the facing areas of the electrode film parts 153 to 160 with respect to the impurity diffusion layer 113 may be determined to become 1:2:4:8:16:32:64:64. That is, the plurality of electrode film parts 153 to 160 have the facing areas set so as to form a geometric progression with a common ratio of 2. More specifically, the electrode film parts 153 to 156 are formed in the strip shape where the width in the short direction along the short side 107 of the substrate 103 is equal and the ratio in length is set to be 1:2:4:8. The electrode film parts 156 to 160 are formed in the strip shape where the length in the longitudinal direction along the long side 106 of the substrate 103 is equal and the ratio in width is set to be 1:2:4:8:8. It is a matter of course that such geometric progression may have a common ratio other than 2. Further, the base region 151 may be divided into electrode film parts more than the electrode film parts 153 to 160 in number.

In this manner, a plurality of capacitor elements C111 to C119 having mutually different capacitance values are formed by respective electrode film parts 153 to 160 and the impurity diffusion layer 113 opposed thereto with the dielectric film 117 therebetween. The capacitor element C111 is formed by the pad region 150 opposing the impurity diffusion layer 113 with the dielectric film 117 therebetween. On the other hand, the capacitor elements C112 to C119 are formed by the electrode film parts 153 to 160 opposing the impurity diffusion layer 113 with the dielectric film 117 therebetween.

The plurality of electrode film parts 153 to 160 are integrally formed with one or more fuses 152 and electrically connected to the first connection electrode 128 via the fuses 152 and the pad region 150. The electrode film parts 153 to 156 with relatively small areas are connected to the pad region 150 by a single fuse 152, and the electrode film parts 157 to 160 with relatively large areas are connected to the pad region 150 via a plurality of fuses 152. All of the fuses 152 need not be used, and a part of the fuses 152 is not in use in this reference example.

The fuse 152 includes a first wide portion 161 for connection with the pad region 150, a second wide portion 162 for connection with the electrode film part 153 to 160, and a narrow portion 163 connecting between the first and second wide portions 161 and 162. The narrow portion 163 is arranged to be cut off (melt-cut) by laser light. As a result, an unnecessary electrode film part 153 to 160 of the electrode film parts 153 to 160 can be electrically separated from the first and second connection electrodes 128, 129 by the cutting of the fuse 152.

Figure 31:
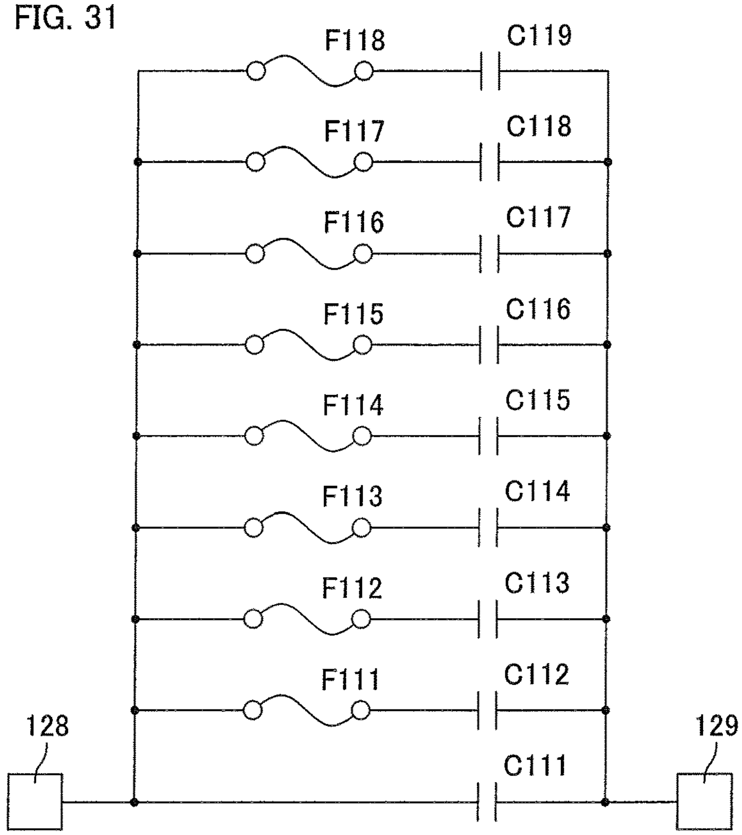
FIG. 31 is an electric circuit diagram of the discrete capacitor shown in FIG. 30.

FIG. 31 is an electric circuit diagram of the discrete capacitor 102 shown in FIG. 30.

As shown in FIG. 31, a plurality of capacitor elements C111 to C119 are connected in parallel between the first and second connection electrodes 128, 129. Fuses F111 to F118 each composed of one or more fuses 152 are interposed in series between each of the capacitor elements C112 to C119 and the first connection electrode 128. On the other hand, no fuse is interposed between the capacitor element C111 and the first connection electrode 128, and the capacitor element C111 is directly connected to the first connection electrode 128.

The capacitance value of the discrete capacitor 102 is equal to the sum total of the capacitance values of the capacitor elements C111 to C119 when the fuses F111 to F118 are all connected. When one or more than two fuses 152 selected from among the plurality of fuses F111 to F118 are cut, the capacitor element(s) corresponding to the cut fuse(s) 152 are disconnected and the capacitance value of the discrete capacitor 102 is reduced by the capacitance value(s) of the disconnected capacitor element(s). When all of the fuses F111 to F118 are cut, the capacitance value of the discrete capacitor 102 becomes the capacitance value of the capacitor element C111.

Accordingly, the capacitance value between the impurity diffusion layer 113 and the pad region 150 (the total capacitance value of the capacitance elements C111 to C119) is measured, and thereafter, one or a plurality of fuses 152 properly selected from among the fuses F111 to F118 according to a desired capacitance value are melt-cut by laser light. By doing this, an adjustment to the desired capacitance value (laser trimming) can be carried out. In particular, when the capacitance values of the capacitor elements C112 to C119 are set to form a geometric progression with a common ratio of 2, a fine adjustment of adjusting to the target capacitance value with a precision corresponding to the capacitance value of the capacitor element C112, which is the smallest capacitance value (the value of the first term of the geometric progression), is possible. Further, properly selecting the fuse(s) 152 to be cut from among the fuses F111 to F118 allows the discrete capacitor 102 with a given capacitance value to be provided.

<Manufacturing Method of Discrete Capacitor 102>

Figure 32:
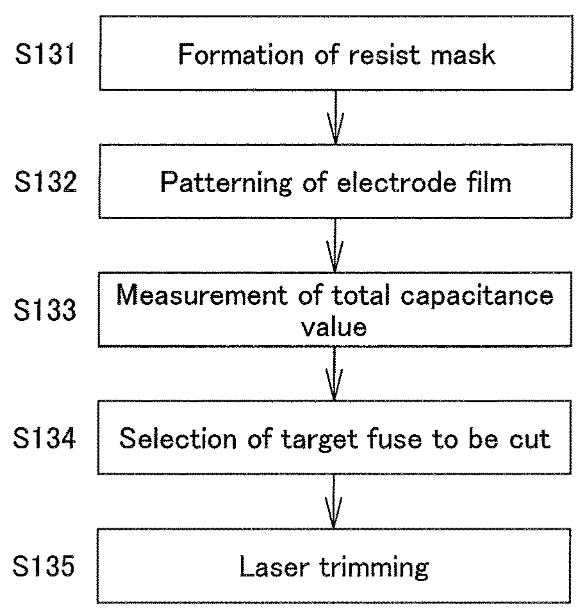
FIG. 32 is a flow chart for explaining a manufacturing method of the discrete capacitor shown in FIG. 30.

FIG. 32 is a flow chart for explaining the manufacturing method of the discrete capacitor 102 shown in FIG. 30.

To manufacture the discrete capacitor 102, steps of steps S131 to S135 shown in FIG. 32 only need to be performed instead of the resist mask formation step of step S112 and the electrode film patterning step of step S113 shown in FIG. 27.

That is, after the electrode film is formed at step S111, a resist mask corresponding to the final shape of the upper electrode film 149 is formed on the front surface of the electrode film (step S131: Formation of resist mask). The electrode film is shaped to the upper electrode film 149 and the contact electrode film 125 by etching through the resist mask (step S132: Patterning of electrode film). The etching for patterning the electrode film may be performed by wet etching using an etchant such as phosphoric acid or may be performed by reactive ion etching.

Subsequently, an inspection probe is pressed against the upper electrode film 149 and the contact electrode film 125 to measure the total capacitance value of the plurality of capacitor elements C111 to C119 (step S133: Measurement of total capacitance value). Based on the measured total capacitance value, a capacitor element to be disconnected, that is, a fuse 152 to be cut is selected according to the intended capacitance value of the discrete capacitor 102 (step S134: Selection of target fuse to be cut).

Subsequently, a cover film composed of a nitride film, for example, is formed on the entire surface of the semiconductor wafer 138. The formation of the cover film may be performed by a plasma CVD method. The cover film covers the patterned upper electrode film 149 and covers the dielectric film 117 in a region where the upper electrode film 149 is not formed. The cover film covers the fuses 152 in the fuse 152 region.

Laser trimming for melt-cutting the fuse 152 is performed from this state (step S135: Laser trimming). That is, laser light is applied to the fuse 152 selected according to the measurement result of the total capacitance value of the capacitor, and the narrow portion 163 of that fuse 152 is melt-cut. As a result, the corresponding capacitor element is disconnected from the pad region 150. When the laser light is applied to the fuse 152, energy of the laser light is accumulated in the vicinity of the fuse 152 by the action of the cover film, whereby the fuse 152 is melt-cut.

With the discrete capacitor 102, as described above, the capacitor element C111 directly connected to the first connection electrode 128 is provided directly below the first connection electrode 128 as shown in FIG. 30 and FIG. 31. Further, the plurality of capacitor elements C112 to C119 disconnectable by the fuses F111 to F118 are provided between the first and second connection electrodes 128, 129. The capacitor elements C112 to C119 include a plurality of capacitor elements with different capacitance values, more specifically, a plurality of capacitor elements with capacitance values set to form a geometric progression. As a result, the discrete capacitor 102 can be provided that is capable of accommodating different types of capacitance values without changing the design and capable of accurately adjusting to the desired capacitance value by selecting one or a plurality of fuses 152 from among the fuses F111 to F118 and melt-cutting the same by laser light.

Third Reference Example

Figure 33:
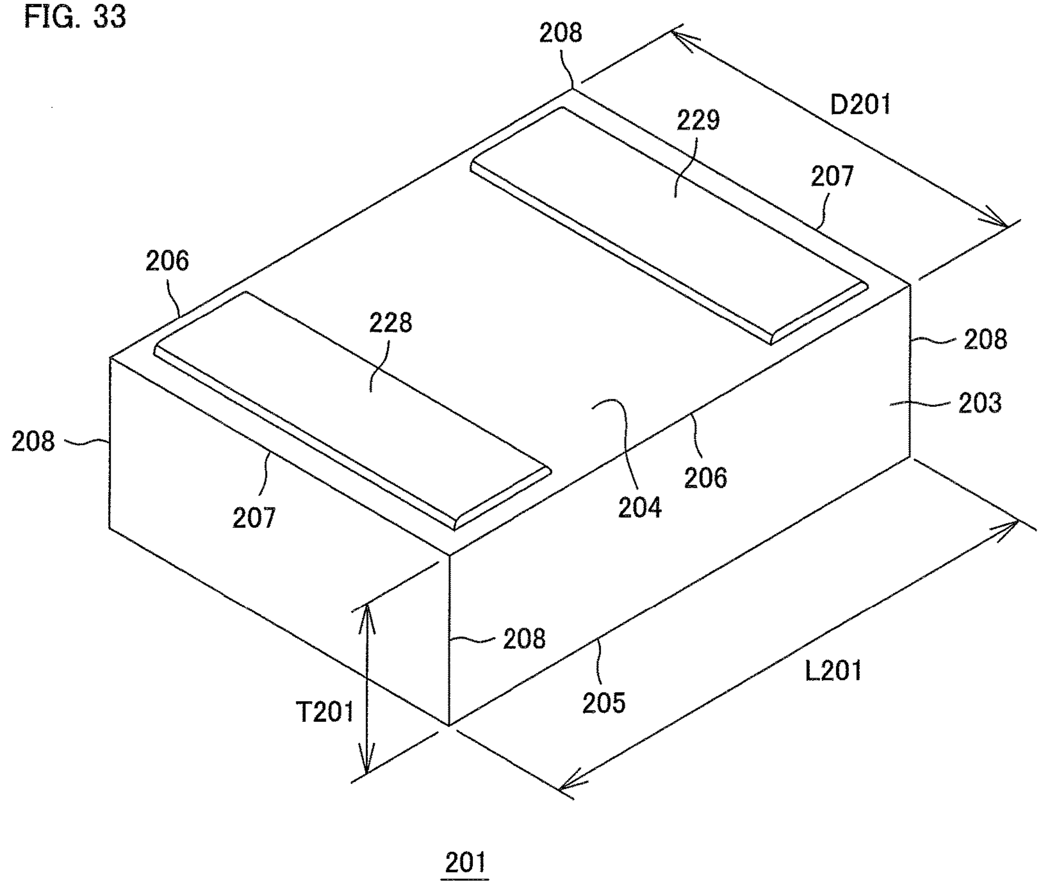
FIG. 33 is a schematic perspective view of a discrete capacitor according to the third reference example.
Figure 34:
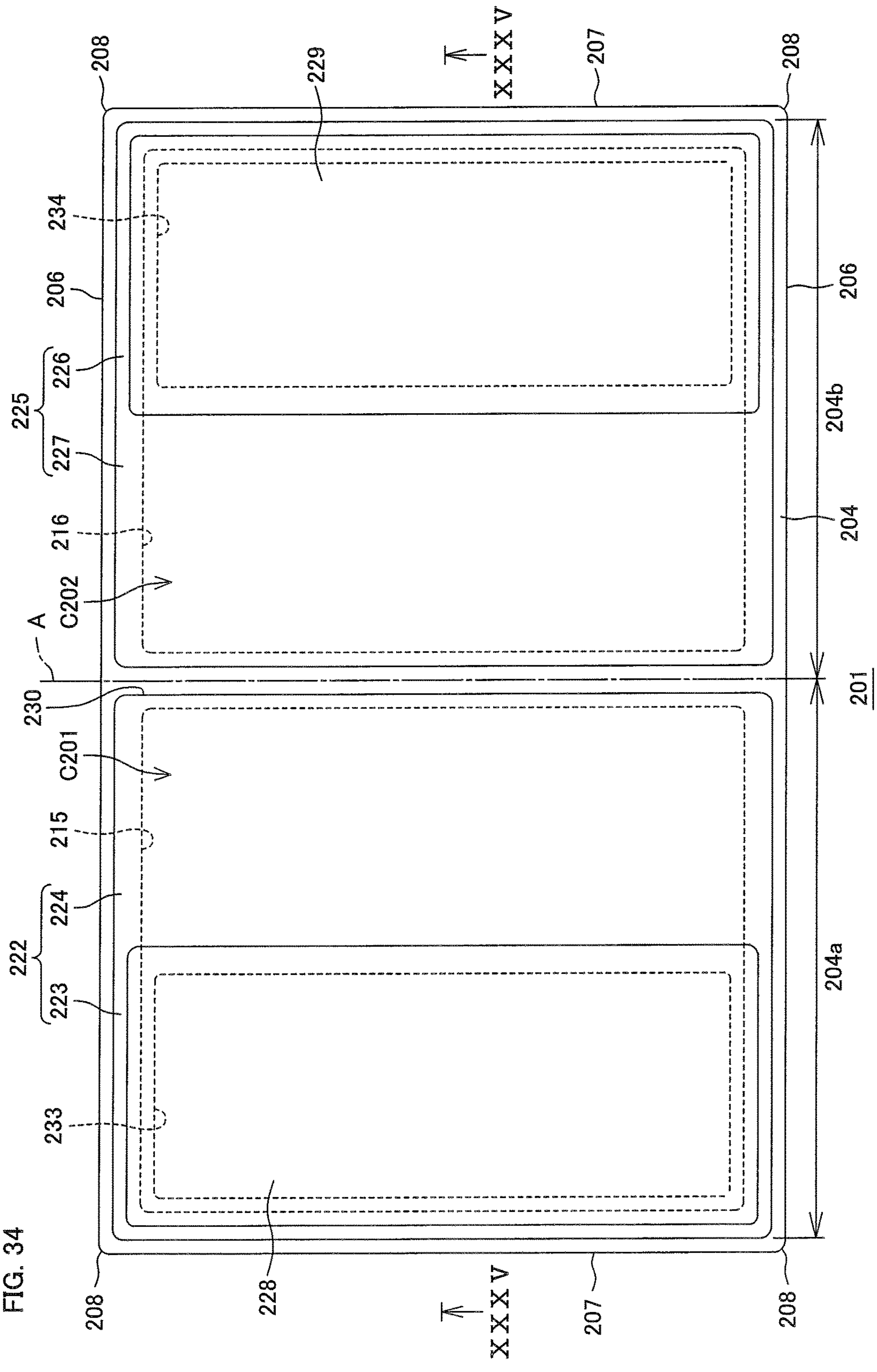
FIG. 34 is a schematic plan view of the discrete capacitor shown in FIG. 33.
Figure 35:
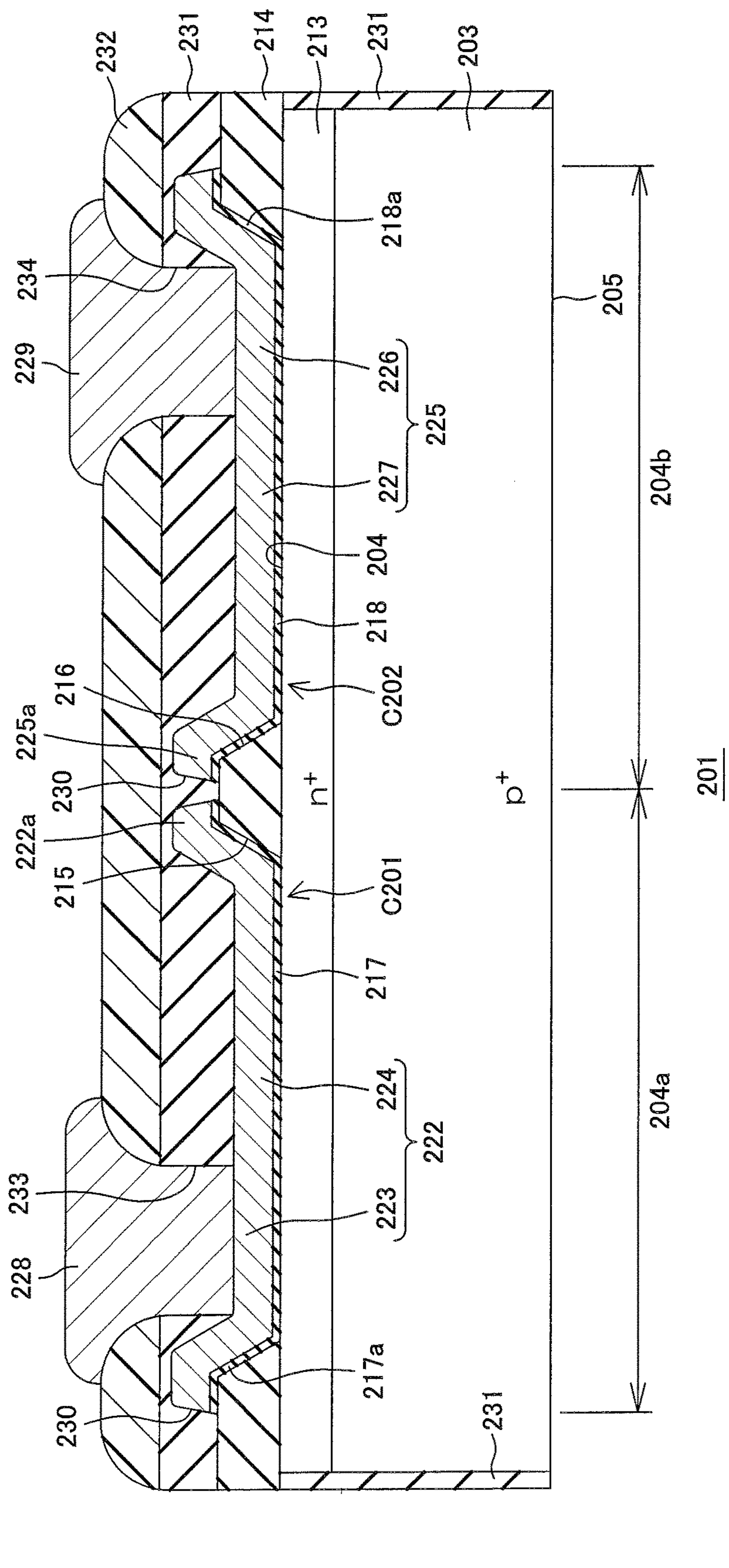
FIG. 35 is a sectional view seen from the line XXXV-XXXV shown in FIG. 34.

FIG. 33 is a schematic perspective view of a discrete capacitor 201 according to the third reference example. FIG. 34 is a schematic plan view of the discrete capacitor 201 shown in FIG. 33. FIG. 35 is a sectional view seen from the line XXXV-XXXV shown in FIG. 34.

The discrete capacitor 201 is a micro chip component and includes a substrate 203 constituting a main body portion. The substrate 203 is a semiconductor substrate. An $n^-$-type silicon substrate, an $n^+$-type silicon substrate, a $p^-$-type silicon substrate, or a $p^+$-type silicon substrate can be employed as the substrate 203. In the present reference example, an example of employing a $p^+$-type silicon substrate as the substrate 203 will be described. As for the resistance value, it is preferred that the resistance value of the $n^-$-type silicon substrate is 2Ω to 3Ω, and that of the $n^+$-type silicon substrate is 1.3 mΩ, and that of the $p^-$-type silicon substrate is 25Ω to 30Ω, and that of the $p^+$-type silicon substrate is 3 mΩ.

The substrate 203 is formed in a substantially rectangular parallelepiped shape having one end portion and the other end portion. The planar shape of the substrate 203 is such that the length L201 of a long side 206 along the longitudinal direction is 0.3 mm to 0.6 mm, and the length D201 of a short side 207 along the short direction is 0.15 mm to 0.3 mm. The thickness T201 of the substrate 203 is 0.1 mm, for example. That is, a so-called a 0603 chip, a 0402 chip, or a 03015 chip is applied as the substrate 203.

Each corner portion 208 of the substrate 203 may have a round shape chamfered in a plan view. With the round shape, a structure capable of suppressing chipping during the manufacturing process or at the time of mounting is obtained. A capacitor is formed at an inner portion of the front surface of the substrate 203. Hereinafter, the front surface on which the capacitor is formed is referred to as an element forming surface 204, and a surface on the opposite side is referred to as a back surface 205.

An $n^+$-type impurity diffusion layer 213 is formed on a front surface portion of the substrate 203. In the present reference example, the impurity diffusion layer 213 is formed on the entire front surface portion of the substrate 203. The impurity diffusion layer 213 is a region to which phosphorus (P) as an example of the n-type impurity, for example, is introduced. In particular, the impurity concentration on the front surface portion of the impurity diffusion layer 213 is not less than $5\times10^{19}$ $cm^{-3}$ (more specifically, $5\times10^{19}$ $cm^{-3}$ to $2\times10^{20}$ $cm^{-3}$). The front surface portion of the impurity diffusion layer 213 refers to the range up to a depth on the order of 0 μm to 3 μm (more specifically, on the order of 1 μm) in the depth direction from the element forming surface 204 of the substrate 203.

Where the substrate 203 is the $n^+$-type silicon substrate, the $n^+$-type impurity diffusion layer 213 preferably has an impurity concentration equal to that of the $n^+$-type silicon substrate. That is, in this instance, the $n^+$-type silicon substrate and the $n^+$-type impurity diffusion layer 213 apparently constitute one n-type semiconductor substrate. At this time, the n-type semiconductor substrate (the $n^+$-type silicon substrate) preferably has the same impurity concentration profile (for example, $1\times10^{20}$ $cm^{-3}$) from the front surface portion toward the depth direction.

The first and second connection electrodes 228, 229 are formed spaced apart from each other on the substrate 203. The first connection electrode 228 is formed at the one end portion side of the substrate 203. The second connection electrode 229 is formed at the other end portion side of the substrate 203. The first and second connection electrodes 228, 229 are formed in a substantially rectangular shape in a plan view along the short sides 207 of the substrate 203.

On the element forming surface 204 of the substrate 203, a first capacitor region 204*a* and a second capacitor region 204*b* are partitioned in a quadrangular shape in a plan view with a crossline A crossing a central portion in a facing direction between the first and second connection electrodes 228, 229 as a boundary.

A silicon oxide film 214 as an example of a front surface insulating film is formed on the element forming surface 204 of the substrate 203. The silicon oxide film 214 has a first opening 215 to selectively expose the impurity diffusion layer 213 at the first capacitor region 204*a* and a second opening 216 to selectively expose the impurity diffusion layer 213 at the second capacitor region 204*b*. The thickness of the silicon oxide film 214 is, for example, 8000 Å to 12000 Å (10000 Å in the present reference example).

The first opening 215 is formed in a quadrangular shape in a plan view so as to extend from one end portion side of the substrate 203 to the other end portion side of the substrate 203 along the long side 206 and the short side 207 of the substrate 203 (see a broken line portion of FIG. 34).

The second opening 216 is formed spaced apart from the first opening 215, in the same shape and with the same area as the first opening 215. That is, the second opening 216 is formed in a quadrangular shape in a plan view so as to extend from the other end portion side of the substrate 203 to the one end portion side of the substrate 203 along the long side 206 and the short side 207 of the substrate 203 (see a broken line portion of FIG. 34). The first and second openings 215, 216 are opposed to each other with the crossline A therebetween.

A first dielectric film 217 covering the front surface of the impurity diffusion layer 213 exposed from the first opening 215, a second dielectric film 218 covering the front surface of the impurity diffusion layer 213 exposed from the second opening 216, a first upper electrode film 222 as an example of the first electrode covering the first dielectric film 217, and a second upper electrode film 225 as an example of the second electrode covering the second dielectric film 218 are formed on the substrate 203.

The first dielectric film 217 is in contact with the front surface of the impurity diffusion layer 213 and is formed in a quadrangular shape in a plan view so as to extend from the one end portion side of the substrate 203 toward the other end portion side. More specifically, the first dielectric film 217 is formed along the front surface of the impurity diffusion layer 213 to a lateral portion of the silicon oxide film 214, and includes an overlapping portion 217*a* covering the lateral portion and part of the upper portion of the silicon oxide film 214.

The second dielectric film 218 is formed in the same shape and with the same area as the first dielectric film 217. That is, the second dielectric film 218 is in contact with the front surface of the impurity diffusion layer 213 and is formed in a quadrangular shape in a plan view so as to extend from the other end portion side of the substrate 203 toward the one end portion side. More specifically, the second dielectric film 218 is formed along the front surface of the impurity diffusion layer 213 to a lateral portion of the silicon oxide film 214, and includes an overlapping portion 218*a* covering the lateral portion and part of the upper portion of the silicon oxide film 214. The first and second dielectric films 217, 218 in the present reference example have a laminated structure in which a plurality of insulating films are laminated. Hereinafter, the configuration of the first and second dielectric films 217, 218 will be described in detail with reference to FIG. 36.

Figure 36:
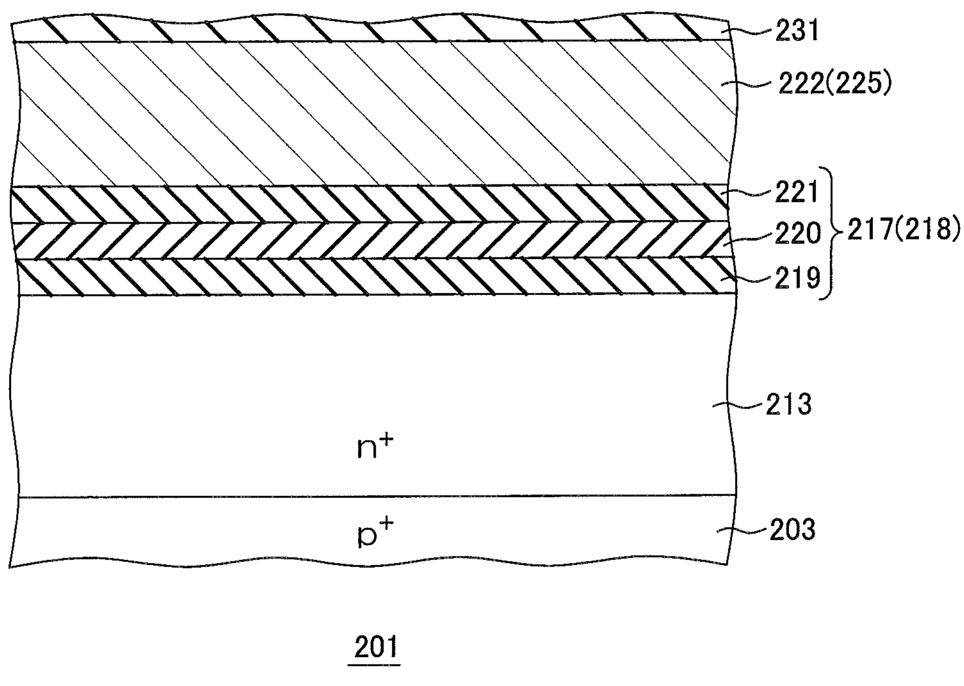
FIG. 36 is a sectional view in which a region including a dielectric film shown in FIG. 35 is enlarged.

FIG. 36 is a sectional view in which a region including the first dielectric film 217 shown in FIG. 35 is enlarged. The configuration of the second dielectric film 218 is equal to that of the first dielectric film 217. Therefore, in FIG. 36, the configuration of the first dielectric film 217 will be described, considered as including a description of the second dielectric film 218.

As shown in FIG. 36, the first dielectric film 217 (the second dielectric film 218) is an ONO film formed by laminating in the order of a bottom oxide film 219, a nitride film 220, and a top oxide film 221. The bottom oxide film 219 and the top oxide film 221 are composed of a $SiO_2$ film and the nitride film 220 is composed of a SiN film. The total thickness of the first dielectric film 217 (the second dielectric film 218) is preferably 120 Å to 700 Å. More specifically, the thickness of the bottom oxide film 219 may be, for example, 50 Å to 200 Å, and that of the nitride film 220 may be, for example, 20 Å to 300 Å, and that of the top oxide film 221 may be, for example, 50 Å to 200 Å.

The first dielectric film 217 (the second dielectric film 218) may be an oxide film instead of the ONO film. When the first dielectric film 217 (the second dielectric film 218) is composed of the oxide film, in the strict sense, the bottom oxide film 219 and the top oxide film 221 with the nitride film 220 removed from the above ONO film, each thickness of the oxide films 219, 221 is 200 Å to 260 Å.

The first upper electrode film 222 is formed following the planar shape of the first dielectric film 217. That is, the first upper electrode film 222 is formed in the same shape and with the same area as the first dielectric film 217 in a plan view. The first upper electrode film 222 is opposed to the impurity diffusion layer 213 with the first dielectric film 217 therebetween, and includes an overlapping portion 222*a* covering the lateral portion and part of the upper portion of the silicon oxide film 214.

The first upper electrode film 222 has a first pad region 223 and first base region 224 opposed to the impurity diffusion layer 213 with the first dielectric film 217 therebetween. That is, the first upper electrode film 222 in which the first pad region 223 and the first base region 224 are integrated, the first dielectric film 217, and the impurity diffusion layer 213 as the lower electrode constitute a first capacitor element C201 in the present reference example.

The second upper electrode film 225 is formed in the same shape and with the same area as the first upper electrode film 222. That is, the second upper electrode film 225 is formed in the same shape and with the same area as the second dielectric film 218, following the planar shape of the second dielectric film 218. The second upper electrode film 225 is opposed to the impurity diffusion layer 213 with the second dielectric film 218 therebetween, and includes an overlapping portion 225*a* covering the lateral portion and part of the upper portion of the silicon oxide film 214.

The second upper electrode film 225 has a second pad region 226 and second base region 227 opposed to the impurity diffusion layer 213 with the second dielectric film 218 therebetween. That is, the second upper electrode film 225 in which the second pad region 226 and the second base region 227 are integrated, the second dielectric film 218, and the impurity diffusion layer 213 as the lower electrode constitute a second capacitor element C202 in the present reference example. The second capacitor element C202 has a capacitance value equal to that of the first capacitor element C201.

The first and second upper electrode films 222, 225 are formed of the same conductive material. For example, the conductive material such as Al, AlCu, AlSiCu, etc., can be exemplified. The first and second upper electrode films 222, 225 are electrically separated on the silicon oxide film 214 by slits 230 rimming each peripheral edge portion of the first and second upper electrode films 222, 225.

On the silicon oxide film 214, a passivation film 231 and a resin film 232 are formed in this order so as to cover the first and second upper electrode films 222, 225. The passivation film 231 is also formed on lateral surfaces of the substrate 203. The passivation film 231 contains, for example, silicon nitride or USG (Undoped Silicate Glass), and the resin film 232 is composed of polyimide, for example. The passivation film 231 and the resin film 232 constitute protective films and suppress or prevent permeation of moisture into the first and second upper electrode films 222, 225 and the element forming surface 204, and also absorb external impact and contribute to an improvement in the durability of the discrete capacitor 201.

Pad openings 233, 234 to selectively expose the first and second pad regions 223, 226 are formed on the passivation film 231 and the resin film 232. First and second connection electrodes 228, 229 are formed so as to backfill the pad openings 233, 234.

The first connection electrode 228 is connected with the first pad region 223 of the first upper electrode film 222 at the one end portion side of the substrate 203. The second connection electrode 229 is connected with the second pad region 226 of the second upper electrode film 225 at the other end portion side of the substrate 203. The first and second connection electrodes 228, 229 are protruded from the front surface of the resin film 232 and have a front surface at a position higher than the resin film 232 (a position far from the substrate 203), and has an overlapping portion stretching from an opening end of the pad opening 233, 234 to the front surface of the resin film 232. Although illustrations are omitted in FIG. 35, the first and second connection electrodes 228, 229 have an Ni layer, a Pd layer, and an Au layer in this order from the element forming surface 204.

In each of the first and second connection electrodes 228, 229, the Ni layer constitutes a large part of each connection electrode, and the Pd layer and the Au layer are formed significantly thinly as compared to the Ni layer. The Ni layer has the role of relaying the conductive material of the first and second connection electrodes 228, 229 and solder when the discrete capacitor 201 is mounted on a mounting substrate. The first and second connection electrodes 228, 229 may have the front surface at a position lower than the front surface of the resin film 232 (a position nearer to the substrate 203).

<Manufacturing Method of Discrete Capacitor 201>

Figure 37:
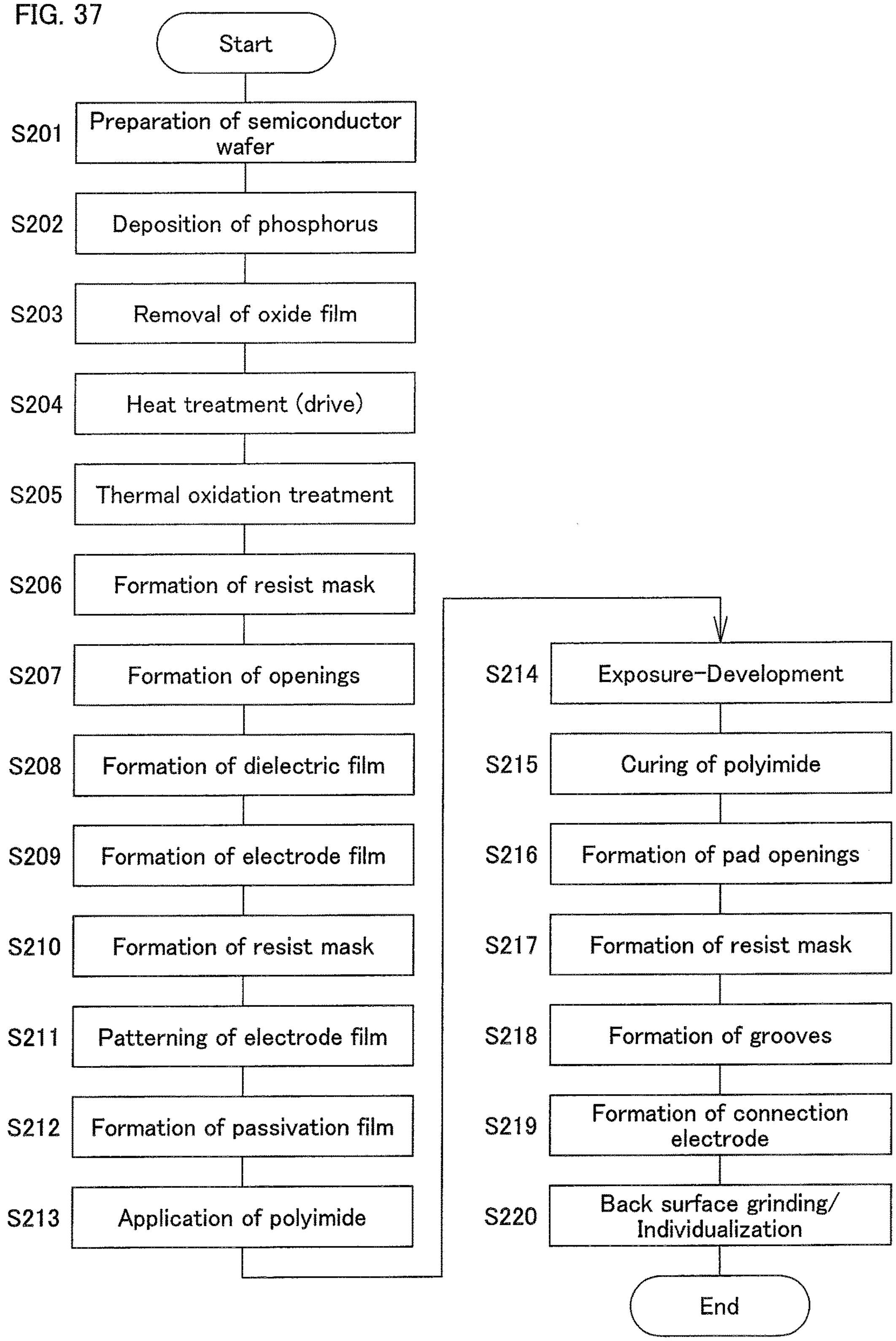
FIG. 37 is a flow chart for explaining a manufacturing method of the discrete capacitor shown in FIG. 33.
Figure 38:
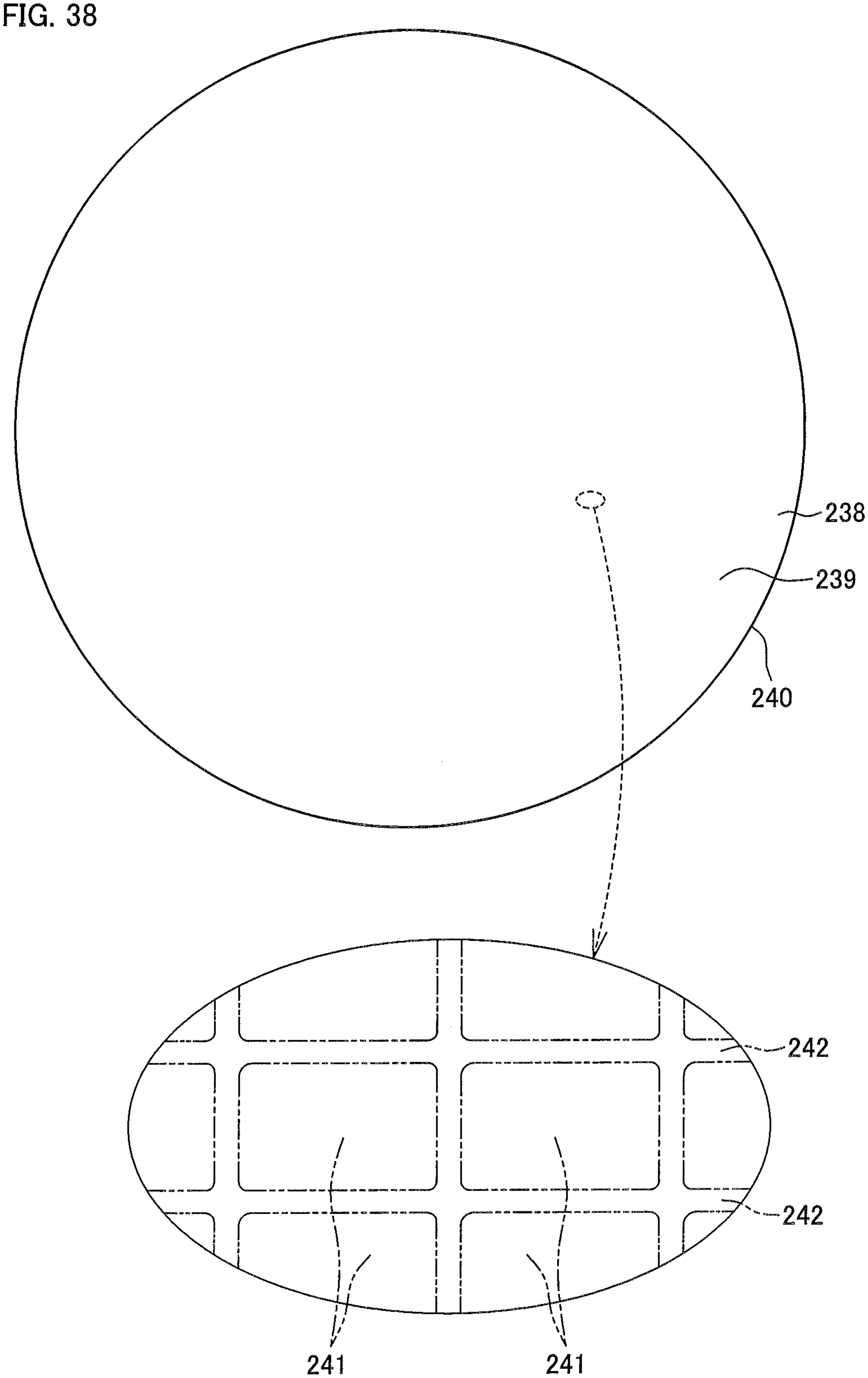
FIG. 38 is a schematic plan view of a semiconductor wafer applied to the manufacturing method shown in FIG. 37.

FIG. 37 is a flow chart for explaining the manufacturing method of the discrete capacitor 201 shown in FIG. 33. FIG. 38 is a schematic plan view of a semiconductor wafer 238 applied to the manufacturing method of FIG. 37. FIGS. 39A to 39H are schematic sectional views for explaining one process of the manufacturing method shown in FIG. 37.

Figure 39A:
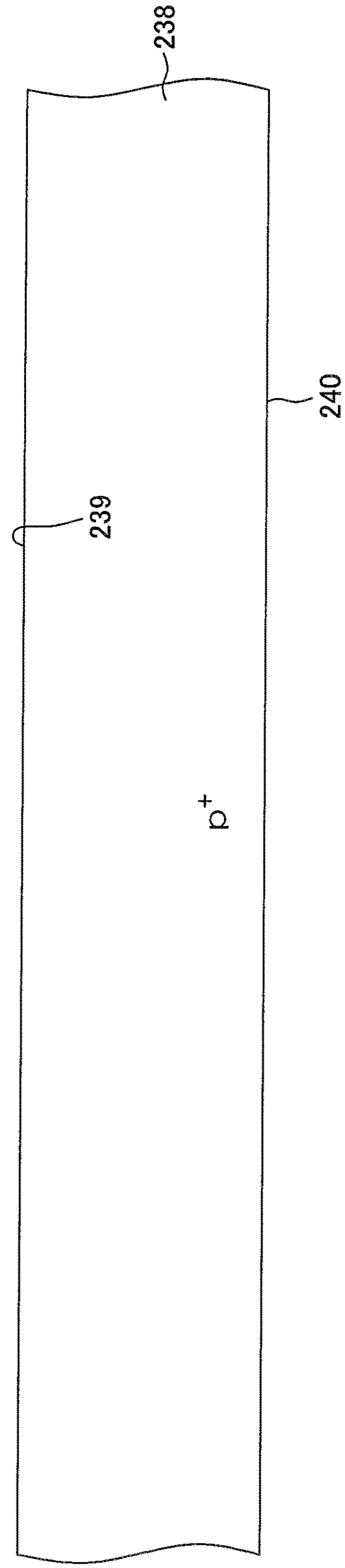
FIGS. 39A to 39H are schematic sectional views for explaining one process of the manufacturing method shown in FIG. 37.

First, a semiconductor wafer 238 as an original substrate of the substrate 203 is prepared (step S201: Preparation of semiconductor wafer) as shown in FIG. 38 and FIG. 39A. The semiconductor wafer 238 may be an $n^+$-type silicon wafer, an $n^-$-type silicon wafer, a $p^+$-type silicon wafer, or a $p^-$-type silicon wafer. In the present manufacturing method, an example of a $p^+$-type silicon wafer is shown.

A front surface 239 of the semiconductor wafer 238 corresponds to the element forming surface 204 of the substrate 203, and a back surface 240 of the semiconductor wafer 238 corresponds to the back surface 205 of the substrate 203. Chip regions 241 at which a plurality of the discrete capacitors 201 are formed are arrayed and configured in a matrix form on the front surface 239 of the semiconductor wafer 238. Boundary regions 242 are provided between mutually adjacent chip regions 241. The boundary regions 242 are a strip region having a substantially constant width, and extend in two orthogonal directions and are formed in a lattice form.

Figure 39B:
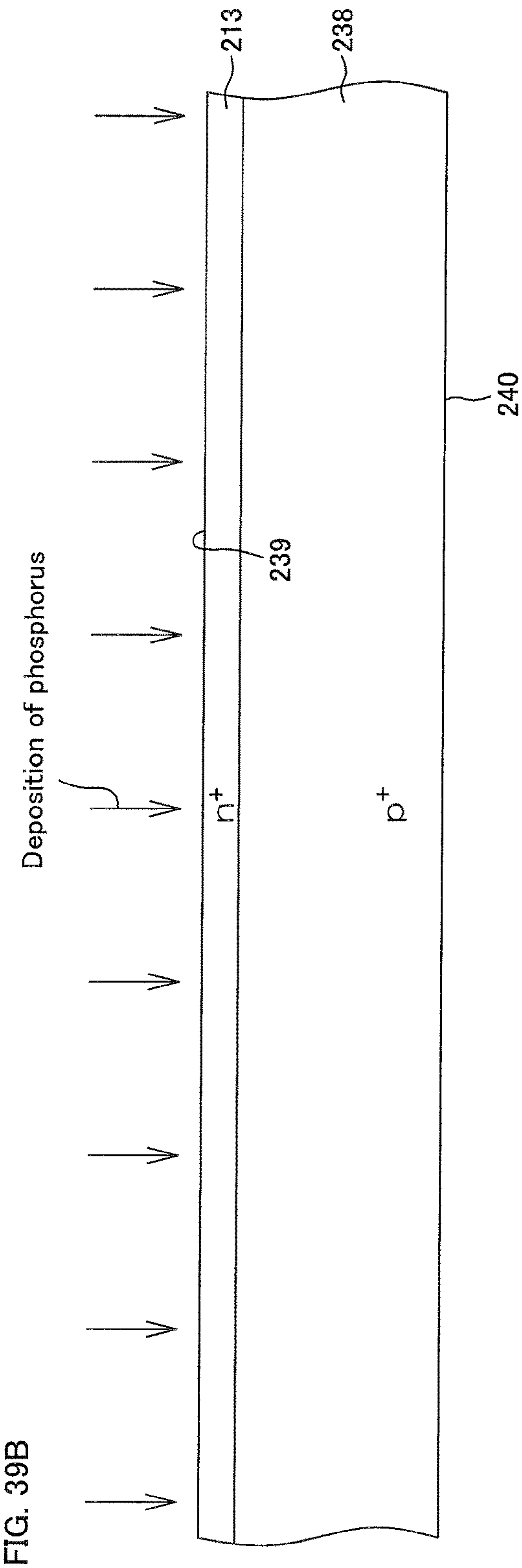

Subsequently, as shown in FIG. 39B, an n-type impurity is introduced to a front surface portion of the semiconductor wafer 238. The introduction of the n-type impurity is performed by a so-called phosphorus deposition step of depositing phosphorus (P) as the n-type impurity on the front surface 239 of the semiconductor wafer 238 (step S202: Deposition of phosphorus). The phosphorus deposition step is a process of carrying the semiconductor wafer 238 into a diffusion furnace and depositing phosphorus on the front surface 239 of the semiconductor wafer 238 through heat treatment that is performed flowing $POCl_3$ gas within the diffusion furnace. In the present reference example, such phosphorus deposition step is carried out under a temperature of 920° C. for 30 minutes. Subsequently, the oxide film (not shown) having been formed on the front surface 239 of the semiconductor wafer 238 through the phosphorus deposition step is removed by wet etching (step S203: Removal of oxide film). The etchant is hydrofluoric acid, for example.

Subsequently, heat treatment (drive-in treatment) for activating the n-type impurity having been introduced to the semiconductor wafer 238 is performed (step S204: Heat treatment (drive)). The drive-in treatment is such that dry treatment is carried out under a temperature of 900° C. for 10 minutes and wet treatment is carried out under a temperature of 1000° C. for 40 minutes and heat treatment is carried out in an atmosphere of a nitrogen gas under a temperature of 1050° C. for 2 hours. As a result, the impurity diffusion layer 213 having a predetermined depth is formed on the front surface portion of the semiconductor wafer 238.

Figure 39C:
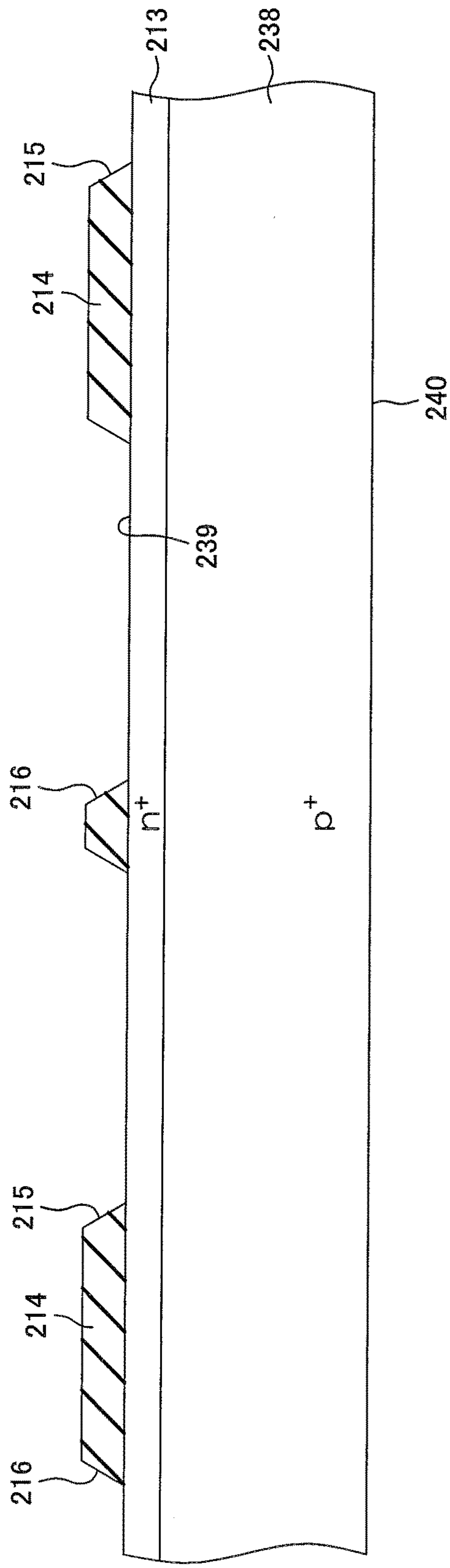

Subsequently, as shown in FIG. 39C, thermal oxidation treatment is applied to the front surface 239 of the semiconductor wafer 238 (step S205: Thermal oxidation treatment). The thermal oxidation treatment is carried out under a temperature of 950° C. to 1000° C. for 4 to 10 hours (at 1000° C. for 4 hours in the present reference example). As a result, the silicon oxide film 214 having a predetermined thickness (for example, a thickness of 10000 Å) is formed on the front surface 239 of the semiconductor wafer 238. Subsequently, a resist mask (not shown) is formed on the silicon oxide film 214 (step S206: Formation of resist mask). The first and second openings 215, 216 are formed in the silicon oxide film 214 by etching using the resist mask (step S207: Formation of openings).

Figure 39D:
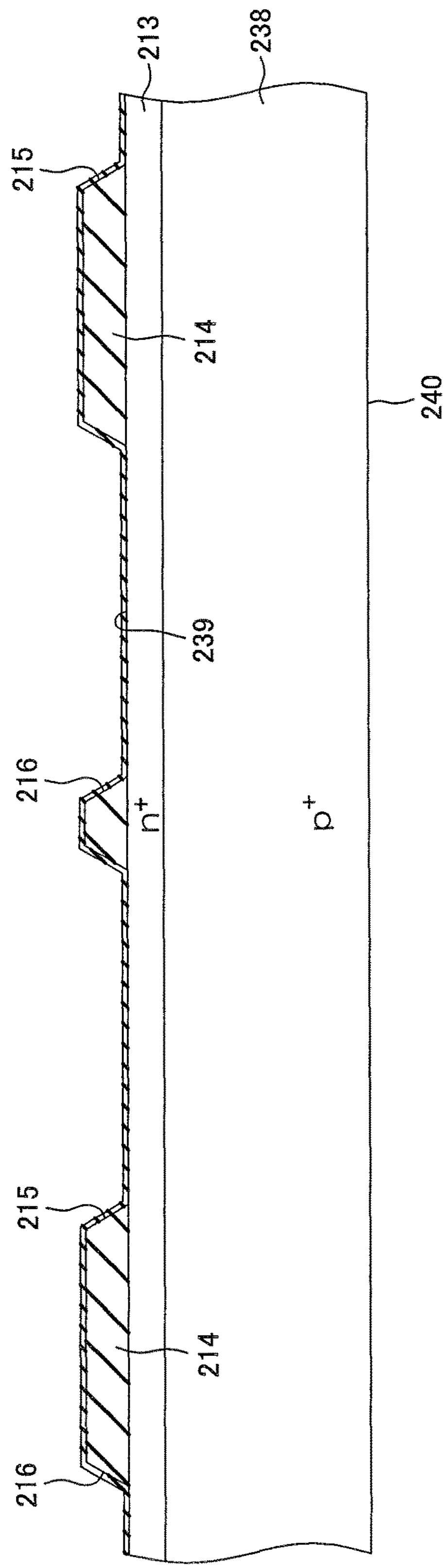

Subsequently, as shown in FIG. 39D, the bottom oxide film 219, the nitride film 220, and the top oxide film 221 (see FIG. 36 together) are deposited in this order and the dielectric film (ONO film) constituting the first and second dielectric films 217, 218 is formed on the entire front surface 239 of the semiconductor wafer 238 (step S208: Formation of dielectric film). The bottom oxide film 219 and the top oxide film 221 are formed by thermal oxidation treatment, and the nitride film 220 is formed by a CVD method.

Figure 39E:
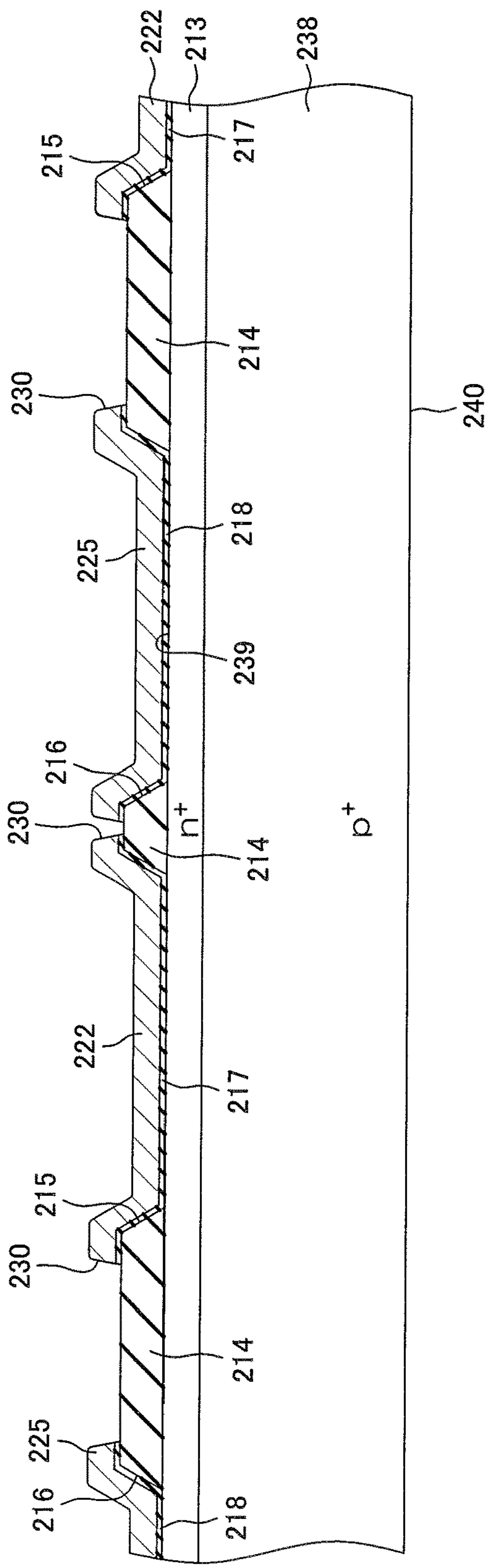

Subsequently, as shown in FIG. 39E, an electrode film constituting the first and second upper electrode films 222, 225 is formed on the semiconductor wafer 238 by sputtering (step S209: Formation of electrode film). In the present reference example, an electrode film composed of AlSiCu (for example, a thickness of 10000 Å) is formed. A resist mask (not shown) having an opening pattern corresponding to the slits 230 is then formed on the electrode film (step S210: Formation of resist mask). The electrode film and the dielectric film are collectively removed and the slits 230 are formed by etching (for example, reactive ion etching) through the resist mask (step S211: Patterning of electrode film). As a result, the electrode film is separated into the first and second upper electrode films 222, 225, and the dielectric film is separated into the first and second dielectric films 217, 218.

Figure 39F:
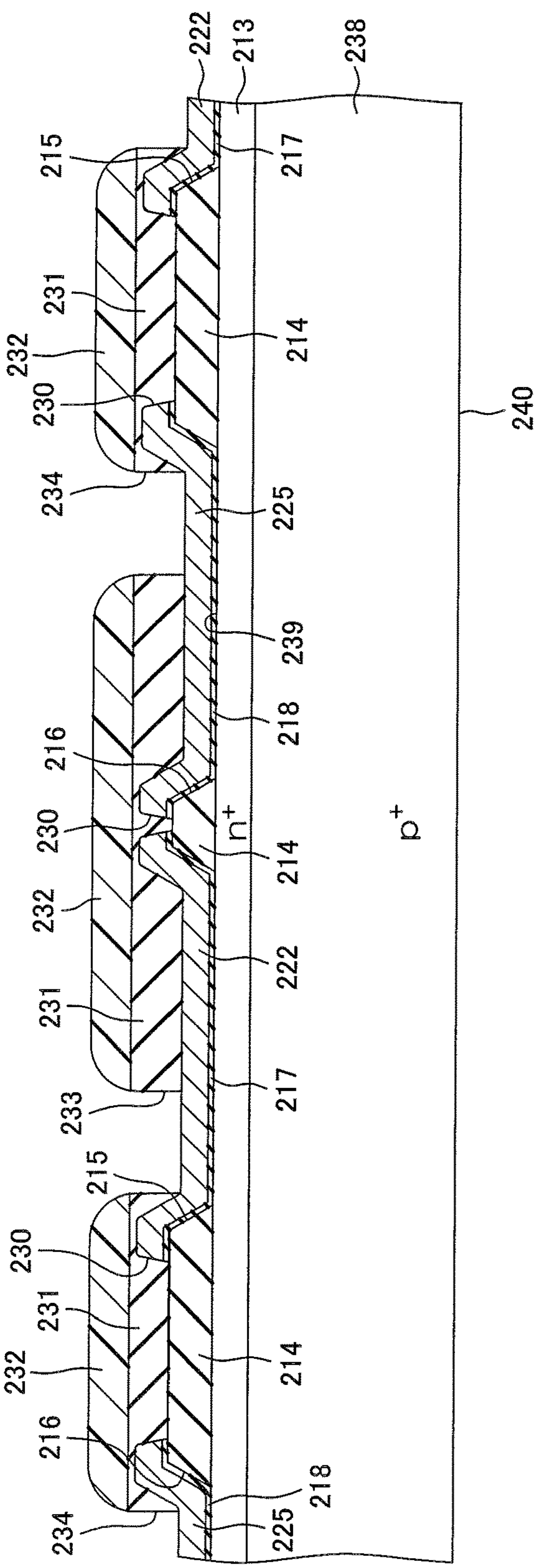

Subsequently, as shown in FIG. 39F, a passivation film 231 being a nitride film is formed by a CVD method for example, after the resist mask is peeled off (step S212: Formation of passivation film). Subsequently, photosensitive polyimide is applied to form the resin film 232 (step S213: Application of polyimide). Subsequently, the resin film 232 is exposed with a pattern corresponding to the pad openings 233, 234. Thereafter, the resin film 232 is developed (step S214: Exposure-Development). Subsequently, heat treatment for curing the resin film 232 is performed according to need (step S215: Curing of polyimide).

The passivation film 231 is then removed by dry etching (for example, reactive ion etching) with the resin film 232 as the mask (step S216: Formation of pad openings). As a result, the pad openings 233, 234 are formed.

Figure 39G:
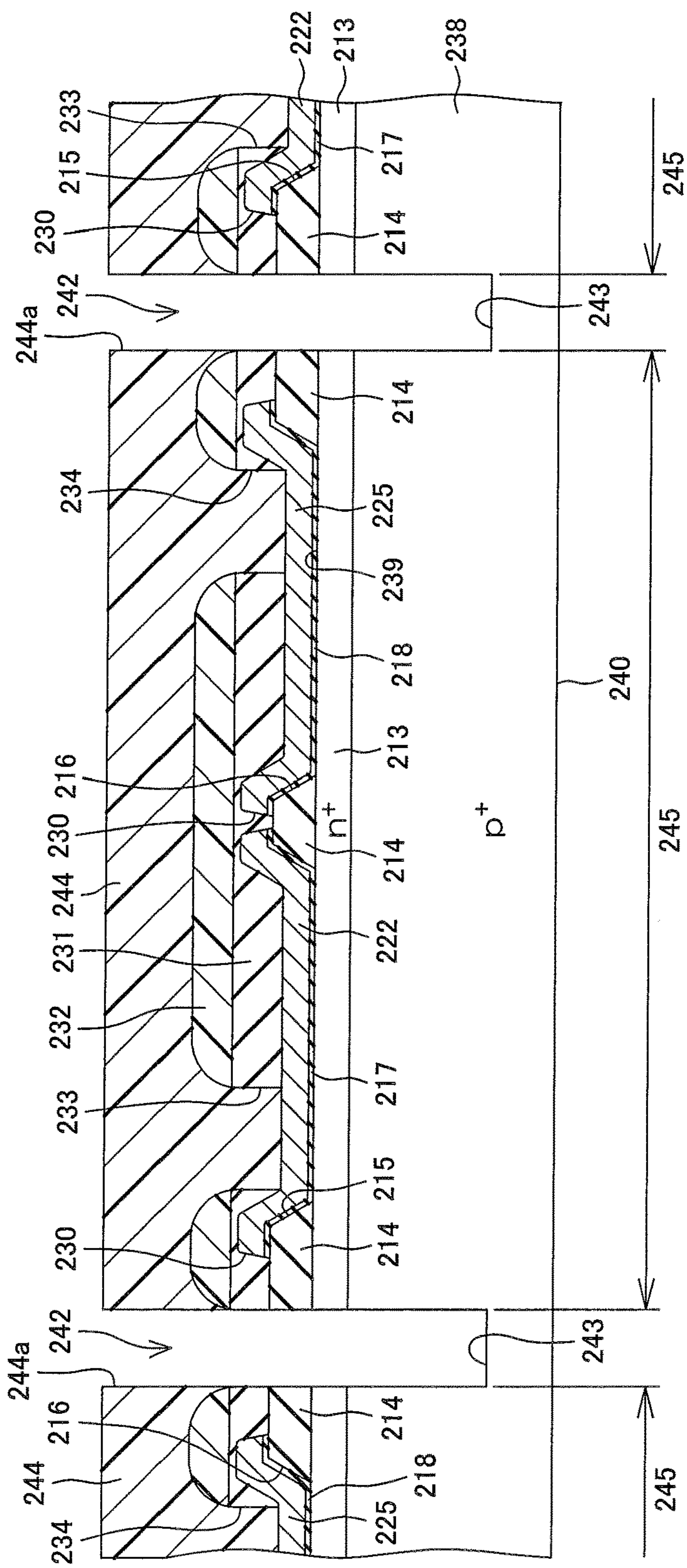

Subsequently, as shown in FIG. 39G, a resist mask 244 for forming cutting grooves 243 in boundary regions 242 (see FIG. 38 together) is formed (step S217: Formation of resist mask). The resist mask 244 has lattice openings 244*a* aligned with the boundary regions 242. Plasma etching is performed through the resist mask 244 (step S218: Formation of grooves). As a result, the semiconductor wafer 238 is etched to a predetermined depth from the front surface 239 and the cutting grooves 243 along the boundary regions 242 are formed.

Semi-finished products 245 are positioned one by one in the chip regions 241 surrounded by the cutting grooves 243. These semi-finished products 245 are aligned and arranged in a matrix form. Forming the cutting grooves 243 as above allows the semiconductor wafer 238 to be separated into a plurality of the chip regions 241. The resist mask 244 is peeled off after the cutting grooves 243 are formed.

Figure 39H:
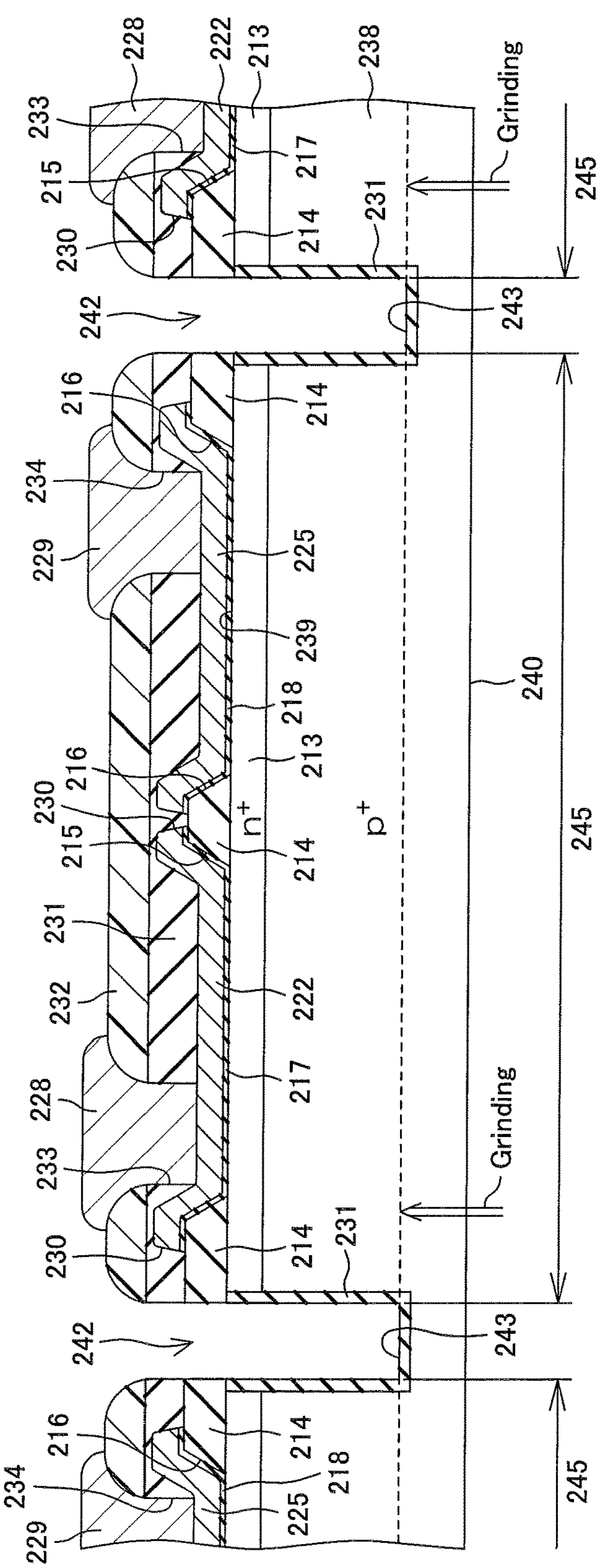

Subsequently, as shown in FIG. 39H, the passivation film 231 formed of USG is formed on inner peripheral surfaces (a bottom surface and lateral surfaces) of the cutting groove 243 by the CVD method. Subsequently, an Ni layer, a Pd layer, and an Au layer are film-formed by plating in this order so as to backfill the pad openings 233, 234 (step S219: Formation of connection electrode). As a result, the first and second connection electrodes 228, 229 are formed. Subsequently, the semiconductor wafer 238 is ground from the back surface 240 side until reaching the bottom surfaces of the cutting grooves 243 (step S220: Back surface grinding/Individualization). As a result, the plurality of chip regions 241 are individualized and the discrete capacitors 201 can be obtained.

As described above, if the semiconductor wafer 238 is ground from the back surface 205 side after the cutting grooves 243 are formed, the plurality of chip regions 241 formed on the semiconductor wafer 238 can be individualized all at once. Thus, an improvement in the productivity of the discrete capacitor 201 can be achieved by the reduction in manufacturing time. Further, the back surface 205 of the finished substrate 203 may be mirror-finished by polishing or etching to make the back surface 205 in excellent appearance.

The electrode film is separated into the first and second upper electrode films 222, 225, and at the same time, the dielectric film is separated into the first and second dielectric films 217, 218 in the electrode film patterning step of step S211. Accordingly, the first capacitor element C201 and the second capacitor element C202 are collectively formed, and thus, the manufacturing process is not complicated.

Respective capacitance values of such first and second capacitor elements C201 and C202 can be adjusted by changing respective areas of the first and second base regions 224, 227 opposed to the impurity diffusion layer 213. The respective areas of the first and second base regions 224, 227 can be adjusted by changing the layout of the resist mask in the resist mask formation step of step S210. Thus, for example, by reducing the respective areas of the first and second base regions 224, 227 opposed to the impurity diffusion layer 213 to half, the respective capacitance values of the first and second base regions 224, 227 can be reduced to half. Furthermore, by zeroing out the areas of the first and second base regions 224, 227, the respective capacitance values of the first and second capacitor elements C201 and C202 can be set at a capacitance value between the first or second pad region 223, 226 and the impurity diffusion layer 213.

Further, the impurity diffusion layer 213 also serving as the lower electrode is formed on the entire front surface portion of the semiconductor wafer 238. Thus, the whole of the first and second upper electrode films 222, 225 can be opposed to the impurity diffusion layer 213 reliably even if the first and second upper electrode films 222, 225 are formed displaced from design positions at the time of manufacturing. As a result, the discrete capacitor 201 resistant to variations in the design such as displacement and having various capacitance values can be easily manufactured and provided.

<Electrical Characteristics of Discrete Capacitor 201>

Figure 40:
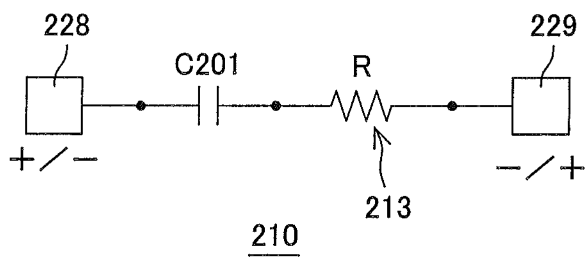
FIG. 40 is an electric circuit diagram of a discrete capacitor according to a reference example.
Figure 41:
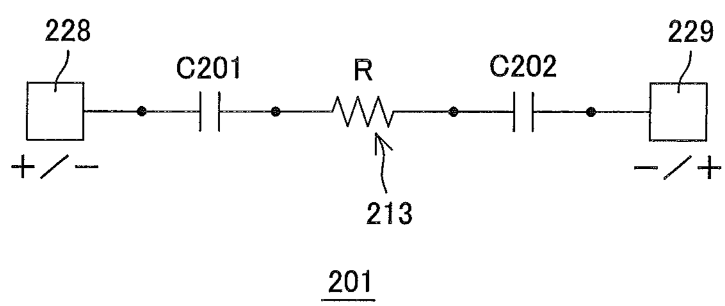
FIG. 41 is an electric circuit diagram of the discrete capacitor shown in FIG. 33.

Next, electrical characteristics of a discrete capacitor 210 according to a reference example and the discrete capacitor 201 according to the third reference example will be described respectively with reference to FIG. 40 and FIG. 41. FIG. 40 is an electric circuit diagram of the discrete capacitor 210 according to the reference example. FIG. 41 is an electric circuit diagram of the discrete capacitor 201 shown in FIG. 33.

How the discrete capacitor 210 according to the reference example differs from the discrete capacitor 201 is that the second dielectric film 218 is omitted and the second upper electrode film 225 and the impurity diffusion layer 213 are directly connected. With the discrete capacitor 210 according to the reference example, the first capacitor element C201 in which the first upper electrode film 222 opposed to the impurity diffusion layer 213 with the first dielectric film 217 therebetween is the upper electrode, and the impurity diffusion layer 213 is the lower electrode is formed.

In the case of the discrete capacitor 210 according to the reference example, as shown in the electric circuit diagram of FIG. 40, an internal resistance R of the impurity diffusion layer 213 is connected only to one of the electrodes (the second connection electrode 229 in FIG. 40) with respect to the first capacitor element C201. Thus, the configuration between the first and second connection electrodes 228, 229 is not symmetrical in terms of electric circuit.

That is, where the first connection electrode 228 is the positive electrode (+) and the second connection electrode 229 is the negative electrode (−), electrons pass through the internal resistance R from the second connection electrode 229 and are charged at the negative electrode side of the first capacitor element C201. On the other hand, where the first connection electrode 228 is the negative electrode (−) and the second connection electrode 229 is the positive electrode (+), electrons are charged at the negative electrode side of the first capacitor element C201 from the first connection electrode 228 without passing through the internal resistance R. Accordingly, when the polarity (+/−) of the first and second connection electrodes 228, 229 is reversed, a difference in moving path at the time when electrons (or positive holes) are charged at the negative electrode side (or the positive electrode side) of the first capacitor C201 is caused between before and after the reversal.

Accordingly, regarding the DC bias characteristics, the rate of change of the capacitance value with respect to DC bias when the first connection electrode 228 is the positive electrode (+) and the second connection electrode 229 is the negative electrode (−), and the rate of change of the capacitance value with respect to DC bias when the first connection electrode 228 is the negative electrode (−) and the second connection electrode 229 is the positive electrode (+) may sometimes differ greatly.

On the contrary, the discrete capacitor 201 includes the second capacitor element C202 in which the second upper electrode film 225 opposed to the impurity diffusion layer 213 with the second dielectric film 218 therebetween is the upper electrode and the impurity diffusion layer 213 is the lower electrode, in addition to the first capacitor element C201.

In the case of the discrete capacitor 201, as shown in the electric circuit diagram of FIG. 41, the first capacitor element C201 and the second capacitor element C202 are respectively connected to the first and second connection electrodes 228, 229 with the internal resistance R of the impurity diffusion layer 213 as the center.

Here, reference is made to FIG. 34 and FIG. 35. The first capacitor element C201 and the second capacitor element C202 are constructed of the first and second dielectric films 217, 218 and the first and second upper electrode films 222, 225 respectively opposing the impurity diffusion layer 213 in the same shape and with the same area (facing area). Further, the first and second dielectric films 217, 218 are formed in the same thickness. Furthermore, the first and second dielectric films 217, 218 and the first and second upper electrode films 222, 225 are configured to be point symmetrical with respect to the central portion (for example, the center of gravity) of the element forming surface 204 and formed line symmetrical with respect to the crossline A.

That is, it can be said that the first capacitor element C201 and the second capacitor element C202 have substantially the same capacitance value and the configuration between the first and second connection electrodes 228, 229 is symmetrical in terms of electric circuit. Even if the polarity (+/−) of the first and second connection electrodes 228, 229 is reversed, no difference is caused in moving path at the time when the electrons (or the positive holes) are charged at the negative electrode side (or the positive electrode side) of the first capacitor element C201 and the second capacitor element C202.

Accordingly, regarding the DC bias characteristics, the rate of change of the capacitance value with respect to DC bias when the first connection electrode 228 is the positive electrode (+) and the second connection electrode 229 is the negative electrode (−), and the rate of change of the capacitance value with respect to DC bias when the first connection electrode 228 is the negative electrode (−) and the second connection electrode 229 is the positive electrode (+) can be substantially equalized. As a result, the discrete capacitor 201 can be provided that is capable of preventing the rate of change of the capacitance value from differing greatly between before and after a reversal even if the polarity of the applied voltage is reversed.

As shown in FIG. 35, in addition to the first base region 224, the first pad region 223 is also opposed to the impurity diffusion layer 213 with the first dielectric film 217 therebetween. Similarly, in addition to the second base region 227, the second pad region 226 is also opposed to the impurity diffusion layer 213 with the second dielectric film 218 therebetween. Thus, the regions on the first and second openings 215, 216 can be used effectively and simultaneously each capacitance value of the first capacitor element C201 and the second capacitor element C202 can be increased effectively within the limited area.

Parasitic capacitance is formed between the impurity diffusion layer 213 and respective overlapping portions 222*a*, 225*a* of the first and second upper electrode films 222, 225 on the silicon oxide film 214. As already described, the impurity diffusion layer 213 and each overlapping portion 222*a*, 225*a* can be sufficiently spaced apart if the thickness of the silicon oxide film 214 is 8000 Å to 12000 Å. Since the capacitance value is inversely proportional to the distance (that is, the distance between the impurity diffusion layer 213 and each overlapping portion 222*a*, 225*a*), the capacitance component of the parasitic capacitance can be reduced effectively. As a result, the discrete capacitor 201 having the capacitance value with little error between a design value and a measured value can be provided.

Fourth Reference Example

Figure 42:
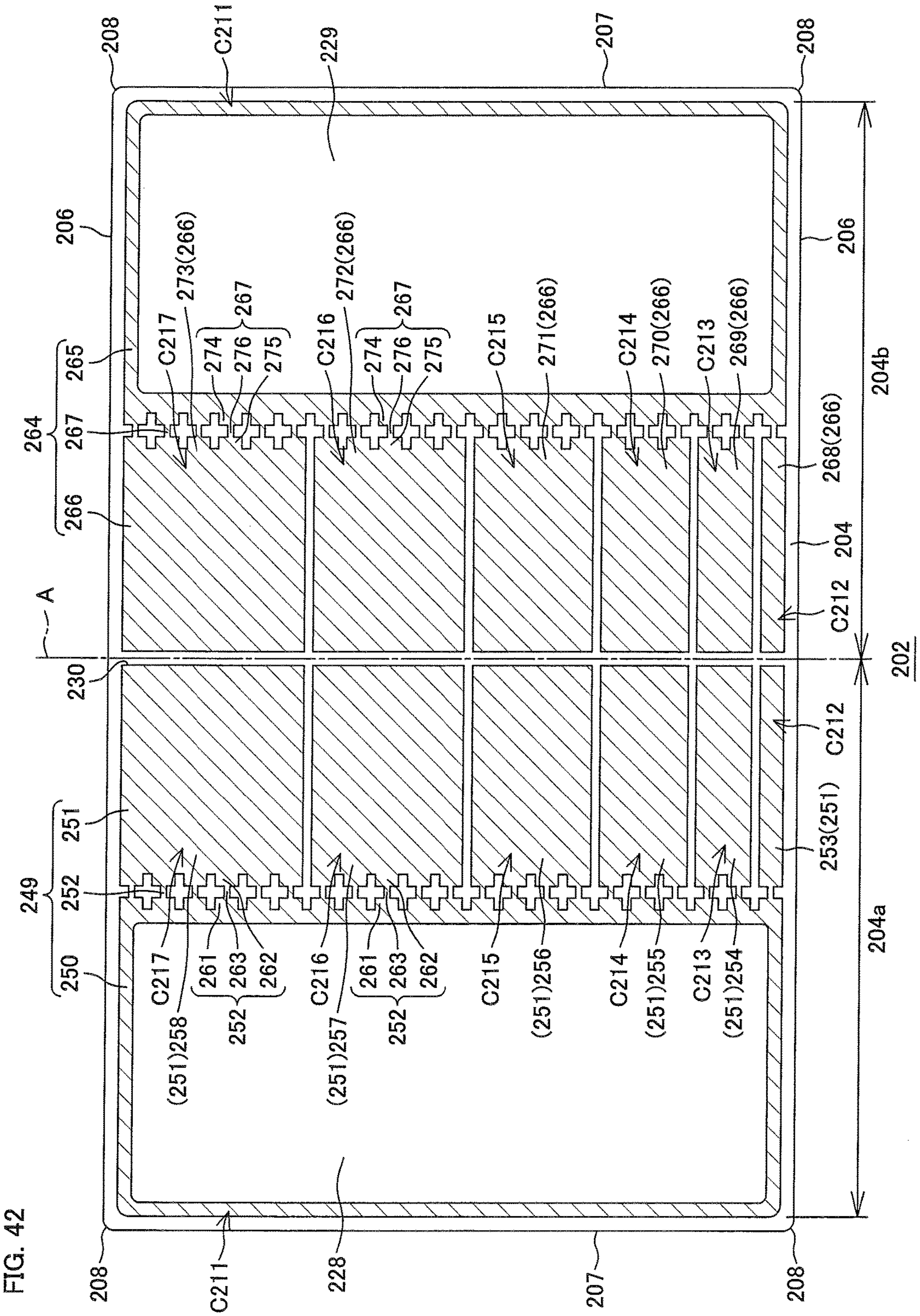
FIG. 42 is a schematic plan view of a discrete capacitor according to the fourth reference example.

FIG. 42 is a schematic plan view of a discrete capacitor 202 according to the fourth reference example.

How the discrete capacitor 202 differs from the foregoing discrete capacitor 201 according to the third reference example is that a first upper electrode film 249 is formed instead of the first upper electrode film 222, and that a second upper electrode film 264 is formed instead of the second upper electrode film 225. The other configurations are the same as those of the above discrete capacitor 201. In FIG. 42, parts respectively corresponding to the portions shown in the foregoing FIGS. 33 to 41 are given the same reference symbols.

The first upper electrode film 249 has a first pad region 250, a first base region 251 electrically connected to the first pad region 250, and a plurality of first fuses 252 formed along one long side (the long side at the crossline A side) of the first pad region 250 so as to connect the first pad region 250 and the first base region 251.

The first pad region 250 is formed in a rectangular shape along a short side 207 of the substrate 203 at one end portion side of the substrate 203, and is opposed to the impurity diffusion layer 213 with the foregoing first dielectric film 217 (ONO film) therebetween. To the first pad region 250, the first connection electrode 228 is connected.

The first base region 251 is divided (separated) into a plurality of first electrode film parts 253 to 258. The first electrode film parts 253 to 258 are each formed in a rectangular shape and extend in a strip shape from the first fuses 252 toward the second connection electrode 229. The first electrode film parts 253 to 258 are formed so as to extend from an edge of the first pad region 250 to positions adjacent to the crossline A via the first fuses 252. The plurality of first electrode film parts 253 to 258 are opposed to the impurity diffusion layer 213 with the first dielectric film 217 therebetween, with different kinds of facing areas.

The plurality of first electrode film parts 253 to 258 have facing areas set so as to form a geometric progression. More specifically, the facing areas of the first electrode film parts 253 to 258 with respect to the impurity diffusion layer 213 are determined to be 1:2:3:4:5:6 in the present reference example. The first electrode film parts 253 to 258 are formed in the strip shape where the length (width) in the longitudinal direction along the long side 206 of the substrate 203 is equal and the ratio in length in the short direction along the short side 207 of the substrate 203 is set to be 1:2:3:4:5:6.

It is a matter of course that the facing areas of the first electrode film parts 253 to 258 with respect to the impurity diffusion layer 213 may form a geometric progression with a common ratio of 2 or more. Further, the first base region 251 may be divided into electrode film parts more than the first electrode film parts 253 to 258 in number. The common ratio of the first electrode film parts 253 to 258 can be changed by adjusting the length in the longitudinal direction along the long side 206 of the substrate 203 of the first electrode film parts 253 to 258 and the length (width) in the short direction along the short side 207 of the substrate 203 of the first electrode film parts 253 to 258.

The plurality of first electrode film parts 253 to 258 are integrally formed with one or more first fuses 252 and electrically connected to the first connection electrode 228 via the first fuses 252 and the first pad region 250. Regarding the connection of the first electrode film parts 253 to 258 and the first pad region 250, all of the first fuses 252 need not be used, and a part of the first fuses 252 does not have to be in use.

The first fuse 252 includes a first wide portion 261 for connection with the first pad region 250, a second wide portion 262 for connection with the first electrode film part 253 to 258, and a narrow portion 263 connecting between the first and second wide portions 261, 262. The narrow portion 263 is arranged to be cut off (melt-cut) by laser light. Accordingly, an unnecessary first electrode film part 253 to 258 of the first electrode film parts 253 to 258 can be electrically separated from the first and second connection electrodes 228 by the cutting of the first fuse(s) 252.

The second upper electrode film 264 is formed in the same shape and with the same area as the first upper electrode film 249. More specifically, the second upper electrode film 264 has a second pad region 265, a second base region 266 electrically connected to the second pad region 265, and a plurality of second fuses 267 formed along one long side (the inner long side relative to the peripheral edge of the substrate 203) of the second pad region 265 so as to connect the second pad region 265 and the second base region 266.

The second pad region 265 is formed in a rectangular shape along the short side 207 of the substrate 203 at the other end portion side of the substrate 203, and is opposed to the impurity diffusion layer 213 with the foregoing second dielectric film 218 (ONO film) therebetween. To the second pad region 265, the second connection electrode 229 is connected.

The second base region 266 is divided (separated) into a plurality of second electrode film parts 268 to 273. The second electrode film parts 268 to 273 are each formed in a rectangular shape and extend in a strip shape from the second fuses 267 toward the first connection electrode 228. The second electrode film parts 268 to 273 are formed so as to extend from an edge of the second pad region 265 to positions adjacent to the crossline A via the second fuses 267. The plurality of second electrode film parts 268 to 273 are opposed to the impurity diffusion layer 213 with the above second dielectric film 218 (ONO film) therebetween, with different kinds of facing areas.

The plurality of second electrode film parts 268 to 273 have facing areas set so as to form a geometric progression. More specifically, the facing areas of the second electrode film parts 268 to 273 with respect to the impurity diffusion layer 213 are determined to be 1:2:3:4:5:6 in the present reference example. The second electrode film parts 268 to 273 are formed in the strip shape where the length in the longitudinal direction along the long side 206 of the substrate 203 is equal and the ratio in length (width) in the short direction along the short side 207 of the substrate 203 is set to be 1:2:3:4:5:6.

It is a matter of course that the second electrode film parts 268 to 273 may have a geometric progression with a common ratio of 2 or more. Further, the second base region 266 may be divided into electrode film parts more than the second electrode film parts 268 to 273 in number. The common ratio of the second electrode film parts 268 to 273 can be changed by adjusting the length in the longitudinal direction along the long side 206 of the substrate 203 of the second electrode film parts 268 to 273 and the length (width) in the short direction along the short side 207 of the substrate 203 of the second electrode film parts 268 to 273.

The plurality of second electrode film parts 268 to 273 are integrally formed with one or more second fuses 267 and electrically connected to the second connection electrode 229 via the second fuses 267 and the second pad region 265. Regarding the connection of the second electrode film parts 268 to 273 and the second pad region 265, all of the second fuses 267 need not be used, and a part of the second fuses 267 does not have to be in use.

The second fuse 252 includes a first wide portion 274 for connection with the second pad region 265, a second wide portion 275 for connection with the second electrode film part 268 to 273, and a narrow portion 276 connecting between the first and second wide portions 274, 275. The narrow portion 276 is arranged to be cut off (melt-cut) by laser light. Accordingly, an unnecessary second electrode film part 268 to 273 of the second electrode film parts 268 to 273 can be electrically separated from the second connection electrode 229 by the cutting of the second fuse(s) 267.

In this manner, the plurality of capacitor elements C211 to C217 having mutually different capacitance values are constructed of the first or second upper electrode film 249, 264 and the impurity diffusion layer 213 opposed thereto with the first or second dielectric film 217, 218 therebetween, correspondingly. The capacitor element C211 is constructed of the first or second pad region 223, 226 of the first or second upper electrode film 249, 264, the first or second dielectric film 217, 218, and the impurity diffusion layer 213, correspondingly. On the other hand, the capacitor elements C212 to C217 are constructed of the first electrode film parts 253 to 258 or second electrode film parts 268 to 273, and the first or second dielectric film 217, 218, correspondingly.

Figure 43:
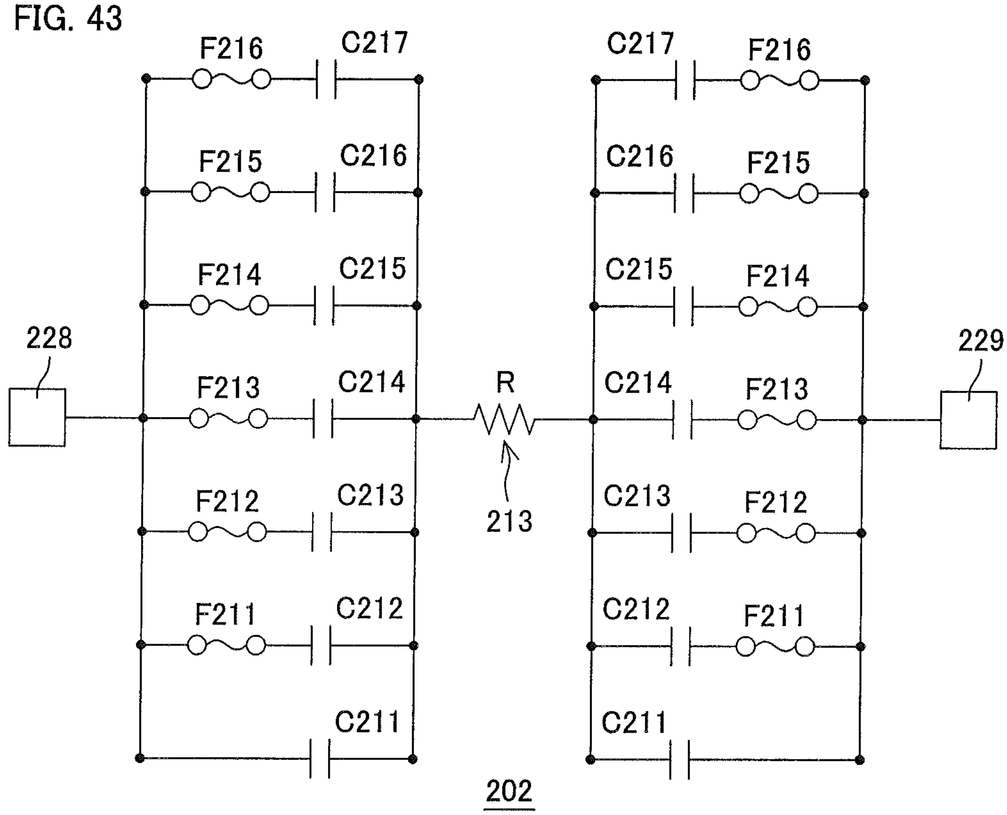
FIG. 43 is an electric circuit diagram of the discrete capacitor shown in FIG. 42.

FIG. 43 is an electric circuit diagram of the discrete capacitor 202 shown in FIG. 42.

As shown in FIG. 43, a plurality of capacitor elements C211 to C217 are connected in parallel to the first connection electrode 228. Similarly, a plurality of capacitor elements C211 to C217 are connected in parallel to the second connection electrode 229. The plurality of capacitor elements C211 to C217 connected to the first connection electrode 228 and the plurality of capacitor elements C211 to C217 connected to the second connection electrode 229 are respectively connected to the first and second connection electrodes 228, 229 with the internal resistance R of the impurity diffusion layer 213 as the center.

Fuses F211 to F216 each composed of one or more first fuses 252 are interposed in series between the first connection electrode 228 and each of the capacitor elements C212 to C217. Similarly, fuses F211 to F216 each composed of one or more second fuses 267 are interposed in series between the second connection electrode 229 and each of the capacitor elements C212 to C217.

On the other hand, no fuse is interposed between the capacitor element C211 and the first connection electrode 228 and between the capacitor element C211 and the second connection electrode 229, and the capacitor elements C211 are directly connected to the first and second connection electrodes 228, 229.

The capacitance value of the discrete capacitor 202 is one half of the sum total of the capacitance values of the capacitor elements C211 to C217 when the fuses F211 to F216 are all connected. When one or more than two first and second fuses 252, 267 selected from among the plurality of fuses F211 to F216 are cut, capacitor elements corresponding to the cut first and second fuses 252, 267 are disconnected. In this instance, targets to be cut are selected such that the capacitor elements C211 to C217 at the first connection electrode 228 side and the capacitor elements C211 to C217 at the second connection electrode 229 side are symmetrical. For example, when the fuses F212, F214 at the first connection electrode 228 side are the targets to be cut, the fuses F212, F214 at the second connection electrode 229 side become the targets to be cut. The capacitance value of the discrete capacitor 202 is decreased according to the cutting of the capacitor elements. When all of the fuses F211 to F216 are cut, the capacitance value of the discrete capacitor 202 is one half of the capacitance value of the capacitor element C211.

Accordingly, the capacitance value between the first and second upper electrode films 249, 264 (the total capacitance value of the capacitance elements C211 to C217) is measured, and thereafter, one or a plurality of first and second fuses 252, 267 properly selected from among the fuses F211 to F216 according to a desired capacitance value are melt-cut by laser light. By doing this, an adjustment to the desired capacitance value (laser trimming) can be carried out. In particular, when the capacitance values of the capacitor elements C212 to C217 are set to form a geometric progression, a fine adjustment of adjusting to the target capacitance value with a precision corresponding to the capacitance value of the capacitor element C212, which is the smallest capacitance value (the value of the first term of the geometric progression) is possible. Further, properly selecting the first and second fuses 252, 267 to be cut from among the fuses F211 to F216 allows the discrete capacitor 202 with a given capacitance value to be provided.

<Manufacturing Method of Discrete Capacitor 202>

Figure 44:
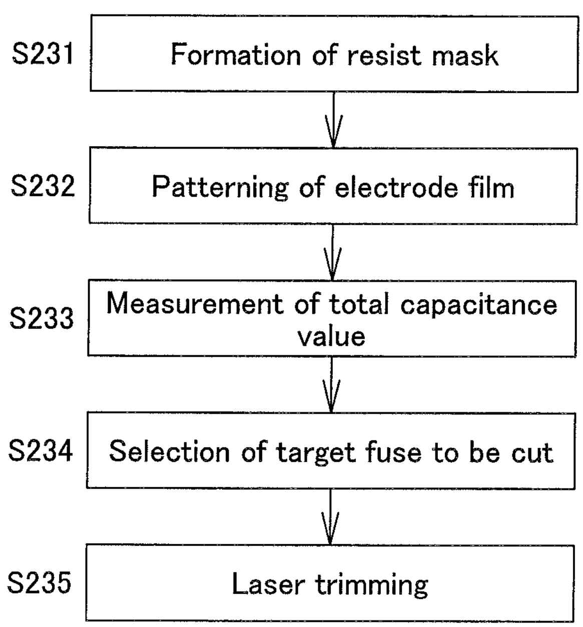
FIG. 44 is a flow chart for explaining a manufacturing method of the discrete capacitor shown in FIG. 42.

FIG. 44 is a flow chart for explaining the manufacturing method of the discrete capacitor 202 shown in FIG. 42.

To manufacture the discrete capacitor 202, steps of steps S231 to S235 shown in FIG. 44 only need to be performed instead of the resist mask formation step of step S210 and the electrode film patterning step of step S211 shown in FIG. 37.

That is, after the electrode film is formed at step S209, a resist mask corresponding to the final shape of the first and second upper electrode films 249, 264 is formed on the front surface of the electrode film (step S231: Formation of resist mask). The electrode film is shaped to the first and second upper electrode films 249, 264 by etching through the resist mask (step S232: Patterning of electrode film). The etching for patterning the electrode film may be performed by wet etching using an etchant such as phosphoric acid or may be performed by reactive ion etching.

Subsequently, an inspection probe is pressed against the first and second upper electrode films 249, 264 to measure the total capacitance value of the plurality of capacitor elements C211 to C217 (step S233: Measurement of total capacitance value). Based on the measured total capacitance value, capacitance elements to be disconnected, that is, first and second fuses 252, 267 to be cut are selected according to the intended capacitance value of the discrete capacitor 202 (step S234: Selection of target fuses to be cut).

Subsequently, a cover film composed of a nitride film, for example, is formed on the entire surface of the semiconductor wafer 238. The formation of the cover film may be performed by a plasma CVD method. The cover film covers the patterned first and second upper electrode films 249, 264 and covers the first and second dielectric films 217, 218 in regions where the first and second upper electrode films 249, 264 are not formed.

Laser trimming for melt-cutting the first and second fuses 252, 267 is performed from this state (step S235: Laser trimming). That is, laser light is applied to the first and second fuses 252, 267 selected according to the measurement result of the total capacitance value of the capacitor, and respective narrow portions 263, 276 of the first and second fuses 252, 267 are melt-cut. As a result, the corresponding capacitor elements are disconnected from the first and second pad regions 223, 226. When the laser light is applied to the first and second fuses 252, 267, energy of the laser light is accumulated in the vicinity of the first and second fuses 252, 267 by the action of the cover film, whereby the first and second fuses 252, 267 are melt-cut.

With the discrete capacitor 202, as described above, the capacitor elements C211 directly connected to the first and second connection electrodes 228, 229 are provided directly below the first and second connection electrodes 228, 229 as shown in FIG. 42 and FIG. 43. Further, the plurality of capacitor elements C212 to C217 disconnectable by the fuses F211 to F216 are respectively provided between the first and second connection electrodes 228, 229. The capacitor elements C212 to C217 include a plurality of capacitor elements with different capacitance values, more specifically, a plurality of capacitor elements with capacitance values set to form a geometric progression. As a result, the discrete capacitor 202 can be provided that is capable of accommodating different types of capacitance values without changing the design and capable of accurately adjusting to the desired capacitance value by selecting one or a plurality of first and second fuses 252, 267 from among the fuses F211 to F216 and melt-cutting the same by laser light.

As described above, the preferred embodiments and modes according to the reference examples of the present invention have been described. However, they can also be carried out by other modes.

For example, an ion implantation method that implants (dopes) the n-type impurity on the front surface of the semiconductor wafer 38 may be employed in place of the first phosphorus deposition step of step S2 in the foregoing first and second manufacturing methods according to the first and second preferred embodiments. Similarly, the ion implantation method that implants (dopes) the n-type impurity on the front surface of the semiconductor wafer 38 may be employed in place of the second phosphorus deposition step of step S24 in the second manufacturing method.

In this connection, the first and second phosphorus deposition steps can diffuse the impurity from the front surface 39 of the semiconductor wafer 38, so that the impurity concentration on the front surface portion of the impurity diffusion layer 13 is easily increased as compared to the ion implantation method. Therefore, it can be said that the first and second phosphorus deposition steps are preferred.

Further, in the foregoing second manufacturing method according to the first and second preferred embodiments, an example that the dielectric film 17 composed of the bottom oxide film 19 and the top oxide film 21 is formed at the dielectric film formation step of step S25 has been described. However, an ONO film having a thickness similar to that in the first manufacturing method may be formed.

Further, an example that the impurity diffusion layer 13 is formed throughout the entire front surface portion of the substrate 3 has been described in the foregoing first and second preferred embodiments. However, the impurity diffusion layer 13 only needs to be formed at least on regions opposed to all over the upper electrode film 22, 49 and contact electrode film 25.

Further, an example of the first and second connection electrodes 28, 29 composed of the Ni layer, the Pd layer, and the Au layer has been described in the foregoing first and second preferred embodiments. However, the first and second connection electrodes 28, 29 may be composed of any one of the Ni layer, the Pd layer, and the Au layer.

In the foregoing first and second preferred embodiments, the first or second connection electrode 28 or 29, and the upper electrode film 22, 49 or contact electrode film 25 may be electrically connected on the silicon oxide film 14 through the use of respective overlapping portions 22*a*, 25*a* of the upper electrode film 22, 49 and the contact electrode film 25. With such a configuration, the same effects as those described in the first and second preferred embodiments can be performed as well.

An example that the silicon oxide film 114 is formed on the substrate 103 as an example of the front surface insulating film has been described in the first and second reference examples. However, a nitride film such as SiN, an aluminum oxide ($Al_2O_3$) film, etc., may be employed instead of the silicon oxide film 114. In this instance, an insulating material only needs to be deposited on the substrate 103 by a CVD method, instead of the thermal oxidation treatment of step S105.

Further, an example that the silicon oxide film 114 is formed has been described in the first and second reference examples. However, the silicon oxide film 114 does not need to be formed as long as it is the mode that electrically separates the upper electrode film 122 and the contact electrode film 125. In this instance, for example, the passivation film 131 may be buried in the slits 130 separating the upper electrode film 122 and the contact electrode film 125 thereby to electrically separate the upper electrode film 122 and the contact electrode film 125.

An example that the impurity diffusion layer 113 is formed throughout the entire front surface portion of the substrate 103 has been described in the foregoing first and second reference examples. However, the impurity diffusion layer 113 only needs to be formed at least on regions opposed to all over the upper electrode film 122 and the contact electrode film 125.

Further, an example of the first and second connection electrodes 128, 129 composed of the Ni layer, the Pd layer, and the Au layer has been described in the first and second reference examples. However, the first and second connection electrodes 128, 129 may be composed of any one of the Ni layer, the Pd layer, and the Au layer.

In the foregoing first and second reference examples, the first or second connection electrode 128, 129, and the upper electrode film 122, 149 or contact electrode film 125 may be arranged to be electrically connected on the silicon oxide film 114 through the use of respective overlapping portions 122*a*, 125*a* of the upper electrode film 122, 149 and the contact electrode film 125. With such a configuration, the same effects as those described in the first and second reference examples can be performed as well.

An example that the silicon oxide film 214 is formed on the substrate 203 as an example of the front surface insulating film has been described in the third and fourth reference examples. However, a nitride film such as SiN, an aluminum oxide ($Al_2O_3$) film, etc., may be employed instead of the silicon oxide film 214. In this instance, an insulating material only needs to be deposited on the substrate 203 by a CVD method, instead of the thermal oxidation treatment of step S205.

Further, an example that the silicon oxide film 214 is formed has been described in the third and fourth reference examples. However, the silicon oxide film 214 does not need to be formed as long as it is the mode that electrically separates the first and second upper electrode films 222, 225. For example, the passivation film 231 is buried in the slits 230 separating the first and second upper electrode films 222, 225, thereby allowing the first and second upper electrode films 222, 225 to be electrically separated.

An example that the impurity diffusion layer 213 is formed throughout the entire front surface portion of the substrate 203 has been described in the third and fourth reference examples. However, the impurity diffusion layer 213 only needs to be formed at least on regions opposed to all over the first and second upper electrode films 222, 225 (the first and second upper electrode films 249, 264).

Further, an example of the first and second connection electrodes 228, 229 composed of the Ni layer, the Pd layer, and the Au layer has been described in the third and fourth reference examples. However, the first and second connection electrodes 228, 229 may be composed of any one of the Ni layer, the Pd layer, and the Au layer.

In the third and fourth reference examples, an example that the first and second dielectric films 217, 218, and the first and second upper electrode films 222, 225 (the first and second upper electrode films 249, 264) are formed line symmetrical with respect to the crossline A has been described. However, the first and second dielectric films 217, 218, and the first and second upper electrode films 222, 225 (the first and second upper electrode films 249, 264) do not have to be line symmetrical with respect to the crossline A.

More specifically, the first and second dielectric films 217, 218 and the first and second upper electrode films 222, 225 (the first and second upper electrode films 249, 264) may be formed in any shape as long as the capacitor element(s) C201, C211 to C217 at the first connection electrode 228 side and the capacitor element(s) C202, C211 to C217 at the second connection electrode 229 side are symmetrical.

For example, the first and second dielectric films 217, 218 and the first and second upper electrode films 222, 225 (the first and second upper electrode films 249, 264) may be formed so as to cross the crossline A. In this instance, the first and second dielectric films 217, 218 and the first and second upper electrode films 222, 225 (the first and second upper electrode films 249, 264) may be formed to extend in the longitudinal direction along the long side 206 of the substrate 203 so as to cross the crossline A, and to adjoin each other in a direction orthogonal to the longitudinal direction. Furthermore, in this instance, the first and second dielectric films 217, 218 and the first and second upper electrode films 222, 225 (the first and second upper electrode films 249, 264) may be formed so as to be parallel in the longitudinal direction.

Further, in the third and fourth reference examples, the first or second connection electrode 228, 229 and the first or second upper electrode film 222, 225 (the first or second upper electrode film 249, 264) may be arranged to be electrically connected on the silicon oxide film 214 through the use of respective overlapping portions 222*a*, 225*a* of the first and second upper electrode films 222, 225 (the first and second upper electrode films 249, 264). With such a configuration, the same effects as those described in the third and fourth reference examples can be performed as well.

The discrete capacitor 1, 2, 101, 102, 201, or 202 can be installed in electronic equipment, for example, portable electronic equipment such as a mobile device, as an element for a power supply circuit, a high-frequency circuit, or a digital circuit. In this instance, the electronic equipment includes a case which accommodates a circuit assembly on which the discrete capacitor 1, 2, 101, 102, 201, or 202 is mounted. In other words, the circuit assembly employed in the electronic equipment includes a mounting substrate and the discrete capacitor 1, 2, 101, 102, 201, or 202 mounted on the mounting substrate. At this moment, the discrete capacitor 1, 2, 101, 102, 201, or 202 may be connected (surface-mounted) to the mounting substrate by wireless bonding.

Besides, various design modifications can be made within the scope of the matter described in the claims. Features extracted from this specification and the drawings will be presented below.

For example, referring to FIG. 19, a discrete capacitor having a feature presented in A1 below can be extracted.

A1: A discrete capacitor including a substrate having a front surface portion, an impurity diffusion layer formed on the front surface portion of the substrate, an oxide film formed on the substrate and having a first opening to selectively expose the impurity diffusion layer, a dielectric film formed on the impurity diffusion layer having been exposed from the oxide film, and a first electrode formed on the substrate and opposed to the impurity diffusion layer with the dielectric film therebetween, wherein the thickness of the dielectric film is 800 Å or more.

With this configuration, the rate of change of the capacitance value with respect to DC bias can be approximated to 0%. Further, the capacitance value of the discrete capacitor may be 4 pF to 12 pF where the thickness of the dielectric film is 800 Å to 3000 Å. With this configuration, a small discrete capacitor excellent in the characteristics of the rate of change of the capacitance value with respect to DC bias can be provided.

Referring to FIGS. 20 to 32, discrete capacitors having features presented in B1 to B18 below can be extracted in the case of intending to provide a discrete capacitor capable of realizing excellent ESD (Electrostatic Discharge) resistance in the HBM (Human Body Model) test.

B1: A discrete capacitor including a substrate having a front surface portion, an impurity diffusion layer formed on the front surface portion of the substrate, an ONO film formed on the impurity diffusion layer and obtained by laminating in the order of a bottom oxide film, a nitride film, and a top oxide film, and a first electrode formed on the substrate and opposed to the impurity diffusion layer with the ONO film therebetween, wherein the thickness of the bottom oxide film in the ONO film is 110 Å or less.

With this configuration, a discrete capacitor in which the first electrode opposed to the impurity diffusion layer with the ONO film as the dielectric film therebetween is the upper electrode and the impurity diffusion layer is the lower electrode is formed.

One of the electrical characteristics of the discrete capacitor is the ESD (Electrostatic Discharge) resistance in the HBM (Human Body Model) test (hereinafter, simply referred to as an "ESD resistance"). The HBM test is a model for testing the state of electrostatic discharge of static electricity having been accumulated in human body due to electrostatic charge, to a device. The device applied to this test preferably has high ESD resistance.

The ESD resistance of the discrete capacitor relies heavily on the thickness of the bottom oxide film in the ONO film. That is, the value of the ESD resistance varies by changing the thickness of the bottom oxide film. Accordingly, as in the configuration described in B1, the thickness of the bottom oxide film is set at 110 Å or less, whereby a discrete capacitor capable of realizing an ESD resistance of 700V or more can be provided.

B2: The discrete capacitor according to B1, wherein the thickness of the bottom oxide film in the ONO film is 50 Å or more.

B3: The discrete capacitor according to B1 or B2, wherein the thickness of the ONO film is 150 Å to 430 Å and the thickness of the nitride film in the ONO film is 50 Å to 270 Å.

The ESD resistance also relies on the thickness of the nitride film in the ONO film. For example, an ESD resistance of 1000V can be realized where the thickness of the bottom oxide film in the ONO film is 110 Å and the thickness of the nitride film is 165 Å. On the other hand, an ESD resistance of 1300V can be realized where the thickness of the bottom oxide film in the ONO film is 110 Å and the thickness of the nitride film is 270 Å. Further, an ESD resistance of 2000V can be realized where the thickness of the bottom oxide film in the ONO film is 55 Å and the thickness of the nitride film is 165 Å. On the other hand, the ESD resistance becomes 1400V where the thickness of the bottom oxide film in the ONO film is 55 Å and the thickness of the nitride film is 270 Å. That is, a thickness range which contributes to an increase in ESD resistance and a thickness range which does not contribute to an increase in ESD resistance exist in the thickness of the nitride film.

On the other hand, the capacitance value of the capacitor is inversely proportional to the distance between the impurity diffusion layer and the first electrode (that is, the thickness of the ONO film), and thus, the capacitance value is reduced when the ONO film is thickened. Accordingly, as in the configuration described in B3, the ONO film is arranged to have 150 Å to 430 Å in thickness and the thickness of the nitride film is set at 50 Å 270 Å, whereby a reduction in capacitance value of the capacitor can be suppressed and also an ESD resistance of 700V to 2000V can be realized.

B4: The discrete capacitor according to any one of B1 to B3, wherein the ESD resistance in the HBM (Human Body Model) test is 700V to 2000V.

B5: The discrete capacitor according to B1, wherein the thickness of the nitride film in the ONO film is 20 Å to 100 Å.

One of the electrical characteristics of the discrete capacitor is temperature characteristics. The temperature characteristics indicate the rate of change of the capacitance value with respect to changes in temperature. With increase in temperature, the capacitance value changes in an increasing direction in the discrete capacitor. Thus, in order to provide a discrete capacitor having excellent reliability, the rate of change of the capacitance value is preferably low with respect to changes in temperature.

Accordingly, as in the configuration described in B5, the thickness of the nitride film in the ONO film is set at 20 Å to 100 Å, whereby the ONO film having a temperature coefficient of resistance of 25 ppm/° C. to 40 ppm/° C. can be formed. If within the range of these numerical values, the rate of change of the capacitance value $\Delta Cp$ at the normal temperature to a temperature of 150° C. can be kept at 0.5% or less. As a result, a discrete capacitor having excellent temperature characteristics can be provided. The temperature coefficient of resistance of the ONO film is specified in parts per million of variation in capacitance value per ° C.

B6: The discrete capacitor according to B5, wherein the thickness of the nitride film in the ONO film is 50 Å or more.

With this configuration, an ESD resistance of 700V to 1400V can be achieved. Thus, a discrete capacitor resistant to changes in temperature and having excellent reliability can be provided.

B7: The discrete capacitor according to any one of B1, B5, and B6, wherein the temperature coefficient of resistance of the ONO film is 25 ppm/° C. to 40 ppm/° C.

B8: The discrete capacitor according to any one of B1 to B7, further including a front surface insulating film formed on the substrate and having a first opening to selectively expose the impurity diffusion layer.

B9: The discrete capacitor according to B8, wherein the first electrode includes a pad region formed on the first opening and connected with an external electrode.

With this configuration, the pad region to which the external electrode is connected is formed on the first opening, and thus the region on the first opening can be used effectively.

B10: The discrete capacitor according to B8 or B9, wherein the thickness of the front surface insulating film is 8000 Å to 12000 Å.

With this configuration, even if part of the first electrode overlaps on the front surface insulating film and parasitic capacitance is formed between the overlapping portion and the impurity diffusion layer, the overlapping portion of the first electrode and the impurity diffusion layer can be spaced apart sufficiently. Since the capacitance value of the capacitor is inversely proportional to the distance (that is, the distance between the impurity diffusion layer and the overlapping portion of the first electrode), this can effectively reduce the capacitance component of the parasitic capacitance. As a result, a discrete capacitor having the capacitance value with little error between a design value and a measured value can be provided.

B11: The discrete capacitor according to any one of B8 to B10, wherein the front surface insulating film further includes a second opening formed spaced apart from the first opening, and the impurity diffusion layer extends to a region directly below the second opening, and a second electrode formed of the same conductive material as the first electrode and directly connected with the impurity diffusion layer via the second opening is further included.

B12: The discrete capacitor according to any one of B1 to B11, wherein the substrate is an n-type semiconductor substrate, and the impurity diffusion layer is a region to which an n-type impurity is introduced.

B13: The discrete capacitor according to any one of B1 to B11, wherein the substrate is a p-type semiconductor substrate, and the impurity diffusion layer is a region to which an n-type impurity is introduced.

B14: The discrete capacitor according to any one of B1 to B13, wherein the impurity diffusion layer is formed on the entire front surface portion of the substrate.

With this configuration, the impurity diffusion layer also serves as the contact electrode film, and thus, the whole of the first electrode can be opposed to the impurity diffusion layer reliably even if the first electrode is formed displaced from a design position at the time of manufacturing. Accordingly, a discrete capacitor resistant to variations in the design such as the displacement can be provided.

B15: A discrete capacitor including an n-type semiconductor substrate, an ONO film formed on the semiconductor substrate and obtained by laminating in the order of a bottom oxide film, a nitride film, and a top oxide film, and a first electrode opposed to the semiconductor substrate with the ONO film therebetween, wherein the thickness of the bottom oxide film in the ONO film is 110 Å or less.

With this configuration, a discrete capacitor in which the first electrode opposed to the n-type semiconductor substrate with the ONO film as the dielectric film therebetween is the upper electrode and the n-type semiconductor substrate is the lower electrode is formed. With such a configuration, the same effects as those of the discrete capacitor according to B1 can be performed as well.

B16: The discrete capacitor according to B15, wherein the semiconductor substrate has the same impurity concentration profile from a front surface portion thereof toward the depth direction.

B17: A discrete capacitor including a substrate having a front surface portion, an impurity diffusion layer formed on the front surface portion of the substrate, an ONO film formed on the impurity diffusion layer and obtained by laminating in the order of a bottom oxide film, a nitride film, and a top oxide film, and a first electrode formed on the substrate and opposed to the impurity diffusion layer with the ONO film therebetween, wherein the ESD resistance in the HBM (Human Body Model) test is 700V or more.

B18: The discrete capacitor according to B17, wherein the thickness of the bottom oxide film in the ONO film is 110 Å or less.

Further, referring to FIGS. 20 to 32, discrete capacitors having features as presented in C1 to C18 below can be extracted in the case of intending to provide a discrete capacitor having excellent temperature characteristics.

C1: A discrete capacitor including a substrate having a front surface portion, an impurity diffusion layer formed on the front surface portion of the substrate, an ONO film formed on the impurity diffusion layer and obtained by laminating in the order of a bottom oxide film, a nitride film, and a top oxide film, and a first electrode formed on the substrate and opposed to the impurity diffusion layer with the ONO film therebetween, wherein the thickness of the nitride film in the ONO film is 20 Å to 100 Å.

With this configuration, a discrete capacitor in which the first electrode opposed to the impurity diffusion layer with the ONO film as the dielectric film therebetween is the upper electrode and the impurity diffusion layer is the lower electrode is formed.

One of the electrical characteristics of the discrete capacitor is temperature characteristics. The temperature characteristics indicate the rate of change of the capacitance value with respect to changes in temperature. With increase in temperature, the capacitance value changes in an increasing direction in the discrete capacitor. Thus, a discrete capacitor having a low rate of change of the capacitance value with respect to changes in temperature is demanded.

Accordingly, as in the configuration described in C1, the thickness of the nitride film in the ONO film is set at 20 Å to 100 Å, whereby a discrete capacitor having the ONO film with a temperature coefficient of resistance (TCR) of 25 ppm/° C. to 40 ppm/° C. can be provided. If within the range of these numerical values, the rate of change of the capacitance value ΔCp at the normal temperature to a temperature of 150° C. can be kept at 0.5% or less. As a result, a discrete capacitor resistant to changes in temperature and having excellent reliability can be provided. The temperature coefficient of resistance of the ONO film is specified in parts per million of variation in capacitance value per ° C.

C2: The discrete capacitor according to C1, wherein the temperature coefficient of resistance of the ONO film is 25 ppm/° C. to 40 ppm/° C.

C3: The discrete capacitor according to C1 or C2, wherein the thickness of the nitride film in the ONO film is 50 Å or more.

With this configuration, a discrete capacitor having 700V to 1400V regarding the ESD (Electrostatic Discharge) resistance in the HBM (Human Body Model) test, having excellent temperature characteristics can be provided.

C4: The discrete capacitor according to any one of C1 to C3, wherein the total thickness of the ONO film is 120 Å to 350 Å.

C5: The discrete capacitor according to any one of C1 to C4, further including a front surface insulating film formed on the substrate and having a first opening to selectively expose the impurity diffusion layer.

C6: The discrete capacitor according to C5, wherein the thickness of the front surface insulating film is 8000 Å to 12000 Å.

With this configuration, even if part of the first electrode overlaps on the front surface insulating film and parasitic capacitance is formed between the overlapping portion and the impurity diffusion layer, the overlapping portion of the first electrode and the impurity diffusion layer can be spaced apart sufficiently. Since the capacitance value of the capacitor is inversely proportional to the distance (that is, the distance between the impurity diffusion layer and the overlapping portion of the first electrode), this can effectively reduce the capacitance component of the parasitic capacitance. As a result, a discrete capacitor having the capacitance value with little error between a design value and a measured value can be provided.

C7: The discrete capacitor according to C5 or C6, wherein the first electrode includes a pad region formed on the first opening and connected with an external electrode.

With this configuration, the pad region to which the external electrode is connected is formed on the first opening, and thus the region on the first opening can be used effectively.

C8: The discrete capacitor according to any one of C5 to C7, wherein the front surface insulating film further includes a second opening formed spaced apart from the first opening, and the impurity diffusion layer extends to a region directly below the second opening, and a second electrode formed of the same conductive material as the first electrode and directly connected with the impurity diffusion layer via the second opening is further included.

C9: The discrete capacitor according to any one of C1 to C8, wherein the substrate is an n-type semiconductor substrate, and the impurity diffusion layer is a region to which an n-type impurity is introduced.

C10: The discrete capacitor according to any one of C1 to C8, wherein the substrate is a p-type semiconductor substrate, and the impurity diffusion layer is a region to which an n-type impurity is introduced.

C11: The discrete capacitor according to any one of C1 to C10, wherein the substrate has corner portions in a round shape chamfered in a plan view.

With this configuration, the corner portions of the substrate have a round shape, and thus, chipping during the manufacturing process or at the time of mounting can be suppressed.

C12: The discrete capacitor according to any one of C1 to C11, wherein the impurity diffusion layer is formed on the entire front surface portion of the substrate.

With this configuration, the impurity diffusion layer also serving as the lower electrode is formed on the entire front surface portion of the substrate. Therefore, the whole of the first electrode can be opposed to the impurity diffusion layer reliably even if the first electrode is formed displaced from a design position at the time of manufacturing. Accordingly, a discrete capacitor resistant to variations in the design such as the displacement can be provided.

C13: A discrete capacitor including an n-type semiconductor substrate, an ONO film formed on the semiconductor substrate and obtained by laminating in the order of a bottom oxide film, a nitride film, and a top oxide film, and a first electrode opposed to the semiconductor substrate with the ONO film therebetween, wherein the thickness of the nitride film in the ONO film is 20 Å to 100 Å.

With this configuration, a discrete capacitor in which the first electrode opposed to the n-type semiconductor substrate with the ONO film as the dielectric film therebetween is the upper electrode and the n-type semiconductor substrate is the lower electrode is formed. With such a configuration, the same effects as those of the discrete capacitor according to C1 can be performed as well.

C14: The discrete capacitor according to C13, wherein the semiconductor substrate has the same impurity concentration profile from a front surface portion thereof toward the depth direction.

C15: A discrete capacitor including a substrate having a front surface portion, an impurity diffusion layer formed on the front surface portion of the substrate, an ONO film formed on the impurity diffusion layer and obtained by laminating in the order of a bottom oxide film, a nitride film, and a top oxide film, and a first electrode formed on the substrate and opposed to the impurity diffusion layer with the ONO film therebetween, wherein the temperature coefficient of resistance (TCR) is 25 ppm/° C. to 40 ppm/° C.

C16: The discrete capacitor according to C15, wherein the rate of change of the capacitance value ΔCp at a temperature of 150° C. or less is 0.5% or less.

C17: A discrete capacitor including an n-type semiconductor substrate, an ONO film formed on the semiconductor substrate and obtained by laminating in the order of a bottom oxide film, a nitride film, and a top oxide film, and a first electrode opposed to the semiconductor substrate with the ONO film therebetween, wherein the temperature coefficient of resistance (TCR) is 25 ppm/° C. to 40 ppm/° C.

C18: The discrete capacitor according to C17, wherein the semiconductor substrate has the same impurity concentration profile from a front surface portion thereof toward the depth direction.

Further, referring to FIGS. 33 to 44, discrete capacitors having features as presented in D1 to D17 below can be extracted in the case of intending to provide a discrete capacitor capable of preventing the rate of change of the capacitance value from differing greatly between before and after a reversal even if the polarity of the applied voltage is reversed.

D1: A discrete capacitor including a substrate formed with an impurity diffusion layer, a first capacitor element including the impurity diffusion layer, a first dielectric film formed on the impurity diffusion layer, and a first electrode formed on the first dielectric film, and a second capacitor element including the impurity diffusion layer, a second dielectric film formed on the impurity diffusion layer, and a second electrode formed on the second dielectric film, wherein the first capacitor element and the second capacitor element are formed symmetrical.

One of the electrical characteristics of the discrete capacitor is DC bias characteristics. The DC bias characteristics mean the rate of change of the capacitance value with respect to DC bias. Regarding the DC bias characteristics, the rate of change of the capacitance value with respect to DC bias where the first electrode is the positive electrode and the second electrode is the negative electrode, and the rate of change of the capacitance value with respect to DC bias where the first electrode is the negative electrode and the second electrode is the positive electrode may sometimes differ. It cannot be said to be preferable in terms of reliability of the discrete capacitor that the DC bias characteristics differ according to the polarity of the applied voltage as above.

With this configuration, the first capacitor element and the second capacitor element are formed symmetrical, and thus the rate of change of the capacitance value with respect to DC bias where the first electrode is the positive electrode and the second electrode is the negative electrode, and the rate of change of the capacitance value with respect to DC bias where the first electrode is the negative electrode and the second electrode is the positive electrode can be substantially equalized. As a result, a discrete capacitor can be provided that is capable of preventing the rate of change of the capacitance value from differing greatly between before and after a reversal even if the polarity of the applied voltage is reversed.

The symmetry includes a mode considered to be substantially symmetrical even if not a physically or mechanically structurally symmetrical shape as long as the electrical characteristics are symmetrical.

D2: The discrete capacitor according to D1, wherein the rate of change of the capacitance value with respect to DC bias where the first electrode is the positive electrode and the second electrode is the negative electrode, and the rate of change of the capacitance value with respect to DC bias where the first electrode is the negative electrode and the second electrode is the positive electrode are substantially equal.

D3: The discrete capacitor according to D1 or D2, wherein the capacitance value in the first capacitor element and the capacitance value in the second capacitor element are substantially equal.

D4: The discrete capacitor according to any one of D1 to D3, wherein the first dielectric film and the second dielectric film are formed with the same area.

D5: The discrete capacitor according to any one of D1 to D4, wherein the first dielectric film and the second dielectric film are formed in the same thickness.

D6: The discrete capacitor according to any one of D1 to D5, wherein the first dielectric film and the second dielectric film are formed of the same dielectric material.

D7: The discrete capacitor according to any one of D1 to D6, wherein the first dielectric film and the second dielectric film are an ONO film formed by laminating in the order of a bottom oxide film, a nitride film, and a top oxide film.

D8: The discrete capacitor according to any one of D1 to D7, wherein the first electrode and the second electrode are formed with the same area as the first dielectric film and the second dielectric film.

D9: The discrete capacitor according to any one of D1 to D8, wherein the first electrode and the second electrode are formed of the same conductive material.

D10: The discrete capacitor according to any one of D1 to D9, further including a front surface insulating film formed on the substrate and having a first opening and a second opening to selectively expose the impurity diffusion layer, wherein the first dielectric film and the second dielectric film are respectively arranged within the first and second openings.

D11: The discrete capacitor according to D10, wherein the first electrode includes a first pad region formed on the first opening and connected with a first external electrode, and the second electrode includes a second pad region formed on the second opening and connected with a second external electrode.

With this configuration, the first pad region to which the first external electrode is connected is formed on the first opening, and thus the region on the first opening can be used effectively. Similarly, the second pad region to which the second external electrode is connected is formed on the second opening, and thus the region on the second opening can be used effectively.

D12: The discrete capacitor according to D10 or D11, wherein the thickness of the front surface insulating film is 8000 Å to 12000 Å.

With this configuration, even if part of the first and second electrodes overlaps on the front surface insulating film and parasitic capacitance is formed between each overlapping portion and the impurity diffusion layer, respective overlapping portions of the first and second electrodes and the impurity diffusion layer can be spaced apart sufficiently. Since the capacitance value of the capacitor is inversely proportional to the distance (that is, the distance between the impurity diffusion layer and each overlapping portion of the first and second electrodes), this can effectively reduce the capacitance component of the parasitic capacitance. As a result, a discrete capacitor having the capacitance value with little error between a design value and a measured value can be provided.

D13: The discrete capacitor according to any one of D1 to D12, wherein the substrate is an n-type semiconductor substrate, and the impurity diffusion layer is a region to which an n-type impurity is introduced.

D14: The discrete capacitor according to any one of D1 to D12, wherein the substrate is a p-type semiconductor substrate, and the impurity diffusion layer is a region to which an n-type impurity is introduced.

D15: The discrete capacitor according to any one of D1 to D14, wherein the impurity diffusion layer is formed on the entire front surface portion of the substrate.

With this configuration, the impurity diffusion layer also serving as the lower electrode is formed on the entire front surface portion of the substrate. Therefore, the whole of the first electrode and the whole of the second electrode can be opposed to the impurity diffusion layer reliably, even if the first and second electrodes are formed displaced from design positions at the time of manufacturing. As a result, a discrete capacitor resistant to variations in the design such as the displacement can be provided.

D16: A discrete capacitor including an n-type semiconductor substrate, a first capacitor element including the semiconductor substrate, a first dielectric film formed on the semiconductor substrate, and a first electrode formed on the first dielectric film, and a second capacitor element including the semiconductor substrate, a second dielectric film formed on the semiconductor substrate, and a second electrode formed on the second dielectric film, wherein the first capacitor element and the second capacitor element are formed symmetrical.

With this configuration, the first capacitor element and the second capacitor element are formed symmetrical, and thus the rate of change of the capacitance value with respect to DC bias where the first electrode is the positive electrode and the second electrode is the negative electrode, and the rate of change of the capacitance value with respect to DC bias where the first electrode is the negative electrode and the second electrode is the positive electrode can be substantially equalized. As a result, a discrete capacitor can be provided that is capable of preventing the rate of change of the capacitance value from differing greatly between before and after a reversal even if the polarity of the applied voltage is reversed.

D17: The discrete capacitor according to D16, wherein the semiconductor substrate has the same concentration profile from a front surface portion thereof toward the depth direction.

The invention claimed is:

1. A discrete component, comprising:

a capacitor, including:

a substrate having a front surface portion;

an impurity diffusion layer formed on the front surface portion of the substrate;

an insulating film formed on the impurity diffusion layer and obtained by laminating in the order of a bottom oxide film, a nitride film, and a top oxide film;

a first electrode formed on the substrate and opposed to the impurity diffusion layer with the insulating film therebetween;

a first surface insulating film formed on the substrate and having a first opening to selectively expose the impurity diffusion layer; and a second surface insulating film formed on the substrate and covering the first electrode, the second surface insulating film having a first portion formed on the front surface of the substrate and a second portion formed on a side surface of the substrate, wherein the thickness of the bottom oxide film of the insulating film is 110 Å or less, and the second portion of the second surface insulating film is thinner than the first portion of the second surface insulating film.

2. The discrete component according to claim 1, wherein the thickness of the bottom oxide film of the insulating film is 50 Å or more.

3. The discrete component according to claim 1, wherein the thickness of the insulating film is between 150 Å to 430 Å; and the thickness of the nitride film in the insulating film is between 50 Å to 270 Å.

4. The discrete component according to claim 1, wherein an ESD resistance in a HBM (Human Body Model) test is between 700V to 2000V.

5. The discrete component according to claim 1, wherein the thickness of the nitride film in the insulating film is between 20 Å to 100 Å.

6. The discrete component according to claim 5, wherein the thickness of the nitride film in the insulating film is 50 Å or more.

7. The discrete component according to claim 1, wherein the temperature coefficient of resistance of the insulating film is between 25 ppm/° C. to 40 ppm/° C.

8. The discrete component according to claim 1, wherein the first electrode includes a pad region formed on the first opening and connected with an external electrode.

9. The discrete component according to claim 1, wherein the thickness of the first surface insulating film is between 8000 Å to 12000 Å.

10. The discrete component according to claim 1, wherein
the first surface insulating film further includes a second opening formed spaced apart from the first opening,
the impurity diffusion layer extends to a region directly below the second opening, and
the discrete component further comprises a second electrode formed of the same conductive material as the first electrode and directly connected with the impurity diffusion layer via the second opening.

11. The discrete component according to claim 1, wherein
the substrate is an n-type semiconductor substrate, and
the impurity diffusion layer is a region to which an n-type impurity is introduced.

12. The discrete component according to claim 1, wherein
the substrate is a p-type semiconductor substrate, and
the impurity diffusion layer is a region to which an n-type impurity is introduced.

13. The discrete component according to claim 1, wherein the impurity diffusion layer is formed on the entire front surface portion of the substrate.

14. The discrete component according to claim 1, wherein the insulating film includes an ONO film.

15. The discrete component according to claim 1, wherein the discrete component is a discrete capacitor.

16. A discrete component, comprising:
a capacitor, including:
an n-type semiconductor substrate;
an insulating film formed on the semiconductor substrate and obtained by laminating in the order of a bottom oxide film, a nitride film, and a top oxide film; and
a first electrode opposed to the semiconductor substrate with the insulating film therebetween;
a first surface insulating film formed on the semiconductor substrate and having a first opening to selectively expose a portion of the semiconductor substrate; and
a second surface insulating film formed on the semiconductor substrate and covering the first electrode, the second surface insulating film having a first portion formed on a front surface of the semiconductor substrate and a second portion formed on a side surface of the semiconductor substrate, wherein
the thickness of the bottom oxide film of the insulating film is 110 Å or less, and
the second portion of the second surface insulating film is thinner than the first portion of the second surface insulating film.

17. The discrete component according to claim 16, wherein the semiconductor substrate has the same impurity concentration profile from a front surface portion thereof toward the depth direction.

18. The discrete component according to claim 16, wherein the insulating film includes an ONO film.

19. The discrete component according to claim 16, wherein the discrete component is a discrete capacitor.

20. A discrete component, comprising:
a capacitor, including:
a substrate having a front surface portion;
an impurity diffusion layer formed on the front surface portion of the substrate;
an insulating film formed on the impurity diffusion layer and obtained by laminating in the order of a bottom oxide film, a nitride film, and a top oxide film; and
a first electrode formed on the substrate and opposed to the impurity diffusion layer with the insulating film therebetween;
a first surface insulating film formed on the substrate and having a first opening to selectively expose the impurity diffusion layer; and
a second surface insulating film formed on the substrate and covering the first electrode, the second surface insulating film having a first portion formed on the front surface of the substrate and a second portion formed on a side surface of the substrate, wherein
an ESD resistance in a HBM (Human Body Model) test is 700V or more, and
the second portion of the second surface insulating film is thinner than the first portion of the second surface insulating film.

21. The discrete component according to claim 20, wherein the thickness of the bottom oxide film in the insulating film is 110 Å or less.

22. The discrete component according to claim 20, wherein the insulating film includes an ONO film.

23. The discrete component according to claim 20, wherein the discrete component is a discrete capacitor.

* * * * *